(12) United States Patent
Wang et al.

(10) Patent No.: US 10,197,890 B2
(45) Date of Patent: Feb. 5, 2019

(54) ARRAY IMAGING MODULE AND MOLDED PHOTOSENSITIVE ASSEMBLY, CIRCUIT BOARD ASSEMBLY AND MANUFACTURING METHODS THEREOF FOR ELECTRONIC DEVICE

(71) Applicant: NINGBO SUNNY OPOTECH CO., LTD., Ningbo, Zhejiang (CN)

(72) Inventors: Mingzhu Wang, Ningbo (CN); Bojie Zhao, Ningbo (CN); Zhenyu Chen, Ningbo (CN); Takehiko Tanaka, Ningbo (CN); Nan Guo, Ningbo (CN); Zhen Huang, Ningbo (CN); Duanliang Cheng, Ningbo (CN); Liang Ding, Ningbo (CN); Feifan Chen, Ningbo (CN); Heng Jiang, Ningbo (CN)

(73) Assignee: Ningbo Sunny Opotech Co., Ltd., Ningbo, Zhejiang (CN)

( * ) Notice: Subject to any disclaimer, the term of this patent is extended or adjusted under 35 U.S.C. 154(b) by 37 days.

(21) Appl. No.: 15/317,118

(22) PCT Filed: Oct. 25, 2016

(86) PCT No.: PCT/CN2016/103250
§ 371 (c)(1),
(2) Date: Dec. 8, 2016

(87) PCT Pub. No.: WO2017/140118
PCT Pub. Date: Aug. 24, 2017

(65) Prior Publication Data
US 2018/0113378 A1 Apr. 26, 2018

(30) Foreign Application Priority Data

Feb. 18, 2016 (CN) .......................... 2016 1 0091489
Mar. 15, 2016 (CN) .......................... 2016 1 0148338
(Continued)

(51) Int. Cl.
*G03B 17/56* (2006.01)
*G03B 17/12* (2006.01)
(Continued)

(52) U.S. Cl.
CPC ............. *G03B 17/12* (2013.01); *G03B 17/02* (2013.01); *H04N 5/2254* (2013.01);
(Continued)

(58) Field of Classification Search
CPC ..................................................... G03B 17/56
(Continued)

(56) References Cited

U.S. PATENT DOCUMENTS 6,924,540 B2 * 8/2005 Shirakawa ............... G11B 7/13
257/434
7,782,390 B2 * 8/2010 Lin .......................... G02B 7/02
348/340
(Continued)

FOREIGN PATENT DOCUMENTS

CN 105187697 * 12/2015 ............. G03B 17/02
CN 204993579 * 1/2016 ............. G03B 17/02

OTHER PUBLICATIONS

International Search Report (WO2017140118) PCT/CN/2016/103250,dated Jan. 20, 2017, 3 pages.*
(Continued)

*Primary Examiner* — Clayton E Laballe
*Assistant Examiner* — Kevin Butler
(74) *Attorney, Agent, or Firm* — Raymond Y. Chan; David and Raymond Patent Firm

(57) ABSTRACT

An array imaging module includes at least two optical lenses and a molded photosensitive assembly, wherein the molded photosensitive assembly includes at least two photosensitive units, a circuit board that electrically couples to the photosensitive units, and a molded base having at least two optical
(Continued)

windows. The molded base is integrally coupled at the circuit board at a peripheral portion thereof, wherein the photosensitive units are aligned with the optical windows respectively. The optical lenses are located along two photosensitive paths of the photosensitive units respectively, such that each of the optical windows forms a light channel through the corresponding photosensitive unit and the corresponding optical lens.

14 Claims, 50 Drawing Sheets

(30) Foreign Application Priority Data

Mar. 15, 2016 (CN) .................... 2016 2 0200264 U
Apr. 7, 2016 (CN) ......................... 2016 1 0214411

(51) Int. Cl.
| | |
|---|---|
| G03B 17/02 | (2006.01) |
| H04N 5/225 | (2006.01) |
| F16M 11/10 | (2006.01) |
| F16M 11/04 | (2006.01) |
| F16M 13/00 | (2006.01) |

(52) U.S. Cl.
CPC ......... *H04N 5/2258* (2013.01); *F16M 11/04* (2013.01); *F16M 11/041* (2013.01); *F16M 11/10* (2013.01); *F16M 13/00* (2013.01); *G03B 17/56* (2013.01)

(58) Field of Classification Search
USPC ........................................................ 396/419
See application file for complete search history.

(56) References Cited

U.S. PATENT DOCUMENTS

| | | | | |
|---|---|---|---|---|
| 7,782,391 B2* | 8/2010 | Lin | .......... | G02B 7/023 348/340 |
| 8,890,942 B2* | 11/2014 | Ogasahara | .......... | H04N 5/2254 348/345 |
| 9,143,664 B2* | 9/2015 | Phoon | .......... | G02B 7/04 |
| 9,157,988 B2* | 10/2015 | Cho | .......... | G01S 17/89 |
| 9,241,097 B1* | 1/2016 | Tam | .......... | H04N 5/2254 |
| 9,826,132 B2* | 11/2017 | Wang | .......... | H04N 5/2257 |
| 9,876,948 B2* | 1/2018 | Wang | .......... | H04N 5/2257 |
| 9,894,772 B2* | 2/2018 | Wang | .......... | H05K 3/0011 |
| 9,906,700 B2* | 2/2018 | Wang | .......... | H04N 5/2257 |
| 2007/0210246 A1* | 9/2007 | Ellenberger | .......... | H01L 27/14618 250/239 |
| 2007/0278394 A1* | 12/2007 | Shangguan | .......... | G03B 17/02 250/239 |
| 2007/0287216 A1* | 12/2007 | Derderian | .......... | H01L 27/14618 438/67 |
| 2008/0265134 A1* | 10/2008 | Kinoshita | .......... | G03B 17/00 250/206 |
| 2008/0284897 A1* | 11/2008 | Lv | .......... | G02B 7/021 348/340 |
| 2009/0256222 A1* | 10/2009 | Hsu | .......... | H01L 27/14618 257/432 |
| 2010/0084726 A1* | 4/2010 | Lee | .......... | H01L 27/14618 257/432 |
| 2010/0157142 A1* | 6/2010 | Ryu | .......... | G02B 7/021 348/373 |
| 2010/0238327 A1* | 9/2010 | Griffith | .......... | H04N 5/2251 348/240.99 |
| 2011/0024861 A1* | 2/2011 | Tu | .......... | H01L 27/14618 257/434 |
| 2011/0156187 A1* | 6/2011 | Tu | .......... | H01L 27/14618 257/432 |
| 2011/0156188 A1* | 6/2011 | Tu | .......... | H01L 27/14618 257/432 |
| 2011/0157367 A1* | 6/2011 | Chang | .......... | H04N 5/2254 348/159 |
| 2011/0194023 A1* | 8/2011 | Tam | .......... | G03B 17/02 348/374 |
| 2014/0028905 A1* | 1/2014 | Kim | .......... | H04N 5/2257 348/374 |
| 2014/0029120 A1* | 1/2014 | Kim | .......... | G03B 3/10 359/824 |
| 2014/0092298 A1* | 4/2014 | Kim | .......... | H04N 5/2254 348/374 |
| 2014/0212127 A1* | 7/2014 | Chen | .......... | H04N 5/2257 396/542 |
| 2014/0225212 A1* | 8/2014 | Kaschner | .......... | H01L 25/042 257/443 |
| 2015/0104165 A1* | 4/2015 | Kim | .......... | C09K 19/38 396/529 |
| 2015/0138436 A1* | 5/2015 | Wong | .......... | H04N 5/2257 348/374 |
| 2015/0380454 A1* | 12/2015 | Luan | .......... | H04N 5/369 348/294 |
| 2017/0064172 A1* | 3/2017 | Vittu | .......... | H04N 5/2253 |
| 2017/0094183 A1* | 3/2017 | Miller | .......... | H04N 5/23296 |
| 2017/0330847 A1* | 11/2017 | Dobashi | .......... | H01L 24/04 |

OTHER PUBLICATIONS

Zhang, Kouwen, 'Multi-Lens Camera module conjoined stand, multi-lens camera module and application thereof', WO2017020751 PCT/CN/2016/091714, Sep. 2, 2017, 38 pages.*

* cited by examiner

ARRAY IMAGING MODULE AND MOLDED PHOTOSENSITIVE ASSEMBLY, CIRCUIT BOARD ASSEMBLY AND MANUFACTURING METHODS THEREOF FOR ELECTRONIC DEVICE

CROSS REFERENCE OF RELATED APPLICATION

This is a non-provisional application that claims priority to a first Chinese invention application, application number CN 201610091489.7, filed Feb. 18, 2016, a second Chinese invention application, application number CN 201610148338.0, filed Mar. 15, 2016, a third Chinese invention application, application number CN 201620200264.6, filed Mar. 15, 2016, and a fourth Chinese invention application, application number CN 201610214411.X, filed Apr. 7, 2016.

This non-provisional application also claims priority to international application number PCT/CN2016/103250, international filing date Oct. 25, 2016, the entire contents of each of which are expressly incorporated herein by reference.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to camera module, and more particularly to an array imaging module and its molded photosensitive assembly, circuit board assembly and manufacturing method for electronic device.

Description of Related Arts

Nowadays, most of the electronic products incorporate with an integrated circuit board to provide multiple functions in one single electronic component. In particular, it is noted that this integrated multi-function crossovers between trends. For example, the mobile phone which is originally designed for communication purpose has been developed into a mobile electronic device such as smart phone that integrally incorporates with the integrated circuit to provide multiple functions of communication, image capturing, Internet-enabled access, navigation, and etc. Therefore, the integrated circuit board must provide all-in-one multifunction for the smartphone.

Accordingly, most camera modules in the current mobile electronic devices are single-lens modules. However, this single-lens camera module cannot meet the requirements of high image quality and capturing effectiveness in order to meet the requirement of multi-functional application of the current mobile electronic devices.

An advanced camera module, such as a dual lens camera module, has been already used in the current mobile electronic device, wherein the dual lens camera module is configured to simulate the human eye structure for image capturing. In particular, the features and performances of the dual lens camera module, such as 3D capturing and scanning ability, gesture and location recognition, color fidelity (color accuracy or color balance), rapid focusing ability, panoramic shooting, background field of depth, and other aspects, are better than the features and performances of the single lens camera module. Therefore, there is an important development direction to include more than one lens camera module in the future camera industry. Accordingly, the dual lens camera module generally comprises two imaging modules, such that during the imaging capturing process of the dual lens camera module, two images are captured by the two imaging modules respectively. Due to the position difference between the two imaging modules, the two images will have a spatial position difference. Then, the two images will be processed via an imaging synthesis method to form a final captured image. It is important that the imaging modules must have the uniformity of imaging effects, such as resolution, shading, color, and the deviation in horizontal, vertical, and longitudinal directions, wherein these indications are the major factors to determine the image quality of the dual lens camera module.

However, the current manufacturing and assembling technologies, and the structure of the dual lens camera module cannot guarantee the imaging quality thereof. As shown in FIG. 1, the existing dual lens camera module comprises a circuit board 10P, two lens bases 20P, two imaging modules 30P, and one supporting frame 40P, wherein a lens motor assembly 31P is operatively connected to each of the imaging modules 30P. Accordingly, each of the lens bases 20P is discretely mounted on the circuit board 10P at one side thereof in order to connect the lens bases 20P with each other via the circuit board 10P. The lens motor assembly 31P is coupled at and supported by the corresponding lens base 20P. Each of the lens motor assemblies 31P is enveloped by the supporting frame 40P. As shown in FIG. 1B, the two lens bases 20P can be integrated with each other to form a single base of the dual lens camera module according to the existing technology. In other words, the lens motor assemblies 31P are mounted at different positions of the lens base 20P. It is appreciated that, through the existing assembling process of the existing dual lens camera module, each of the lens bases 20P is individually coupled at the circuit board 10P, such that the dimension, position, etc. . . . of each of the lens bases 20P is hard to control. In other words, the parameters, such as dimension and assembling position, of the dual lens camera modules are inconstant. According to the existing dual lens camera module, as shown in FIG. 1A, the lens bases 20P are individual components and are electrically coupled to the circuit board 10P in order to connect the lens bases 20P with each other. Accordingly, the circuit board 10P is a PCB circuit board, wherein the rigidity of the circuit board 10P is relatively weak, such that the circuit board 10P is easy to be deformed or bent. As a result, the overall rigidity of the dual lens camera module is hard to control and ensure. After the dual lens camera module is assembled, there will be a deviation between the two imaging modules 30P during the operation of the dual lens camera module. For example, the distance between the lens motor assemblies 31P cannot be ensured, the positioning tolerance of the lens motor assemblies 31P is relatively large, and the optical axis of each of the imaging modules 30P is easily deviated from its original preset position. Any one of these situations will affect the image quality of the dual lens camera module. For example, the uncontrollable factors and adverse effects will affect the imaging synthesis process to form the final captured image. In addition, since the lens motor assemblies 31P are wrapped within the supporting frame 40P, it is necessary to apply adhesive to a gap between the lens motor assembly 31P and the supporting frame 40P. As a result, the overall size of the dual lens camera module will further be relatively increased.

Furthermore, the assembly of the dual lens camera module is based on the conventional COB (Chip On Board) assembling process. The circuit board 10P generally comprises a circuit protrusion 11P and a photosensitive chip 12P electrically coupled on the circuit board 10P via a connecting wire such as gold wire 121P. Accordingly, the gold wire 121P has an arc-shape protruded from the board body of the circuit board, such that the circuit protrusion 11P and the gold wire 121P protruded from the circuit board 10P will adversely affect the assembling process of the dual lens camera module.

Since the circuit protrusion 11P and the gold wire 121P are protruded and exposed from the circuit board 10P, the assembling process will be unavoidably affect by these exposing components. For example, the adhering process of the lens base 20P and the welding process of the lens motor assembly 31P will be affected by the circuit protrusion 11P and the gold wire 121P. Accordingly, welding resisting agent and dust may be adhered to the lens base 20P during the welding process of the lens motor assembly 31P. Since the circuit protrusion 11P and the photosensitive chip 12P are positioned to create a gap therebetween, the dust will be accumulated at the gap thereof. It will contaminate the photosensitive chip 12P, such that the photosensitive chip 12P will produce an undesirable result, such as black spots, to affect the image quality.

Furthermore, the lens base 20P is located at an exterior side of the circuit protrusion 11P. When the lens base 20P is mounted on the circuit board 10P, a safety clearance must be provided between the lens base 20P and the circuit protrusion 11P. In particular, the safety clearance includes a horizontal direction and the upward direction of the lens base 20P with respect to the circuit board 10P. As a result, the thickness of the dual lens camera module will be substantially increased. In other words, it is almost impossible to reduce the overall thickness of the dual lens camera module.

Also, comparing the molding of the dual lens camera module with the molding of the single lens camera module, the coordination of the dual lens camera is higher than that of the single lens camera module. For example, the optical axes of the imaging modules are required being coincident and the optical axes of the lens through the conventional COB process must be consistent. Collectively, the overall size of the dual lens camera is relatively large, the rigidity of the circuit board is relatively weak, the flatness of the circuit board is relatively sensitive, and the thickness of the circuit board is relatively large.

SUMMARY OF THE PRESENT INVENTION

The invention is advantageous in that it provides an array imaging module and its molded photosensitive assembly, circuit board assembly and manufacturing method for electronic device, wherein the circuit board assembly comprises a mold sealer and a circuit member. The mold sealer is sealedly coupled to the circuit member, wherein the molder sealer is correspondingly coupled with a plurality of optical lenses.

Another advantage of the invention is to provide an array imaging module and its molded photosensitive assembly, circuit board assembly and manufacturing method for electronic device, wherein the circuit board assembly further comprises a circuit board and at least one electronic element electrically coupled at and protruded out of the circuit board. The electronic element is enclosed within the mold sealer to prevent an exposure of the electronic element.

Another advantage of the invention is to provide an array imaging module and its molded photosensitive assembly, circuit board assembly and manufacturing method for electronic device, wherein since the electronic element is enclosed within the mold sealer, there is no requirement for a predetermined safety distance between the mold sealer and the circuit board to minimize the size of the array imaging module. Therefore, the lightness and the thinness of the array imaging module can be achieved.

Another advantage of the invention is to provide an array imaging module and its molded photosensitive assembly, circuit board assembly and manufacturing method for electronic device, wherein since the electronic element is enclosed within the mold sealer, the electronic elements are isolated to prevent the mutual interference by the adjacent electronic elements.

Another advantage of the invention is to provide an array imaging module and its molded photosensitive assembly, circuit board assembly and manufacturing method for electronic device, wherein since the electronic element is enclosed within the mold sealer, the distance between two adjacent electronic elements can be reduced, such that more electronic elements can be electrically coupled at the circuit board with a limited installing area, so as to improve the imaging quality of the array imaging module.

Another advantage of the invention is to provide an array imaging module and its molded photosensitive assembly, circuit board assembly and manufacturing method for electronic device, wherein the electronic element is enclosed within the mold sealer to prevent the electronic elements, especially the metal terminals, from exposing and contacting with air.

Another advantage of the invention is to provide an array imaging module and its molded photosensitive assembly, circuit board assembly and manufacturing method for electronic device, wherein the molded photosensitive assembly comprises a plurality of photosensitive units. The mold sealer is enclosed around an outer periphery of each of the photosensitive units.

Another advantage of the invention is to provide an array imaging module and its molded photosensitive assembly, circuit board assembly and manufacturing method for electronic device, wherein the mold sealer provides a plurality of light filtering portions for supporting and coupling a plurality of light filters, such that no extra supporting frame is required for individually supporting the light filters.

Another advantage of the invention is to provide an array imaging module and its molded photosensitive assembly, circuit board assembly and manufacturing method for electronic device, wherein the circuit board has a plurality of inner indention grooves to receive the photosensitive units therein to reduce the height difference between the photosensitive unit and the circuit board. In particular, the photosensitive unit and the circuit board are aligned at the same planar direction to reduce the height requirement of the mold sealer.

Another advantage of the invention is to provide an array imaging module and its molded photosensitive assembly, circuit board assembly and manufacturing method for electronic device, wherein the circuit board comprises a plurality of conductive channels and a plurality of outer indention grooves correspondingly formed therewith, such that the photosensitive unit can be coupled at the rear side of the circuit board via a Flip Chip (FC) method.

Another advantage of the invention is to provide an array imaging module and its molded photosensitive assembly, circuit board assembly and manufacturing method for electronic device, wherein the circuit board assembly comprises a reinforcing layer overlapped and connected to the circuit board to reinforce the strength of the circuit board and to enhance the heat dissipation of the circuit board.

Another advantage of the invention is to provide an array imaging module and its molded photosensitive assembly, circuit board assembly and manufacturing method for electronic device, wherein the circuit board assembly has a least a reinforcing slot, wherein the mold sealer is extended into the reinforcing slot to enhance the strength of the circuit board.

Another advantage of the invention is to provide an array imaging module and its molded photosensitive assembly, circuit board assembly and manufacturing method for electronic device, wherein the mold sealer further has a lens mounting portion for coupling with the optical lenses so as to retain the optical lenses in position.

Another advantage of the invention is to provide an array imaging module and its molded photosensitive assembly, circuit board assembly and manufacturing method for electronic device, wherein the mold sealer is solidified to integrally bond with the circuit board, such that no adhesive is required for applying on the circuit board. In other words, the circuit board does not have any predetermined adhering area where the adhesive is supposedly applied thereon, so as to reduce the size of the array imaging module.

Another advantage of the invention is to provide an array imaging module and its molded photosensitive assembly, circuit board assembly and manufacturing method for electronic device, wherein during the manufacturing process of the array imaging module, the adhering step of applying the adhesive on the circuit board is omitted to simplify the manufacturing steps of the array imaging module so as to highly increase the efficiency of the manufacturing process of the array imaging module and to substantially reduce the of the manufacturing cost of the array imaging module.

Another advantage of the invention is to provide an array imaging module and its molded photosensitive assembly, circuit board assembly and manufacturing method for electronic device, wherein the mold sealer is solidified to integrally bond with the circuit board, such that no adhesive is required for applying on the circuit board. Therefore, no adhesive will flow to the chip coupling portion of the circuit board for contaminating the optical path of the photosensitive unit, such that after the photosensitive unit is coupled at the circuit board, the photosensitive unit can remain its flatness.

Another advantage of the invention is to provide an array imaging module and its molded photosensitive assembly, circuit board assembly and manufacturing method for electronic device, wherein the mold sealer is solidified to integrally bond with the circuit board, the flatness of the circuit board assembly can be enhanced to enhance the imaging quality of the array imaging module.

Another advantage of the invention is to provide an array imaging module and its molded photosensitive assembly, circuit board assembly and manufacturing method for electronic device, wherein the mold sealer is formed as a molded base which has at least a blocking protrusion protruded from the top side thereof. When the driver or the lens barrel is coupled at the top side of the molded base, the blocking protrusion will block the adhesive entering into the optical window when the adhesive is applied between the driver and the outer lateral top surface of the molded base, for preventing the adhesive contaminating the optical path of the photosensitive units so as to enhance the imaging quality of the array imaging module.

Additional advantages and features of the invention will become apparent from the description which follows, and may be realized by means of the instrumentalities and combinations particular point out in the appended claims.

According to the present invention, the foregoing and other objects and advantages are attained by a circuit board assembly of an array imaging module, which comprises:

a circuit member which comprises a circuit board for electrically connecting with at least two photosensitive units of the array imaging module; and a mold sealer sealed and coupled at the circuit board of the circuit member.

In one embodiment, the mold sealer has at least two optical windows for aligning with the photosensitive units respectively to form at least two light channels.

In one embodiment, a top side of the mold sealer is a flat surface for supporting at least one of a supporter, an optical lens, a driver, and a light filter of the array imaging module.

In one embodiment, the mold sealer further has at least two mounting grooves formed at the top side thereof corresponding to the optical window, wherein the mounting grooves are arranged for engaging with at least one of the supporter, the optical lens, the driver, and the light filter of the array imaging module.

In one embodiment, the mold sealer comprises an enclosing portion, a light filtering portion, and a lens mounting portion, wherein the light filter mounting portion and the lens mounting portion integrally and upwardly extended from the enclosing portion to form a step-like platform to spacedly support the light filter and the optical lens in position.

In one embodiment, the light filter mounting portion has two mounting slots located corresponding to the optical window to form a first step of the step-like platform so as to support the light filter thereat. The lens mounting portion further has two lens mounting slots located corresponding to the optical window to form a second step of the step-like platform so as to support the optical lens thereat.

In one embodiment, the lens mounting portion further has two lens inner walls, wherein each of the lens inner walls is a flat surface to couple with the optical lens without any threaded structure.

In one embodiment, the circuit member further comprises at least an electronic element electrically coupled at and protruded from the circuit board, wherein the electronic element is enclosed within the mold sealer for preventing an exposure of the electronic element.

In one embodiment, the electronic element can be a resistor, a capacitor, a diode, a triode, a potentiometer, a relay, a driver, a processor, or a combination of above.

In one embodiment, the circuit member further comprises a reinforcing layer overlapped and connected to the circuit board to reinforce the strength of the circuit board and to enhance the heat dissipation of the circuit board.

In one embodiment, the circuit board assembly further comprises a shielding layer that encloses the circuit board and the mold sealer to enhance the strength of the circuit board and to prevent any electromagnetic interference of the circuit board assembly.

In one embodiment, the shielding layer can be a metal panel or a metal net.

In one embodiment, the circuit board assembly has a least a reinforcing slot, wherein the mold sealer is extended into the reinforcing slot to enhance the strength of the circuit board.

In one embodiment, the reinforcing slot is an indention cavity.

In one embodiment, the reinforcing slot is a through slot, such that the mold sealer is extended through the circuit board to integrally form with the circuit board so as to combine the mold sealer with the circuit board. In addition, the reinforcing slot as the through slot can be easily formed on the circuit board.

In one embodiment, the circuit board comprises at least two conductive channels, wherein the photosensitive unit can be coupled at the rear side of the circuit board via a Flip Chip (FC) method.

In one embodiment, each of the conductive channels forms a step-like platform for stably supporting the photosensitive unit.

In one embodiment, the material of the circuit board can be selected from a rigid-flex combination board, ceramic substrate, or a rigid PCB board, or FPC.

In one embodiment, the injection molding material of the mold sealer can be nylon, LCP (Liquid Crystal Polymer), PP (Polypropylene), epoxy resin, or the combination of above.

In one embodiment, the circuit board assembly further comprises at least two motor connecting units, each of the motor connecting units having a first connecting wire embedded in the mold sealer and electrically connected to the circuit board. The first connecting wire has a first motor connecting end exposed and extended above the top side of the mold sealer to electrically connect to the motor terminal of the driver.

In one embodiment, the circuit board assembly further comprises at least two motor connecting units, each of the motor connecting units having at least a connecting wire and a terminal slot. The connecting wire is embedded in the mold sealer and electrically connected to the circuit board. The first terminal slot of the motor connecting unit is extended to the top side of the mold sealer. The connecting wire is set at the mold sealer and is extended to the bottom wall surface of the terminal slot. The connecting wire comprises a second motor connecting end provided at the mold sealer and extended to the bottom wall surface of the terminal slot, wherein the second motor connecting end is electrically coupled to the motor terminal of the driver.

In one embodiment, the circuit board assembly further comprises at least two motor connecting units, each of the motor connecting units having at least a terminal slot and at least a circuit terminal. The circuit terminal is pre-set at the circuit board and electrically connected to the circuit board. The terminal slot is provided in the mold sealer and is extended from the circuit board to the top side of the mold sealer. The circuit terminal is extended corresponding to the terminal slot for connecting with the motor terminal of the driver.

In one embodiment, the circuit board assembly further comprises at least two motor connecting units, each of the motor connecting units having at least an engraving circuit electrically connected to the circuit board, wherein the engraving circuit is embedded in the mold sealer for connecting with the motor terminal of the driver.

In one embodiment, the engraving circuit is formed by Laser Direct Structuring (LDS) to be embedded in the mold sealer.

In accordance with another aspect of the invention, the present invention comprises a manufacturing method of a circuit board assembly of an array imaging module, which comprises a step of molding a mold sealer on a circuit member.

In one embodiment, the molding step further comprises a step of forming at least two optical windows at the mold sealer.

In one embodiment, the molding step further comprises a step of enclosing an electronic element electrically coupled at and protruded out of a circuit board of the circuit member by the mold sealer.

In one embodiment, the molding step further comprises a step of forming at least two mounting grooves formed at the top side of the mold sealer for engaging with at least one of the supporter, the optical lens, the driver, and the light filter of the array imaging module.

In one embodiment, the molding step further comprises a step of forming a step-like platform that upwardly extends from an inner side of the mold sealer for spacedly support the light filter and the optical lens in position.

In one embodiment, the molding step further comprises a step of forming a threaded structure at an inner wall of the optical window for coupling with the optical lens with a corresponding threaded configuration.

In one embodiment, the molding step further comprises a step of forming at least a reinforcing slot, which is an indention cavity, at the circuit board, wherein the mold sealer is extended into the reinforcing slot to enhance the strength of the circuit board.

In one embodiment, the molding step further comprises a step of forming at least a reinforcing slot, which is a through slot, at the circuit board, wherein the mold sealer is extended into the reinforcing slot to enhance the strength of the circuit board.

In one embodiment, the molding step further comprises a step of forming at least a reinforcing layer overlapped and connected to the circuit board to reinforce the strength of the circuit board.

In one embodiment, the molding step further comprises a step of forming a shielding layer that encloses the circuit board and the mold sealer to enhance the strength of the circuit board and to prevent any electromagnetic interference of the circuit board assembly.

In one embodiment, the molding step further comprises a step of pre-setting a plurality of connecting wires in the mold sealer and electrically connected to the circuit board for electrically connecting with the driver.

In one embodiment, the molding step further comprises a step of pre-setting a plurality of terminal slots at the top side of the mold sealer for electrically connecting with the motor terminals of the driver.

In one embodiment, the molding step further comprises a step of pre-setting a plurality of circuit terminals at the circuit board and a plurality of circuit terminals in the mold sealer and extended corresponding to the terminal slots for connecting with the motor terminal of the driver.

In one embodiment, the molding step further comprises a step of pre-setting a plurality of engraving circuits electrically connected to the circuit board, wherein the engraving circuits are embedded in the mold sealer for connecting with the motor terminal of the driver.

In one embodiment, the engraving circuit is formed by Laser Direct Structuring (LDS) to be embedded in the mold sealer.

In one embodiment, the mold sealer is formed by mold injection or press-mold to integrally couple with the circuit board.

In accordance with another aspect of the invention, the present invention comprises an array imaging module, comprising:

a circuit board assembly, which comprises:
a circuit member for electrically connecting with at least two photosensitive units; and
a mold sealer sealed and coupled at the circuit member; and
at least two optical lenses; and
at least two photosensitive units electrically connected to the circuit member, wherein the optical lenses are located along two optical paths of the photosensitive units respectively.

In one embodiment, the array imaging module further comprises at least a supporter coupled at the circuit board assembly, and at least two light filters coupled at the supporter.

In one embodiment, the array imaging module further comprises at least two drivers operatively coupled to the optical lenses respectively and operatively coupled at the circuit board assembly.

In one embodiment, the array imaging module further comprises at least two light filters operatively coupled at the circuit board assembly.

In accordance with another aspect of the invention, the present invention comprises an array imaging module, comprising:

at least two optical lenses; and
a molded photosensitive assembly which comprises:
at least two photosensitive units;
a circuit board, wherein the photosensitive units are electrically coupled at the circuit board; and
a molded base having at least two optical windows, wherein the molded base is integrally coupled at the circuit board at a peripheral portion thereof, wherein the photosensitive units are aligned with the optical windows respectively, wherein the optical lenses are located along two optical paths of the photosensitive units respectively, such that each of the optical windows forms a light channel through the corresponding photosensitive unit and the corresponding optical lens.

In one embodiment, the array imaging module further comprises at least a light filter located between each of the photosensitive unit and the optical lens.

In one embodiment, the light filter is coupled at a top side of the molded base to retain the light filter in position between the photosensitive unit and the optical lens.

In one embodiment, the light filter is coupled at a lens casing of the optical lens to retain the light filter in position between the photosensitive unit and the optical lens.

In one embodiment, the array imaging module further comprises an encircling frame shaped supporter coupled at the top side of the molded base, wherein the light filter is coupled at the supporter to retain the light filter in position between the photosensitive unit and the optical lens.

In one embodiment, the molded base has at least an indented groove formed at the top side thereof corresponding to the optical window, wherein the light filter is engaged with the indented groove.

In one embodiment, the molded base has at least an indented groove formed at a surface thereof corresponding to the optical window, wherein the supporter is engaged with the indented groove.

In one embodiment, the molded photosensitive assembly further comprises at least a lead wire having two ends electrically connected to a chip connector of the photosensitive unit and the circuit board of the circuit board assembly respectively so as to electrically connect the photosensitive unit with the circuit board.

In one embodiment, the molded photosensitive assembly further comprises at least an electronic element electrically coupled at and protruded from the circuit board, wherein at least one electronic element is enclosed within the molded base.

In one embodiment, all the electronic elements are enclosed within the molded base.

In one embodiment, the molded base further comprises a base frame overlapped with and coupled at the circuit board, such that the base frame will reinforce the strength of the circuit board so as to retain the flatness of the circuit board.

In one embodiment, the circuit board has at least a first reinforcing cavity, wherein once the molded base is formed, at least a portion of the molded base is extended into the first reinforcing cavity to integrally couple the circuit board and the molded base with each other.

In one embodiment, the base frame has at least a second reinforcing cavity, wherein after the base frame is overlapped with and coupled to the circuit board, the first reinforcing cavity of the circuit board and the second reinforcing cavity of the base frame are correspondingly aligned with each other, such that at least a portion of the molded base is extended into the first and second reinforcing cavities to integrally couple the circuit board, the molded base, and the base frame with each other.

In one embodiment, the base frame further comprises a main base body and at least two conductive bodies which are spacedly and integrally extended from the main base body. The circuit board further has at least two channels. The circuit board is overlappedly coupled at the main base body, wherein the two conductive bodies are engaged with the channels respectively, such that the photosensitive units are electrically contacted with the conductive bodies respectively.

In one embodiment, the conductive bodies are protruded from the circuit board that the photosensitive units are contacted with the conductive bodies respectively.

In one embodiment, the circuit board has at least a receiving chamber, wherein at least one of the photosensitive units is received in the receiving chamber of the circuit board.

In one embodiment, the number of receiving chamber is lesser than the number of photosensitive unit.

In one embodiment, the receiving chamber can be a receiving slot or a through slot.

In one embodiment, one of the photosensitive units has a larger photosensitive area while another photosensitive unit has a smaller photosensitive area.

In one embodiment, the circuit board has at least a receiving chamber, wherein the photosensitive unit having a smaller photosensitive area is received in the receiving chamber while the photosensitive unit having a larger photosensitive area is coupled at the surface of the circuit board.

In one embodiment, the array imaging module further comprises at least two drivers operatively coupled at the optical lenses respectively, wherein the drivers are coupled at the molded base to ensure the optical lenses to be located along the optical paths of the photosensitive units respectively.

In one embodiment, the array imaging module further comprises at least two lens barrels coupled with the optical lenses respectively, wherein at least one of the lens barrels is coupled at the top side of the molded base and at least one of the lens barrels is integrally extended from the top side of the molded base to ensure the optical lenses to be located along the optical paths of the photosensitive units respectively.

In one embodiment, the array imaging module further comprises at least one driver and at least one lens barrel. The optical lenses are operatively coupled with the driver and the lens barrel respectively. The driver is coupled at the top side of the molded base. The lens barrel is coupled at the top side of the molded base or is integrally extended from the top side of the molded base. Therefore, the driver and the lens barrel ensure the optical lenses to be located along the optical paths of the photosensitive units respectively.

In one embodiment, the molded base further comprises at least one blocking protrusion protruded from the top side thereof, wherein the inner lateral top surface and the outer lateral top surface are defined at the blocking protrusion as the partition wall between the inner lateral top surface and the outer lateral top surface. The driver is coupled at the outer lateral top surface. The blocking protrusion will block the adhesive entering into the inner lateral top surface when the adhesive is applied between the driver and the outer lateral top surface of the molded base.

In one embodiment, the array imaging module further comprises a supporter which has at least two supporting cavities, wherein the drivers are coupled at the supporting cavities of the supporter respectively.

In one embodiment, a filler is filled between an outer casing of the driver and an inner wall of the supporter.

In one embodiment, the filler is adhesive.

In accordance with another aspect of the invention, the present invention comprises an electronic device, such as a portable electronic device, comprising:

an electronic device body; and at least an array imaging module mounted in the device body for image capturing, wherein the array imaging module comprises:

at least two optical lenses; and a molded photosensitive assembly which comprises:

at least two photosensitive units;

a circuit board, wherein the at least two photosensitive units are electrically coupled at the circuit board; and a molded base having at least two optical windows, wherein the molded base is integrally coupled at the circuit board at a peripheral portion thereof, wherein the photosensitive units are aligned with the optical windows respectively, wherein the optical lenses are located along two optical paths of the photosensitive units respectively, such that each of the optical windows forms a light channel through the corresponding photosensitive unit and the corresponding optical lens.

In one embodiment, the array imaging module is mounted at the device body at a transverse direction thereof, wherein the array imaging module is located at one of the corners or at a mid portion of the device body.

In one embodiment, the array imaging module is mounted at the device body at a longitudinal direction thereof, wherein array imaging module is located at one of the corners or at a mid portion of the device body.

In accordance with another aspect of the invention, the present invention comprises a molded photosensitive assembly, which comprises:

at least two photosensitive units;

a circuit board, wherein the photosensitive units are electrically coupled at the circuit board; and a molded base having at least two optical windows, wherein the molded base is integrally coupled at the circuit board at a peripheral portion thereof, wherein the photosensitive units are aligned with the optical windows respectively.

In one embodiment, the molded photosensitive assembly further comprises at least a lead wire having two ends electrically connected to a chip connector of the photosensitive unit and the circuit board of the circuit board assembly respectively so as to electrically connect the photosensitive unit with the circuit board.

In one embodiment, the circuit board has at least a receiving chamber, wherein the photosensitive unit is received in the receiving chamber of the circuit board.

In one embodiment, one of the photosensitive units has a larger photosensitive area while another photosensitive unit has a smaller photosensitive area.

In one embodiment, the circuit board has at least a receiving chamber, wherein the photosensitive unit having a smaller photosensitive area is received in the receiving chamber while the photosensitive unit having a larger photosensitive area is coupled at the surface of the circuit board.

In one embodiment, the molded base further comprises a base frame overlapped with and coupled at the circuit board, such that the base frame will reinforce the strength of the circuit board so as to retain the flatness of the circuit board.

In one embodiment, the circuit board has at least a first reinforcing cavity, wherein once the molded base is formed, at least a portion of the molded base is extended into the first reinforcing cavity to integrally couple the circuit board and the molded base with each other.

In one embodiment, the base frame has at least a second reinforcing cavity, wherein after the base frame is overlapped with and coupled to the circuit board, the first reinforcing cavity of the circuit board and the second reinforcing cavity of the base frame are correspondingly aligned with each other, such that at least a portion of the molded base is extended into the first and second reinforcing cavities to integrally couple the circuit board, the molded base, and the base frame with each other.

In one embodiment, the base frame further comprises a main base body and at least two conductive bodies which are spacedly and integrally extended from the main base body. The circuit board further has at least two channels. The circuit board is overlappedly coupled at the main base body, wherein the two conductive bodies are engaged with the channels respectively, such that the photosensitive units are electrically contacted with the conductive bodies respectively.

In one embodiment, the conductive bodies are protruded from the circuit board that the photosensitive units are contacted with the conductive bodies respectively.

In one embodiment, the molded base has an indented groove formed at the top side thereof.

In one embodiment, the molded base further comprises at least one blocking protrusion protruded from the top side thereof, wherein the inner lateral top surface and the outer lateral top surface are defined at the blocking protrusion as the partition wall between the inner lateral top surface and the outer lateral top surface.

In accordance with another aspect of the invention, the present invention comprises a manufacturing method of a molded photosensitive assembly, comprising the steps of:

(a) electrically coupling at least an electronic element on a circuit board;

(b) forming a molded base on the circuit board by a molding process to integrally couple the molded base with the circuit board and to enclose the electronic element within the molded base, wherein at least an optical window is formed at the molded base; and (c) electrically coupling a photosensitive unit at the circuit board to align with the optical window.

In one embodiment, before the step (b), the step (c) further comprises a step of electrically coupling the photosensitive unit at the circuit board before the molded base is formed by the molding process, such that when the molded base is formed, the optical window is formed to align with the photosensitive unit.

In one embodiment, the step (b) further comprises the steps of:

(b.1) disposing the circuit board with the electronic element thereon in a mold;

(b.2) operating the mold to couple an upper mold body and a lower mold body with each other that a mold cavity is formed at a peripheral portion and a center portion of the circuit board between the upper mold body and the lower mold body; and (b.3) introducing a mold material in fluid state into the mold cavity, wherein when the mold material is solidified, the molded base with the optical window is formed.

In one embodiment, before the step (b.2), an enclosing film is provided at a mold engaging surface of the upper mold body, wherein the enclosing film is sandwiched between the mold engaging surface of the upper mold and the circuit board.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

Figure 1A:
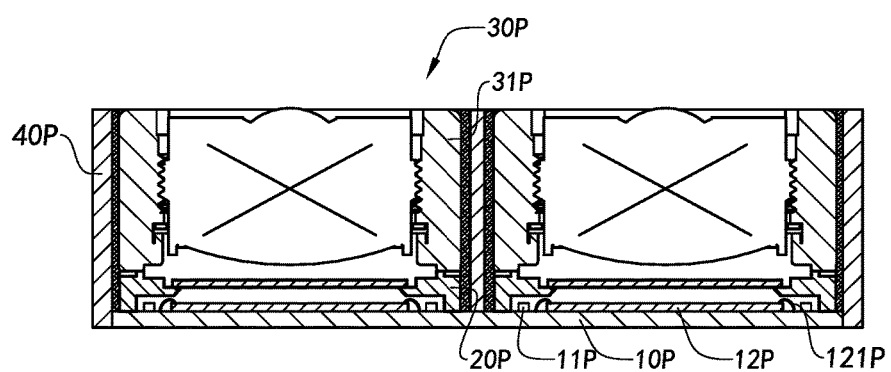
FIGS. 1A and 1B illustrate a conventional dual lens camera module.
Figure 1B:
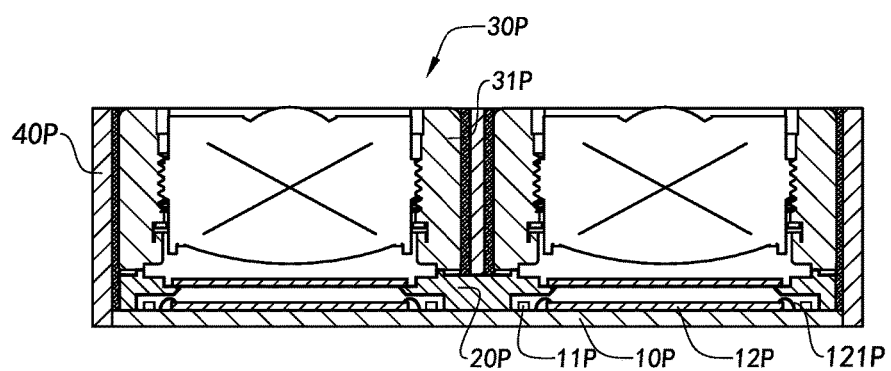

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

It is appreciated that the terms "longitudinal", "transverse", "upper", "lower", "front", "rear", "left", "right", "vertical", "horizontal", "top", "bottom", "exterior", and "interior" in the following description refer to the orientation or positioning relationship in the accompanying drawings for easy understanding of the present invention without limiting the actual location or orientation of the present invention. Therefore, the above terms should not be an actual location limitation of the elements of the present invention.

Referring to FIGS. 2A to 4, an array imaging module and its circuit board assembly according to a first preferred embodiment of the present invention is illustrated, wherein the array imaging module is able to incorporate with various electronic devices, such as smartphone, such that a user is able to capture an image of an object or person via the array imaging module. For example, the array imaging module serves as a camera to take a photo, video or other image content. The array imaging module can be used in a mobile electronic device, such as, but not limit to, a mobile phone, tablet computer, a music player (MP3/4/5), a personal digital assisting device, an electronic book device, a laptop computer, a digital camera, and the like.

As shown in FIGS. 2A to 4, the array imaging module is embodied as a dual lens camera module, wherein the array imaging module comprises a circuit board assembly 220, at least two optical lenses 10, and at least two photosensitive units 21.

It is worth mentioning that in the disclosure of the present invention, two optical lenses 10 are illustrated for the array imaging module as an example. In other embodiments, two or more optical lenses 10 and two or more photosensitive units 21, such as three optical lenses 10 and three photosensitive units 21, are constructed to form the array imaging module. The numbers of optical lenses 10 and photosensitive units 21 should not be limited in the present invention.

Furthermore, each of the optical lenses 10 is electrically coupled with the circuit board assembly 220 and is retained and supported at an upper portion of the circuit board assembly 220. In particular, each of the optical lenses 10 is aligned with an optical path of the corresponding photosensitive unit 21. Accordingly, the circuit board assembly 220 is coupled at the electronic device. It is appreciated that one optical lens 10 and one photosensitive unit 21 are constructed to form an imaging system for capturing image. The capturing target, such as human or object, is captured by reflecting the light from the target and passing the reflected light through the optical lens 10 into the interior of the array imaging module. Then, the photosensitive unit 21 will receive the reflected light along the optical path for photoelectric conversion. In other words, the photosensitive unit 21 will convert light signal into electric signal, wherein the electric signal is then transmitted to the electronic device by the circuit board assembly 220, such that the electronic device will generate a captured image corresponding to the electric signal.

The circuit board assembly 220 comprises a mold sealer 2201 and a circuit member 2202, wherein the mold sealer 2201 is sealedly coupled to the circuit member 2202. In one embodiment, circuit member 2202 is molded in the mold sealer 2201. In particular, the mold sealer 2201 can be made by Molding On Board (MOB) process to seal and couple with the circuit member 2202. In other words, the mold sealer 2201 and the circuit member 2202 are integrally constructed to form an integrated structure.

The circuit member 2202 comprises a circuit board 22, wherein the photosensitive unit 21 is electrically coupled at the circuit board 22. The circuit member 2201 and the circuit board 22 are integrally formed with each other. The mold sealer 2201 has two optical windows 231. The mold sealer 2201 is encirclingly mounted around the photosensitive unit 21 at an exterior side thereof. The optical windows 231 are supported and aligned with the optical lenses 10 and the optical paths of the photosensitive unit 21. In other words, the photosensitive unit 21 is located at the circuit board 22 to align with the corresponding the optical window 231.

In one embodiment, the circuit board 22 is initially coupled to the mold sealer 2201 to form an integrated body. Then, the photosensitive unit 21 is coupled to the circuit board 22 in order to electrically connect the photosensitive unit 21 with the circuit board 22. In another embodiment, the photosensitive unit 21 is initially coupled to the circuit board 22 to electrically connect the photosensitive unit 21 with the circuit board 22. Then, the circuit board 22 is coupled to the mold sealer 2201 to form an integrated body.

The mold sealer 2201 comprises a connecting body 22011 and two outer ring bodies 22012, wherein the connecting body 22011 is mold-connected between the two outer ring bodies 22012 to spacedly separate the outer ring bodies 22012 by the connecting body 22011. Accordingly, each of the outer ring bodies 22012 forms the corresponding optical window 231. The two photosensitive units 21 are located at two lateral sides of the connecting body 22011 to form the array imaging module. It is worth mentioning that the connecting body 22011 serves as a common body or sharing body that when installing the optical lenses 10, wherein the optical lenses 10 will take even portions of the connecting body 22011.

It is appreciated that the connecting body 22011 of the mold sealer 2201 and each of the outer ring bodies 22012 are integrally formed with the circuit board 22 by molding process. Each of the outer ring bodies 22012 is integrally connected to an outer peripheral edge of the circuit body 22. The connecting body 22011 is integrally connected at a center portion of the circuit board 22. It is appreciated that the center portion of the circuit board 22 is integrally connected to the connecting body 22011 to form a reinforcing rib so as to enhance the rigidity of the circuit board 22 for prevent the deformation of the circuit board 22. The outer ring bodies 22012 are integrally connected to the outer peripheral edge of the circuit body 22 to enhance the rigidity of the circuit board 22 along the outer peripheral edge thereof. As a result, the mold sealer 2201 will enhance the rigidity of the circuit board 22.

The circuit member 2202 comprises a connecting circuit (not shown in Figure) and at least an electronic element 26. The connecting circuit is pre-formed at the circuit board 22. The electronic element 26 is electrically connected to the connecting circuit and the photosensitive units 21. In other words, the electronic element 26 is electrically connected to the photosensitive unit 21 through the connecting circuit. Therefore, the electronic element 26 and the photosensitive unit 21 are incorporated with each other during the photosensitive operation. The electronic element 26 can be, but not limit to, a resistor, a capacitor, a diode, a triode, a potentiometer, a relay, a driver, or a processor.

According to the preferred embodiment, the electronic element 26 is configured corresponding to the photosensitive unit 21 in order to incorporate with the photosensitive unit 21 for photosensitive operation.

It is worth mentioning that the mold sealer 2201 is arranged to envelop and encapsulate the one or more electronic elements 26 therewithin, such that the one or more electronic elements 26 are enclosed to prevent from exposing to the surroundings. In other words, the connection between the photosensitive unit 21 and the one or more electronic elements 26 will be enclosed in a closed environment. Unlike the conventional camera module, the electronic elements 26 thereof are exposed to outside. For example, the dust may accumulate at the electronic elements 26, such as a capacitor, and contaminate the photosensitive unit 21. According to the preferred embodiment, the one or more electronic elements 26 are protruded from the circuit board 22 as an example. In one embodiment, the one or more electronic elements 26 are embedded in the interior of the circuit board 22 to prevent the one or more electronic elements 26 being protruded from the circuit board 22. Person skilled in the art should understand that the one or more electronic elements 26 can be outwardly protruded between the two photosensitive units 21, wherein the protruded electronic elements 26 can be enclosed by the connecting body 22011 so as to minimize the installing space for the lens base comparing with the conventional camera module. In other words, the overall size of the array imaging module of the present invention is thus be reduced.

It is worth mentioning that the one or more electronic elements 26 are enclosed by the mold sealer 2201 so as to achieve the advantages of protecting the electronic element 26 as well as the respective imaging module. Person skilled in the art should understand that it should not be limited to cover the one or more electronic elements 26 by the mold sealer 2201. In other words, the mold sealer 2201 can be molded directly on the circuit board 22 to embed and encapsulate the one or more electronic elements 26 therein in one embodiment, such that the one or more electronic elements 26 will not protruded from the circuit board 22. The mold sealer 2201 can be molded to encircle around the outer side or surrounding of the electronic element(s) 26.

It is worth mentioning that in one embodiment, the mold sealer 2201 is protrudedly encircled around the outer side of the photosensitive unit 21. In particular, the mold sealer 2201 is sealed at and integrated with the photosensitive unit 21 to enclose the photosensitive unit 21. Therefore, when the optical lens 10 is mounted at the mold sealer 2201, the photosensitive unit 21 is sealedly enclosed within the mold sealer 2201 so as to provide a closed environment for the photosensitive unit 21.

Figure 3A:
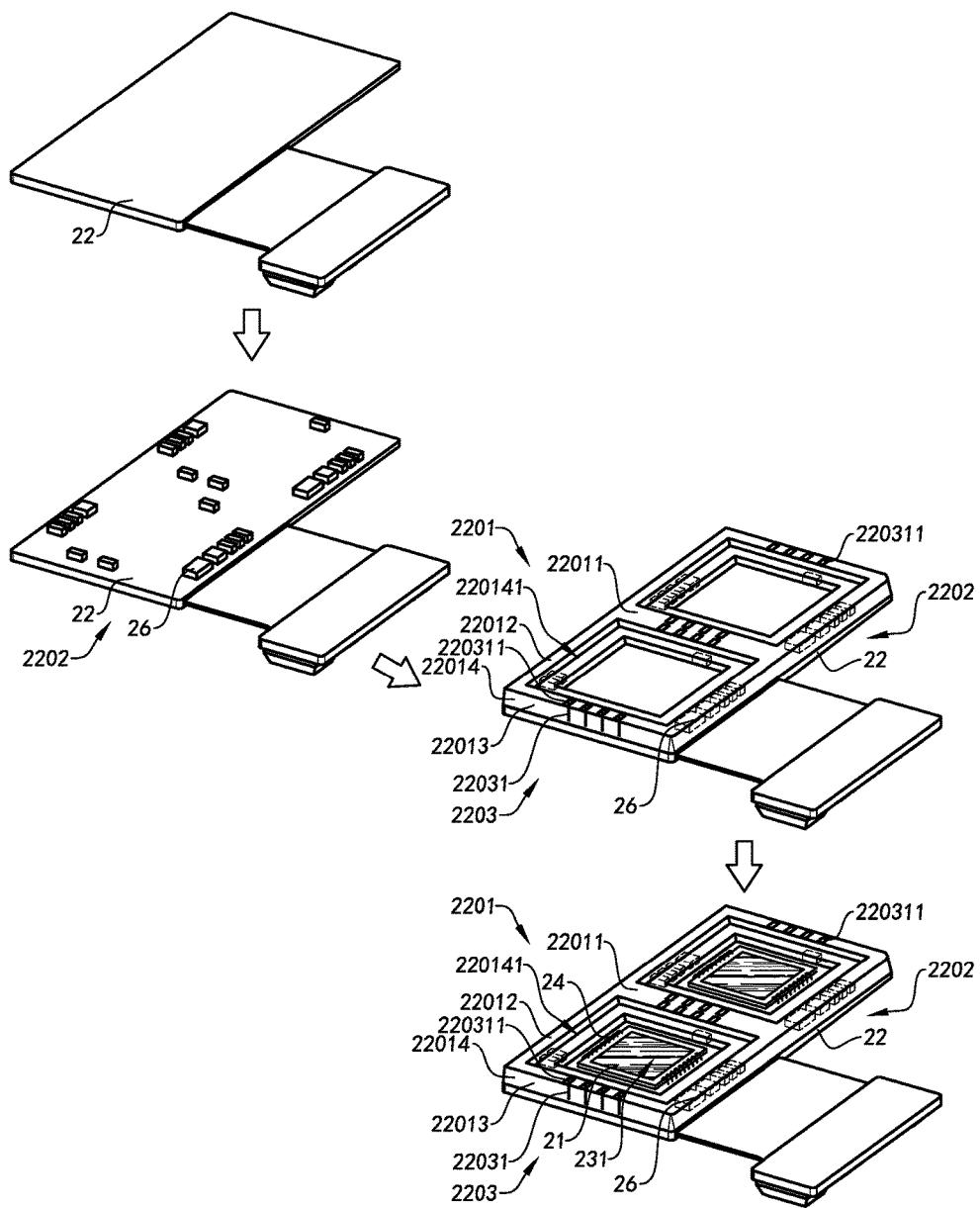
FIG. 3A illustrates a manufacturing process of the array imaging module and its circuit board assembly according to the above first preferred embodiment of the present invention.
Figure 3B:
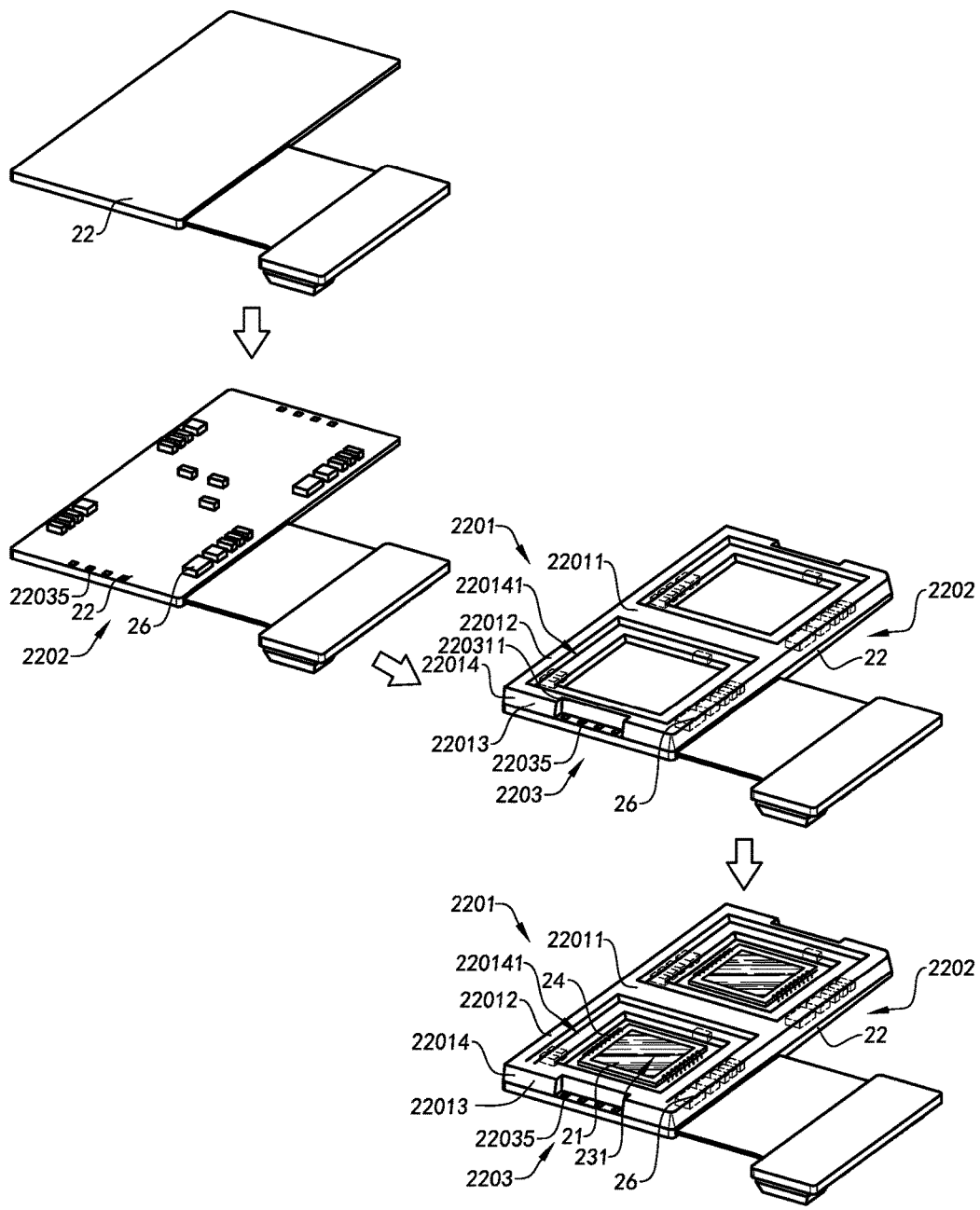
FIG. 3B illustrates an alternative mode of the manufacturing process of the array imaging module and its circuit board assembly according to the above first preferred embodiment of the present invention.
Figure 4:
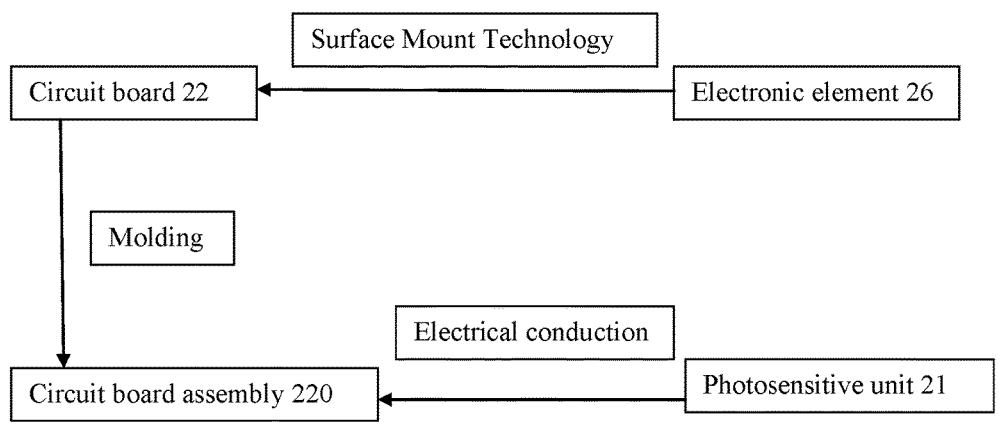
FIG. 4 is a block diagram illustrating a manufacturing process of the circuit board assembly according to the above first preferred embodiment of the present invention.

As shown in FIGS. 3A to 4, during the manufacturing process of the circuit board assembly 220, the circuit board 22 can be made by the modification of a conventional circuit board. For example, the circuit board 22 is treated by a surface molding process. In one embodiment, the circuit board 22, by means of such as an injection molding machine, is molded and treated by insert molding that integrally encapsulates the circuit board 22 after it is treated by the Surface Mount Technology (SMT). For example, molding encapsulation, the circuit board 22 is molded, such as plastic packaged, to form the mold sealer 2201, or that the circuit board 22 is press-molded, which is frequently applied in the semiconductor encapsulation, to form the mold sealer 2201. Furthermore, the photosensitive unit 21 is then coupled to the circuit board 22 and is electrically connected to the circuit board 22 via a gold wire as an example. For example, the circuit board 22 can be, but not limit to, a rigid-flex combination board, ceramic substrate (non-flexible board), or a rigid PCB board (non-flexible board). The mold sealer 2201 can be treated by, but not limit to, an injection molding process, a molding process, or the like. For example, the injection molding material can be nylon, LCP (Liquid Crystal Polymer), PP (Polypropylene), epoxy resin, or the like. The press-molding process can be carried out by using epoxy resin as an example. It is appreciated that the manufacturing methods and materials can be selected according to the need of the present invention and should not be limited in the present invention.

In another embodiment, the manufacturing process of the circuit board assembly 220 comprises the steps of firstly treating the circuit board 22 by SMT process, coupling the photosensitive unit 21 on the circuit board 22, electrically connecting the photosensitive unit 21 with the circuit board 22 via connecting wires such as the gold wire, and molding the circuit board 22, such as mold-packaging, to form the mold sealer 2201 via the insert-molding. Alternatively, the circuit board 22 can be press-molded to form the mold sealer 2201. It is appreciated that the manufacturing sequence of the circuit board assembly 220 can be alternated and it should not be limited in the present invention.

It is worth mentioning that each of the optical lenses 10 is mounted at the mold sealer 2201 of the circuit board assembly 220, wherein the mold sealer 2201 itself also serves as a conventional supporting frame, such that the mold sealer 2201 supports and retains the optical lens 10 in position. However, the assembling process is totally different from the conventional COB process, wherein the conventional COB process is that an independent supporting frame of the camera module is adhered to the circuit board wherein the supporting frame must have a desired thickness to form a rigid body to support the optical lens and lens barrel and reserve a safety distance around electronic elements on the circuit board while it is adhered on top of the electronic elements. In view of the present invention, the mold sealer 2201 is molded to the circuit board 22, via Molding On Board (MOB) process as an example, to retain and affixed on the circuit board 22 in position to form an integral body. In other words, there is no adhering process in the present invention since the molding process of the present invention has better connection stability and higher controllability comparing with the convention COB process. More importantly, there is no requirement for a predetermined safety distance between the mold sealer 2201 and the circuit board 22 to seal the one or more electronic elements 26. As a result, the thickness of the array imaging module of the present invention can be reduced because the mold sealer 2201 having its desired thickness directly encloses and encapsulates the one or more electronic elements 26 therein. In addition, the mold sealer 2201 is coated on the one or more electronic elements 26, such that the one or more electronic elements 26 can be overlapped with each other. In other words, there is no such safety distance required around the circuit components in the conventional camera module. Therefore, the mold sealer 2201 not only provides a supportive ability but also has a height fitting into a relatively small and compact area in order to reduce the thickness of the array imaging module of the present invention. In addition, the mold sealer 2201 can replace the conventional supporting frame to prevent the tilting error via the adhering process, so as to reduce the accumulative tolerance of the array imaging module during the assembling process.

It is worth mentioning that the shape of the mold sealer 2201 can be selectively adjusted. For example, the electronic element 26 is extended inwardly to define a protruding portion, such that the width of the mold sealer 2201 will be correspondingly increased. When there is no electronic element 26, the mold sealer 2201 can be integrally extended to have a regular shape and to have a reduced thickness. It is appreciated that the shape of the mold sealer 2201 should not be limited in the present invention.

Furthermore, the mold sealer 2201 comprises an enclosing portion 22013 and a light filtering portion 22014. The light filtering portion 22014 is molded to integrally extend from the enclosing portion 22013 via the molding process. The enclosing portion 22013 is molded to connect to the circuit board 22 to enclose the one or more electronic elements 26. Two light filters 40 are installed at the light filtering portion 22014, wherein the light filter 40 can be, but not limit to, an infrared cut-off filter (IRCF).

In other words, during the assembling process of the circuit board assembly 220 of the array imaging module, each of the light filters 40 is mounted at the light filtering portion 22014, such that the light filter 40 is retained in position align with the photosensitive path of the corresponding photosensitive unit 21, so as to eliminate any supporting structure for the light filter 40. In other words, the mold sealer 2201 has the supportive ability as the conventional supporting frame. Taking the advantage of the molding process, the top side of the light filtering portion 22014 can be molded to have a flat surface through the molding process, such that the light filter 40 can be flatnessly and stably installed at the light filtering portion 22014, which is superior to the conventional camera module.

Furthermore, the light filtering portion 22014 has at least a mounting groove 220141. In one embodiment, two mounting grooves 220141 are spacedly formed at the light filtering portion 22014, wherein the two mounting grooves 220141 are located corresponding to the optical window 231. The mounting grooves 220141 provide a mounting space, wherein a peripheral edge of the light filter 40 is engaged with the respective mounting groove 220141, such that the light filter 40 will not protruded out of the top side of the light filtering portion 22014. Preferably, the mounting grooves 220141 are formed at two sides of the mold sealer 2201, wherein the light filter 40 can be stably mounted at the mold sealer 2201 to prevent the light filter 40 being protruded out of the top side of the mold sealer 2201.

It is worth mentioning that the mounting grooves 220141 are configured to couple with the light filter 40 in one embodiment. In another embodiment, the mounting grooves 220141 are configured to couple the component like the motor or optical lens of the array imaging module. It is appreciated that the use of the mounting groove 220141 should not be limited in the present invention.

According to the preferred embodiment, the photosensitive unit 21 is electrically connected to the circuit board 22 via at least a lead wire 24 which is connected with the circuit board 22. The lead wire 24 can be, but limited to, gold wire, copper wire, aluminum wire, or silver wire. In particular, the lead wire 24 from the photosensitive unit 21 is connected to the circuit board 22 via the conventional COB process, such as welding. In other words, the connection between the photosensitive unit 21 and the circuit board 22 can be an existing connection technique to reduce the cost of the process, to make full use of the conventional process and equipment, and to prevent any waste of the resources. In addition, the wiring direction of the lead wire 24 should not be limited. For example, the wiring direction of the lead wire 24 can be extended from the photosensitive unit 21 to the circuit board 22 or can be extended to the photosensitive unit 21 from the circuit board 22. It is appreciated that the electrical connection between the photosensitive unit 21 and the circuit board 22 can be formed by other connection methods, which should not be restricted in the present invention.

It is worth mentioning that each of the photosensitive units 21 is mounted at the top side of the circuit board 22, wherein the mold sealer 2201 is encircled around the photosensitive unit 21 at the outer peripheral edge thereof. During the manufacturing process of the circuit board assembly 220, the manufacturing sequence can be altered. In one embodiment, two photosensitive units 21 are firstly coupled on the circuit board 22. Then, the mold sealer 2201 is coupled on the circuit board 22 via the molding process along the outer peripheral edges of the photosensitive units 21 to enclose the one or more electronic elements 26 protruded from the circuit board 22. In another embodiment, the circuit board 22 is molded to form with the mold sealer 2201 so as to enclose the one or more electronic elements 26 protruded from the circuit board 22. Then, the photosensitive units 21 are coupled on the circuit board 22, wherein the photosensitive units 21 are located at the inner lateral side of the mold sealer 2201.

According to the preferred embodiment, two optical lenses 10 are constructed, as an example, to form the array imaging module of the present invention. Through the molding process, the two light filters 40 and the two optical lenses 10 are assembled in a consistent manner to obtain better optical performance. In another embodiment, more than two optical lenses 10 can be constructed in the array imaging module. Correspondingly, more than two optical windows 231 are provided at the circuit board assembly 220. It is appreciated that the number of optical lens 10 should not be restricted in the present invention.

Figure 6:
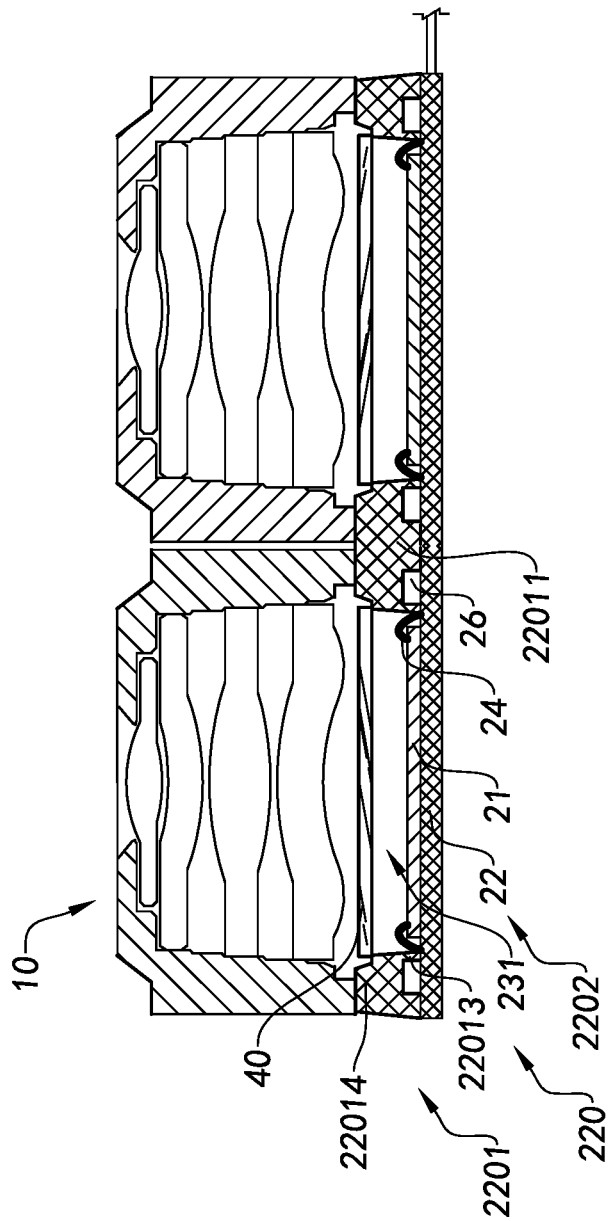
FIG. 6 illustrates an alternative mode of the array imaging module according to the above first preferred embodiment of the present invention.

FIG. 6 illustrates another embodiment of the present invention, wherein each of the optical lenses 10 is directly coupled at the mold sealer 2201 of the circuit board assembly 220. In other words, the optical lens 10 can be a fix-focus lens assembly that the focal length of the optical lens 10 cannot be selectively adjusted. It is appreciated that the optical lens 10 is directly coupled at the mold sealer 2201 via a casing connected thereto. Referencing FIG. 2B, the array imaging module of the present invention further comprises at least a driver 30, wherein each of the drivers 30 is coupled at the mold sealer 2201. The optical lens 10 is coupled at and driven by the driver 30, such that the optical lens 10 can be driven to move by the driver 30 along the optical path of the photosensitive unit 21 so as to adjust the focal optical of the optical lens 10. In other words, the optical lens 10 can be an auto-focus lens assembly that the focal length of the optical lens 10 can be selectively adjusted. For example, the user is able to selectively adjust the focal length of the optical lens 10 for capturing image.

The driver 30 can be any type and should not be limited in the present invention, as long as the optical lens 10 can be driven to move by the driver 30 along the optical path of the photosensitive unit 21. For example, the driver 30 can be, but not limit to, a voice coil motor.

It is worth mentioning that the mold sealer 2201 is arranged to support the light filter 40, the optical lenses 10, and/or the driver 40, such that the mold sealer 2201 has a supportive ability as the conventional supporting frame. Through the molding process, the mold sealer 2201 is molded to have the flatness and consistency. Therefore, the light filter 40, the optical lenses 10, and/or the driver 40 can be flatnessly and stably supported by the mold sealer 2201 via the flatness and consistency thereof. More importantly, the optical paths of the photosensitive units 21 can be ensured and consistent, which is not easily achieved by the conventional camera module.

It is worth mentioning that the mold sealer 2201 is integrally formed with the circuit board 22 via the molding process to enhance the rigidity of the circuit board 22. Comparing with the conventional camera module through the conventional COB, the thickness of the circuit board 22 of the present invention can be further reduced while the rigidity of the circuit board 22 is enhanced. On the other hand, the distance between the optical lens 10 and the mold sealer 2201 can be reduced to minimize the lateral dimension of the array imaging module of the present invention.

Furthermore, as shown in FIG. 3, the circuit board assembly 220 further comprises at least two motor connecting units 2203 operatively connected to the drivers 30 respectively. Each of the drivers 30 comprises at least a motor terminal 31. Each of the motor connecting units 2203 comprises a first connecting wire 22031 electrically connected to the driver 30 and the circuit board 22. In particular, each of the first connecting wires 22031 is electrically connected to the connecting circuit of the circuit board 22. Each of the first connecting wires 22031 is set at the mold sealer 2201 and is extended to the top side of the mold sealer 2201. The first connecting wire 22031 has a first motor connecting end 220311 exposed and extended above the top side of the mold sealer 2201 to electrically connect to the motor terminal 31 of the driver 30. It is worth mentioning that the first motor connecting end 220311 of the first connecting wire 22031 can be embedded in the mold sealer 2201. According to the conventional process, the driver is electrically connected to the circuit board via an individual wire, such that the conventional process is relatively complicated. In view of the present invention, the first connecting wire 22031 is pre-set at the mold sealer 2201 at the time when the mold sealer 2201 is formed by molding process, such that the pre-forming configuration thereof can replace the conventional welding process for wire connection. Therefore, the electrical connection of the first connecting wire 22031 will become more stable. In particular, the first connecting wire 22031 is embodied as a conducting wire being embedded in the mold sealer 2201. For example, the first motor connecting end 220311 of the first connecting wire 22031 can be electrically connected to the motor terminal 31 of the driver 30 via the anisotropic conductive adhesive film or by welding.

In other words, before the mold sealer 2201 is formed, the bottom end of the first connecting wire 22031 is electrically connected to the circuit board 22. Then, when the mold sealer 2201 is formed, the portion of the first connecting wire 22031 is enclosed by the mold sealer 2201, such that the upper end of the first connecting wire 22031 is exposed and extended out of the top side of the mold sealer 2201 in order to form the first motor connecting end 220311.

It is worth mentioning that the embedded position of the first connecting wire 22031 and the position of the first motor connecting end 220311 thereof can be selectively adjusted at the mold sealer 2201 according to the configuration of the present invention. In one embodiment, the first motor connecting end 220311 of the first connecting wire 22031 is set at an outer circumference of the mold sealer 2201, i.e. the top side of the mold sealer 2201. In another embodiment, the first motor connecting end 220311 of the first connecting wire 22031 is set at an inner circumference of the mold sealer 2201, i.e. the bottom side of the mounting groove 220141 of the mold sealer 2201. Therefore, the driver 30 is able to be installed at different locations. In other words, when the driver 30 is needed to be coupled at the top side of the mold sealer 2201, the first motor connecting end 220311 of the first connecting wire 22031 is set at the outer circumference of the mold sealer 2201. When the driver 30 is needed to be coupled at the bottom side of the mold sealer 2201, the first motor connecting end 220311 of the first connecting wire 22031 is set at the inner circumference of the mold sealer 2201, which is the bottom side of the mounting groove 220141.

That is to say, during the manufacturing process of the circuit board assembly 220, the photosensitive unit 21 is initially coupled at the circuit board 22 and then the mold sealer 2201 is formed and molded on the circuit board 22 via the MOB process. During the molding process, the first connecting wire 22031 can be embedded in the mold sealer 2201 and the first connecting wire 22031 is electrically connected to the circuit board 22. In addition, the first motor connecting end 220311 of the first connecting wire 22031 is exposed and extended out of the top side of the mold sealer 2201 for electrically connecting to the motor terminal 31 of the driver 30. For example, when the circuit board assembly 220 is installed at the array imaging module, the motor terminal 31 of the driver 30 can be electrically connected to the first motor connecting end 220311 of the first connecting wire 22031 by welding, so as to electrically connect the driver 30 to the circuit board 22. As a result, the present invention does not require any individual connecting wire to connect the driver 30 to the circuit board 22 so as to minimize the length of the motor terminal 31 of the driver 30.

Figure 5A:
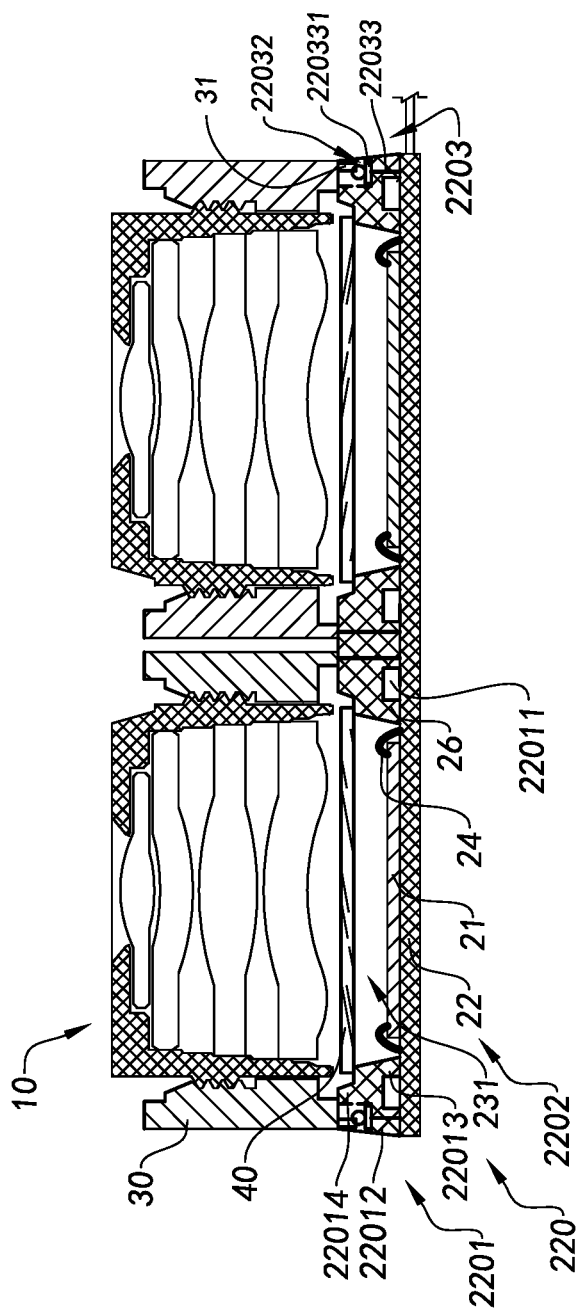
FIGS. 5A, 5B, and 5C illustrate different assembling structures between the molded circuit board assembly and the lens motor according to the above first preferred embodiment of the present invention.

FIG. 5A illustrates a modification of the motor connection of the preferred embodiment. Each of the motor connecting units 2203 comprises at least one first terminal slot 22032 that receives the motor terminal 31 of the driver 30. Accordingly, the first terminal slot 22032 is provided at the mold sealer 2201 at the top side thereof. In other words, the first terminal slot 22032 of the motor connecting unit 2203 is formed at the top side of the mold sealer 2201. Each of the motor connecting units 2203 further comprises at least a second connecting wire 22033 that electrically connects to the driver 30 and the circuit board 22. Accordingly, the second connecting wire 22033 is set at the mold sealer 2201 and is extended to the bottom wall surface of the first terminal slot 22032. The second connecting wire 22033 comprises a second motor connecting end 220331 provided at the mold sealer 2201 and extended to the bottom wall surface of the first terminal slot 22032, wherein the second motor connecting end 220331 is electrically coupled to the motor terminal 31 of the driver 30. In one embodiment, the second motor connecting end 220331 can be embodied as a welding pad. The second connecting wire 22033 is embodied as a conductive wire embedded in the mold sealer 2201.

In other words, during the manufacturing process of the circuit board assembly 220, the photosensitive unit 21 is initially coupled such as attached to the circuit board 22, and then the mold sealer 2201 is molded and coupled to the circuit board 22 via the MOB process. At the same time, the first terminal slot 22032, having a predetermined length, is pre-set at the molding process of the mold sealer 2201. In addition, the second connecting wire 22033 is electrically connected to the circuit board 22 and is electrically connected to the second motor connecting end 220331 at the bottom wall surface of the first terminal slot 22032. Therefore, the motor terminal 31 of the driver 30 can be easily connected to the second connecting wire 22033. For example, when the circuit board assembly 220 is installed into the array imaging module, the motor terminal 31 of the driver 30 can be inserted into the first terminal slot 22032 to electrically connect the second motor connecting end 220331 of the second connecting wire 22033 by welding. Therefore, the driver 30 is electrically connected to the circuit board 22. In other words, no individual wire is needed for electrical connection between the driver 30 and the circuit board 22. In addition, the motor terminal 31 of the driver 30 can be stably connected to prevent any external force exerted thereto. It is worth mentioning that the second connecting wire 22033 can be a conductive wire embedded in the mold sealer 2201.

Figure 5B:
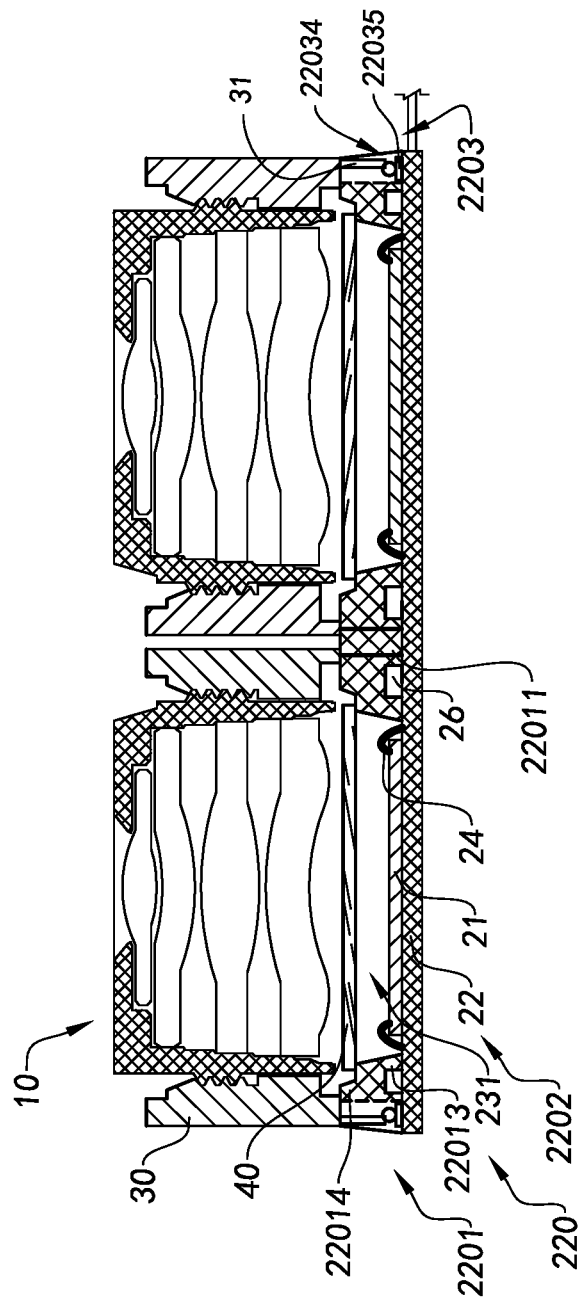

FIGS. 3B and 5B illustrate another embodiment of the motor connecting unit. Each of the motor connecting units 2203 comprises at least a second terminal slot 22034 that receives the motor terminal 31 of the driver 30. Accordingly, the second terminal slot 22034 is provided at the mold sealer 2201 at the outer lateral side thereof. In other words, the second terminal slot 22034 of the motor connecting unit 2203 is formed at the outer lateral side of the mold sealer 2201. Each of the motor connecting units 2203 further comprises at least a circuit terminal 22035 pre-set at the circuit board 22 and electrically connected to the connecting circuit of the circuit board 22. In addition, the second terminal slot 22034 is extended from the top side of the mold sealer 2201 to the circuit board 22. The circuit terminal 22035 is extended corresponding to the second terminal slot 22034. In one embodiment, the motor terminal 31 is inserted into and retained at the second terminal slot 22034, wherein the motor terminal 31 is electrically connected to the circuit terminal 22035 by welding so as to electrically connect the driver 30 to the circuit board 22.

In other words, during the manufacturing process of the circuit board assembly 220, the circuit terminal 22035 is pre-formed at the circuit board 22, and the photosensitive unit 21 and the electronic component 26 are coupled to the circuit board 22, and then the mold sealer 2201 is molded and coupled to the circuit board 22 via the MOB process. At the same time, the second terminal slot 22034, having a predetermined length, is pre-set at the molding process of the mold sealer 2201. The second terminal slot 22034 is extended from the circuit terminal 22035. For example, when the circuit board assembly 220 is installed into the array imaging module, the motor terminal 31 of the driver 30 can be inserted into the second terminal slot 22034 to electrically connect the circuit terminal 22035 by welding. Therefore, the driver 30 is electrically connected to the circuit board 22. In addition, the motor terminal 31 of the driver 30 can be stably connected to prevent any external force exerted thereto.

Figure 5C:
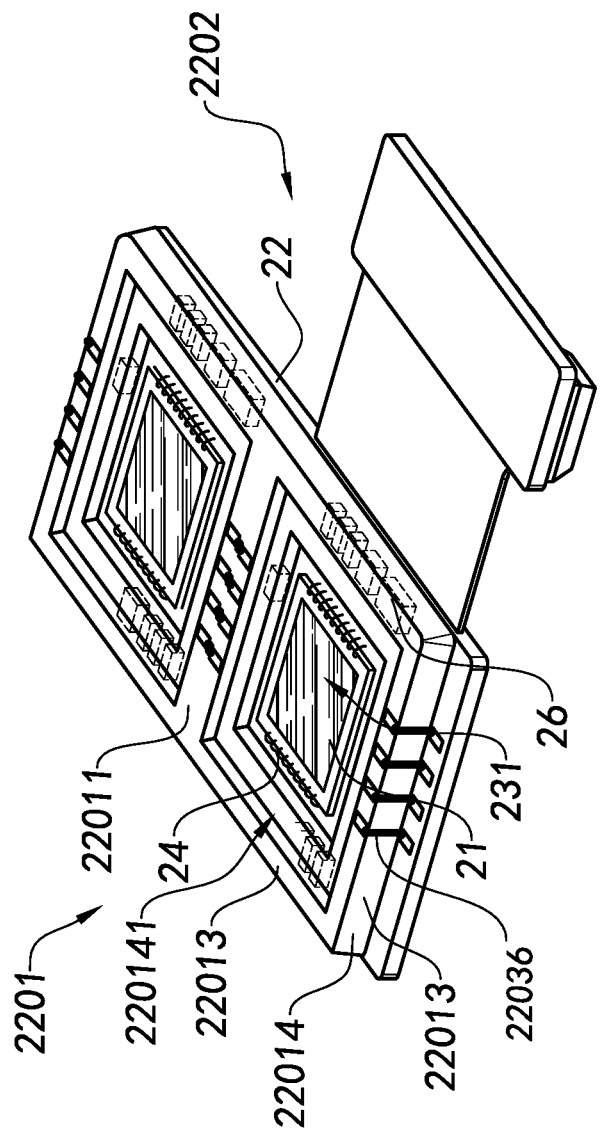

FIG. 5C illustrates another embodiment of the motor connecting unit. Each of the motor connecting units 2203 comprises at least an engraving circuit 22036 electrically connected to the connecting circuit of the circuit board 22, the photosensitive unit 21, and the motor, etc. . . . . . For example, the engraving circuit 22036 is formed by, but limited to, Laser Direct Structuring (LDS) and then metal-plating in order to provide at the mold sealer 2201. According to the conventional connecting method, the motor is electrically connected to the circuit board via an individual wire, such that the manufacturing process thereof is relatively complicated. In view of the present invention, the engraving circuit 22036 can replace the conventional welding process for electrical connection, such that the electrical connection of the present invention will be more stable comparing with the conventional one. In particular, the engraving circuit 22036 is formed by forming an engraving groove at the mold sealer 2201 and metal-plating the engraving groove.

Figure 2A:
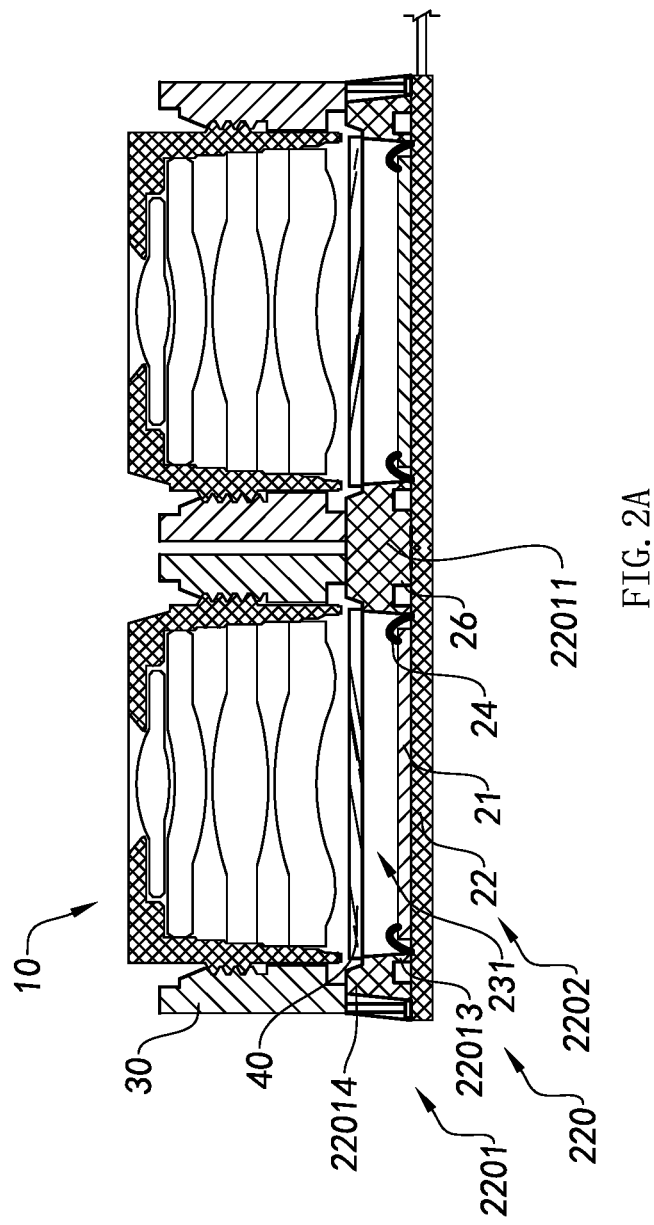
FIG. 2A is a sectional view of an array imaging module and its circuit board assembly according to a first preferred embodiment of the present invention.
Figure 2B:
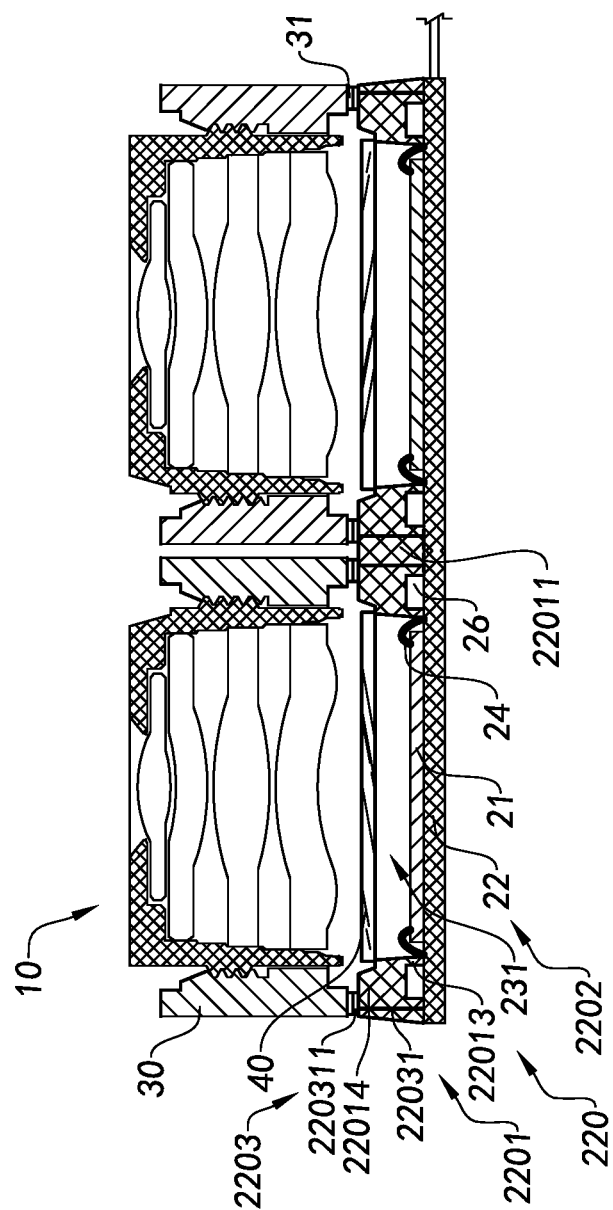
FIG. 2B illustrates an alternative mode of the array imaging module and its circuit board assembly according to the above first preferred embodiment of the present invention.

According to the preferred embodiment, the driver 30 of the array imaging module is sealed and is electrically connected via the above motor connecting units 2203 and their alternatives. For example, the driver 30 can be electrically connected as shown in FIGS. 5A, 5B, and 5C, via the first terminal slot 22032 and second connecting wire 22033, the second terminal slot 22034, and the circuit terminal 22035. In one embodiment, as shown in FIG. 2A, the driver 30 is electrically connected to the circuit board assembly 220 via the welding process. It is appreciated that the electrical connection between the driver 30 and the circuit board assembly 220 should not be limited.

Figure 7:
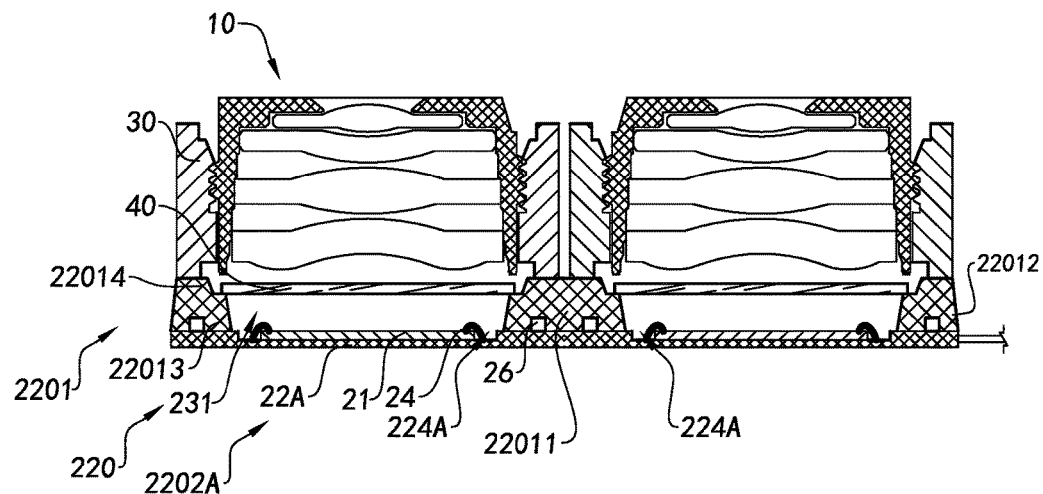
FIG. 7 is a sectional view of an array imaging module and its circuit board assembly according to a second preferred embodiment of the present invention.

As shown in FIG. 7, an array imaging module and its circuit board assembly 220 according to a second embodiment of the present invention is illustrated. Unlike the above first embodiment, the circuit board assembly 220 comprises a circuit board 22A, wherein the circuit board 22A has two inner indention grooves 224A. The two photosensitive units 21 are received at the inner indention grooves 224A respectively. In other words, since the photosensitive units 21 are received in the inner indention grooves 224A, the photosensitive units 21 will not protruded out of top side of the circuit board 22A, such that the height of the mold sealer 2201 to seal the photosensitive units 21 will be substantially reduced. Therefore, the height restriction of the mold sealer 2201 will be reduced to seal the photosensitive units 21 so as to minimize the height of the mold sealer 2201.

Furthermore, the photosensitive unit 21 is electrically connected to the circuit board 22 via the lead wire 24. The lead wire 24 can be, but limited to, a gold wire, copper wire, aluminum wire, or sliver wire. In particular, the photosensitive unit 21 and the lead wire 24 are embedded in the inner indention groove 224A of the circuit boar 22A. In one embodiment, during the manufacturing process of the circuit board assembly 220, the inner indention groove 224A is initially pre-formed at the circuit board 22A. In other words, the inner indention groove 224A can be pre-formed at the conventional circuit board in order to receive and couple to the photosensitive unit 21.

Figure 8:
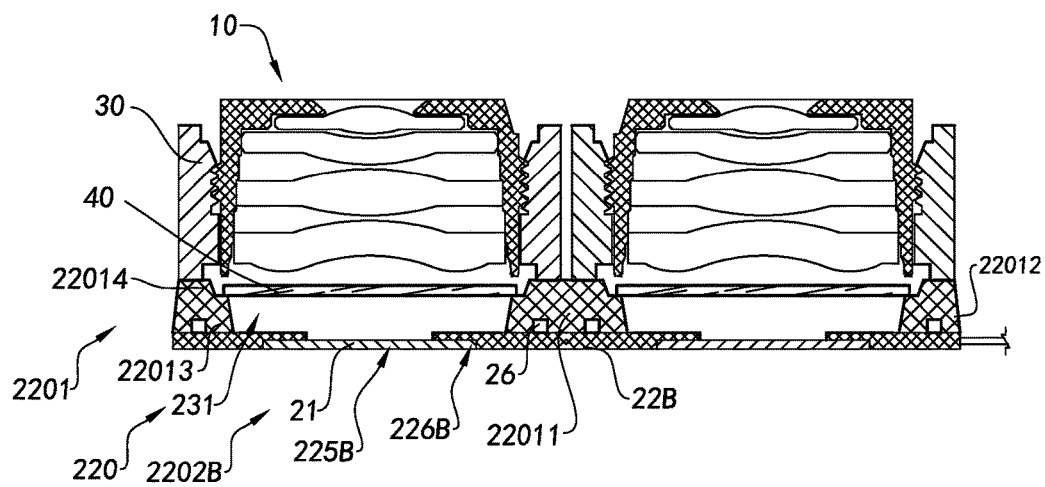
FIG. 8 is a sectional view of an array imaging module and its circuit board assembly according to a third preferred embodiment of the present invention.

As shown in FIG. 8, an array imaging module and its circuit board assembly 220 according to a third embodiment of the present invention is illustrated.

Unlike the above embodiment, the circuit board assembly 220 comprises a circuit board 22B, wherein the circuit board 22B has two conductive channels 225B spacedly formed at a bottom side of the photosensitive unit 21 to electrically connect to the circuit board 22B at two lateral sides thereof. The photosensitive unit 21 is coupled at a rear side of the circuit board 22B, wherein the photosensitive area of the photosensitive unit 21 faces upward to receive the light emitting through the optical lens 10.

In addition, the circuit board 22B comprises two outer indention grooves 226B corresponding to the conductive channels 225B respectively, wherein the two indention grooves 226B serve as a positioning guider for the photosensitive unit 21. In particular, when the photosensitive unit 21 is coupled at the outer indention grooves 226B, the outer side of the photosensitive unit 21 is aligned and coincided with the outer side of the circuit board 22B, such that the outer side of the photosensitive unit 21 and the outer side of the circuit board 22B are aligned at the same planar direction so as to ensure the surface flatness of the circuit board assembly 220.

Accordingly, the conductive channels 225B are embedded as a platform to stably support the photosensitive unit 21 when the photosensitive unit 21 is coupled at the circuit board 22B, so as to expose the photosensitive area of the photosensitive unit 21.

It is worth mentioning that the present invention further provides an assembling method of the chip, which is a Flip Chip (FC) method. According to the preferred, the photosensitive unit 21 is coupled at the rear side of the circuit board 22B, wherein the photosensitive unit is coupled at the front side of the circuit board in the conventional process. In other words, the circuit board 22B is located above the photosensitive unit 21 and the photosensitive area of the photosensitive unit 21 is facing upward when the photosensitive unit 21 is coupled at the rear side of the circuit board 22B. Through this structural and assembling configuration, the photosensitive unit 21 and the mold sealer 2201 are correspondingly independent, such that the photosensitive unit 21 will not be affect when assembling the photosensitive unit 21 and when forming the mold sealer 2201 by the molding process. In addition, the photosensitive unit 21 is embedded in the outer lateral side of the circuit board 22B to prevent the photosensitive unit 21 from being protruded from the inner lateral side of the circuit board 22B, such that a relatively space is reserved at the inner lateral side of the circuit board 22B. As a result, the height of the mold sealer 2201 will not be limited by the height of the photosensitive unit 21, such that the height of the mold sealer 2201 can be further reduced.

It is worth mentioning that the light filter 40 is coupled at the top side of the conductive channels 225B. Therefore, the light filter 40 does not need to couple to the mold sealer 2201 so as to reduce the rear focal length of the array imaging module which will reduce the height thereof. In particular, the light filter 40 can be the infrared cut-off filter (IRCF).

Figure 9:
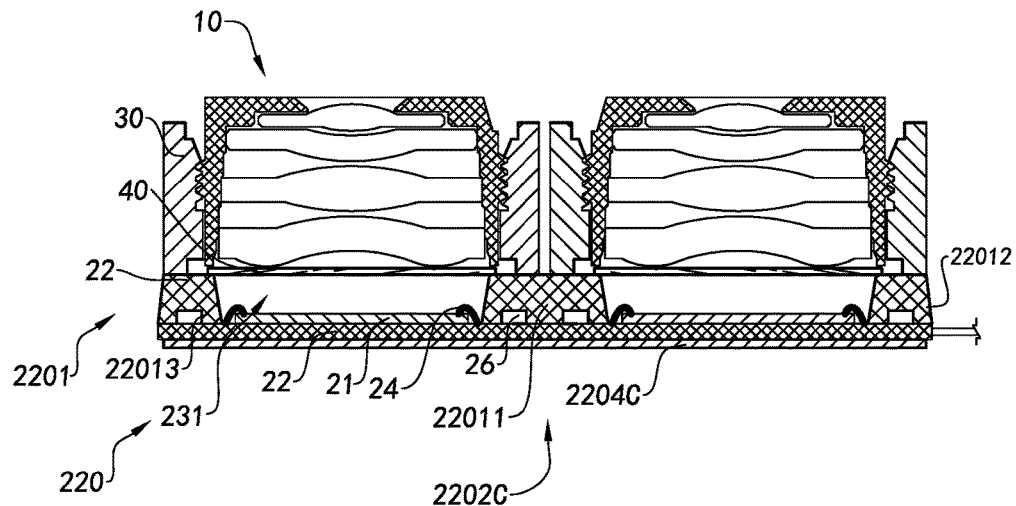
FIG. 9 is a sectional view of an array imaging module and its circuit board assembly according to a fourth preferred embodiment of the present invention.

As shown in FIG. 9, an array imaging module and its circuit board assembly 220 according to a fourth embodiment of the present invention is illustrated.

The circuit board assembly 220 comprises a reinforcing layer 2204C overlapped and connected to the circuit board 22 to reinforce the strength of the circuit board 22. In other words, the reinforcing layer 2204C is formed at a bottom side of the circuit board 22 corresponding to the area where the photosensitive unit 21 is located. Therefore, the circuit board 22 can be rigidly support the mold sealer 2201 and the photosensitive unit 21.

In addition, the reinforcing layer 2204C can be metal layer overlapped and connected to the bottom side of the circuit board 22 to enhance the rigidity of the circuit board 22. The reinforcing layer 2204C also has heat dissipating ability that the reinforcing layer 2204C can effectively dissipate heat generated from the photosensitive unit 21.

It is worth mentioning that the circuit board 22 can be a Flex Print Circuit (FPC). Through the rigidities of the reinforcing layer 2204C and the circuit board 22, the flex print circuit, having a bendable ability, can fulfill the supportive ability of the circuit board assembly 220. Accordingly, the circuit board 22 can be the Print Circuit Board (PCB), the FPC, or FPC (Rigid-Flex PCB). In other words, the reinforcing layer 2204C can substantially increase the strength of the circuit board 22 and effectively enhance the heat dissipation, so as to reduce the thickness of the circuit board 22. Therefore, the height of the circuit board assembly will be substantially reduced to minimize the height of the array imaging module.

Figure 10:
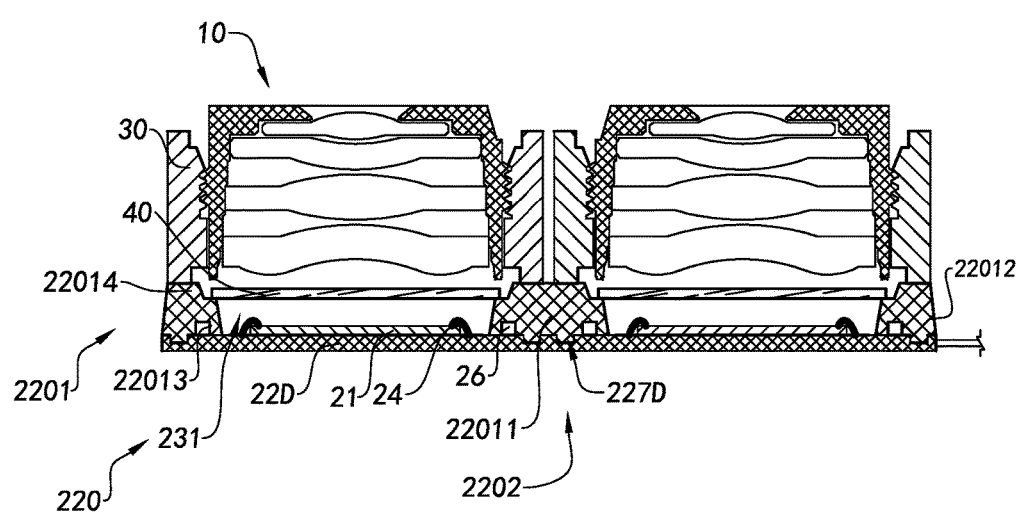
FIG. 10 is a sectional view of an array imaging module and its circuit board assembly according to a fifth preferred embodiment of the present invention.

As shown in FIG. 10, an array imaging module and its circuit board assembly 220 according to a fifth embodiment of the present invention is illustrated.

Unlike the above embodiments, the circuit board 22D has a least a reinforcing slot 227D, wherein the mold sealer 2201 is extended into the reinforcing slot 227D to enhance the strength of the circuit board 22D.

The positions of each of the reinforcing slots 227D can be selectively modified according to the rigidity of the circuit board 22D. Preferably, the reinforcing slots 227D are symmetrically formed on the circuit board 22D. Accordingly, the rigidity of the circuit board 22D can be enhanced by the reinforcing slot 227D to reduce the thickness of the circuit board 22D, so as to reduce the thickness of the array imaging module and to enhance the heat dissipation of the circuit board assembly 220.

It is worth mentioning that the reinforcing slot 227D is embodied as an indention cavity, wherein the reinforcing slot 227D is not a through slot, such that when the reinforcing slot 227D is formed on the circuit board 22D, the reinforcing slot 22D will not extended through the circuit board 22D. Therefore, the mold sealer 2201 will not be extended through the circuit board 22D and will not be leaked from the reinforcing slot 227D.

Figure 11:
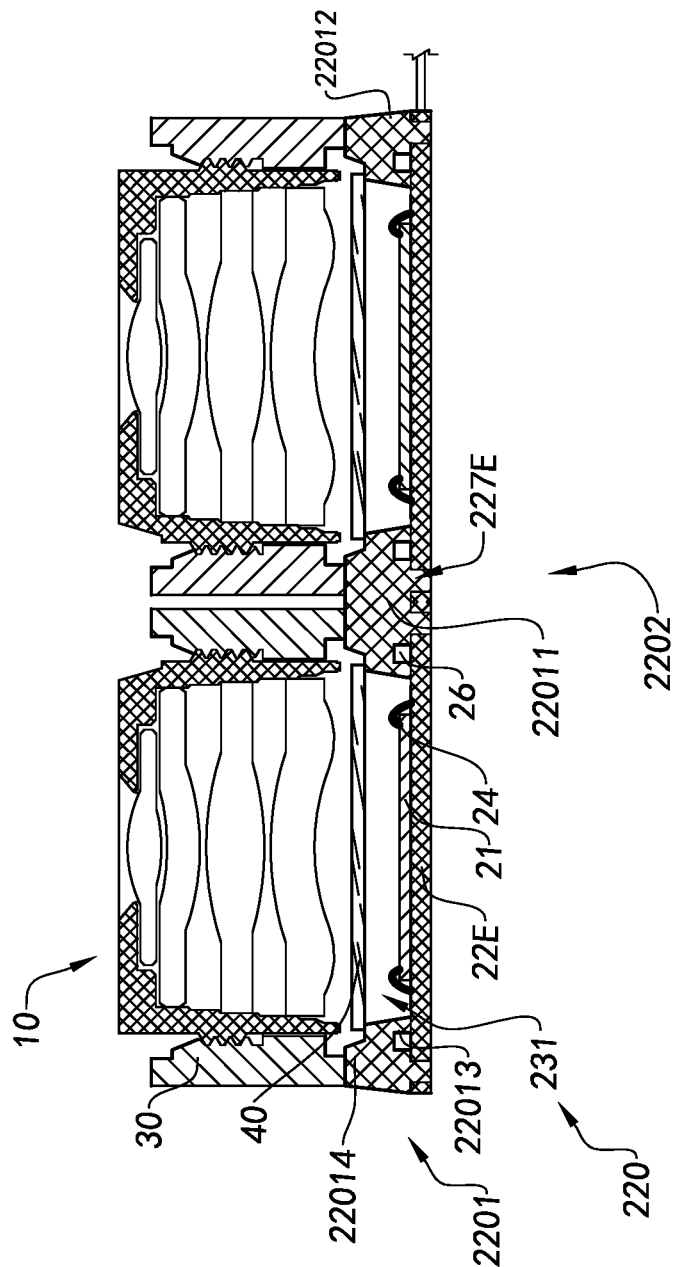
FIG. 11 is a sectional view of an array imaging module and its circuit board assembly according to a sixth preferred embodiment of the present invention.

As shown in FIG. 11, an array imaging module and its circuit board assembly 220 according to a sixth embodiment of the present invention is illustrated.

Unlike the above embodiments, the circuit board 22E has a least a reinforcing slot 227E, wherein the mold sealer 2201 is extended into the reinforcing slot 227E to enhance the strength of the circuit board 22E.

The positions of each of the reinforcing slots 227E can be selectively modified according to the rigidity of the circuit board 22E. Preferably, the reinforcing slots 227E are symmetrically formed on the circuit board 22E. Accordingly, the rigidity of the circuit board 22E can be enhanced by the reinforcing slot 227E to reduce the thickness of the circuit board 22E, so as to reduce the thickness of the array imaging module and to enhance the heat dissipation of the circuit board assembly 220.

It is worth mentioning that the reinforcing slot 227E is a through slot, such that when the reinforcing slot 227E is formed on the circuit board 22E, the reinforcing slot 22E will extended through the circuit board 22E. The two opposite sides of the circuit board 22E will communicate with each other through the reinforcing slot 227E. Therefore, the mold sealer 2201 will be extended through the circuit board 22E to integrally form with the circuit board 22E so as to combine the mold sealer 2201 with the circuit board 22E with a composite material structure. In addition, the reinforcing slot 227E as the through slot can be easily formed on the circuit board 22E.

Figure 12:
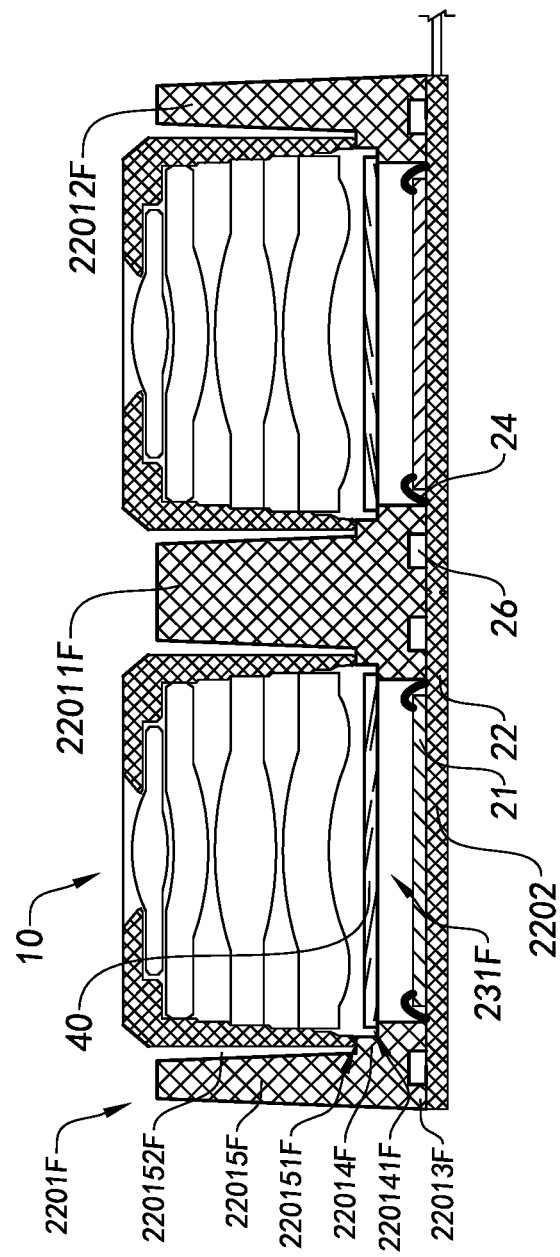
FIG. 12 is a sectional view of an array imaging module and its circuit board assembly according to a seventh preferred embodiment of the present invention.

As shown in FIG. 12, an array imaging module and its circuit board assembly 220 according to a seventh embodiment of the present invention is illustrated.

Unlike the above embodiments, the mold sealer 2201F has a least an enclosing portion 22013F, a light filter mounting portion 22014F, and a lens mounting portion 22015F. The light filter mounting portion 22014F and the lens mounting portion 22015F are integrally formed with the enclosing portion 22013F in a sequent manner during the molding process, such that the light filter mounting portion 22014F is integrally formed between the enclosing portion 22013F and the lens mounting portion 22015F. The enclosing portion 22013F is molded and formed to couple with the circuit board 22 and to enclose the electronic element 26 and the lead wire 24. The light filter mounting portion 22014F is molded and formed to couple with the light filter 40. In other words, during the manufacturing process of the circuit board assembly 220 for the array imaging module, the light filter 40 is mounted and supported at the light filter mounting portion 22014F, such that the light filter 40 is automatically retained along the optical path of the photosensitive unit 21 without incorporating any conventional supporting frame. Therefore, the light filter mounting portion 22014F has a supportive ability. Due to the molding process, the top side of the light filter mounting portion 22014F can be made to have a flat surface to evenly support the light filter 40, which is superior than the conventional camera module. The lens mounting portion 22015F is coupled to the optical lens 10. In other words, during the manufacturing process of the circuit board assembly 220 for the array imaging module, the optical lens 10 can be mounted and supported at the inner side of the lens mounting portion 22015F, so as to stably retain the optical lens 10 in position.

Furthermore, the light filter mounting portion 22014F has two mounting slots 220141F located corresponding to the optical window 231F, wherein the light filter 40 has enough space to be stably coupled at the mounting slots 220141F. The lens mounting portion 22015F has two lens mounting slots 220151F located corresponding to the optical window 231F, wherein the optical lens 10 has enough space to be stably coupled at the lens mounting slots 220151F.

In other words, the light filter mounting portion 22014F and the lens mounting portion 22015F integrally and upwardly extended to form a step-like platform to spacedly support the light filter 40 and the optical lens 10 in position without any additional supporting frame as in the conventional camera module.

The lens mounting portion 22015F further has two lens inner walls 220152F, wherein each of the lens inner walls 220152F has a closed annular shape, such that a lens edge gap is formed between the lens inner walls 220152F. It is worth mentioning that each of the lens inner walls 220152F is a flat surface to couple with the optical lens 10 without any threaded structure, so as to form the fixed focus lens module. It is worth mentioning that the optical lens 10 can be coupled at the lens mounting portion 22015F by adhesive.

Figure 13A:
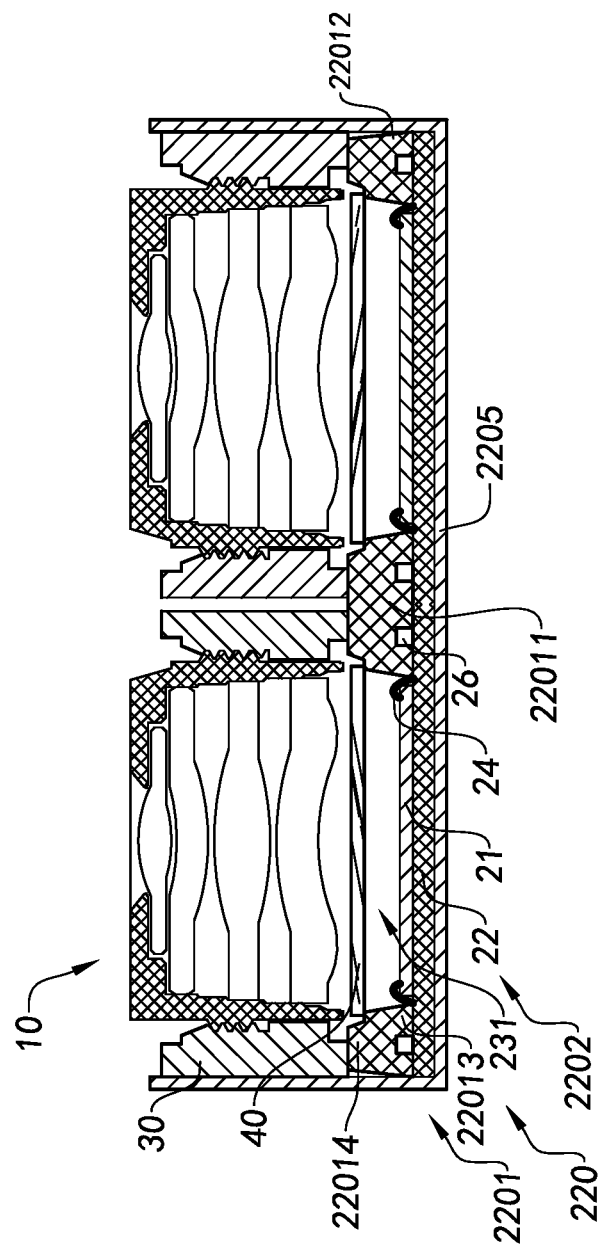
FIG. 13A is a sectional view of an array imaging module and its circuit board assembly according to an eighth preferred embodiment of the present invention.

As shown in FIG. 13A, an array imaging module and its circuit board assembly 220 according to an eighth embodiment of the present invention is illustrated. Unlike the above embodiments, the circuit board assembly 220 further comprises a shielding layer 2205 that encloses the circuit board 22 and the mold sealer 2201 to enhance the strength of the circuit board 22 and to prevent any electromagnetic interference of the circuit board assembly 220.

Figure 13B:
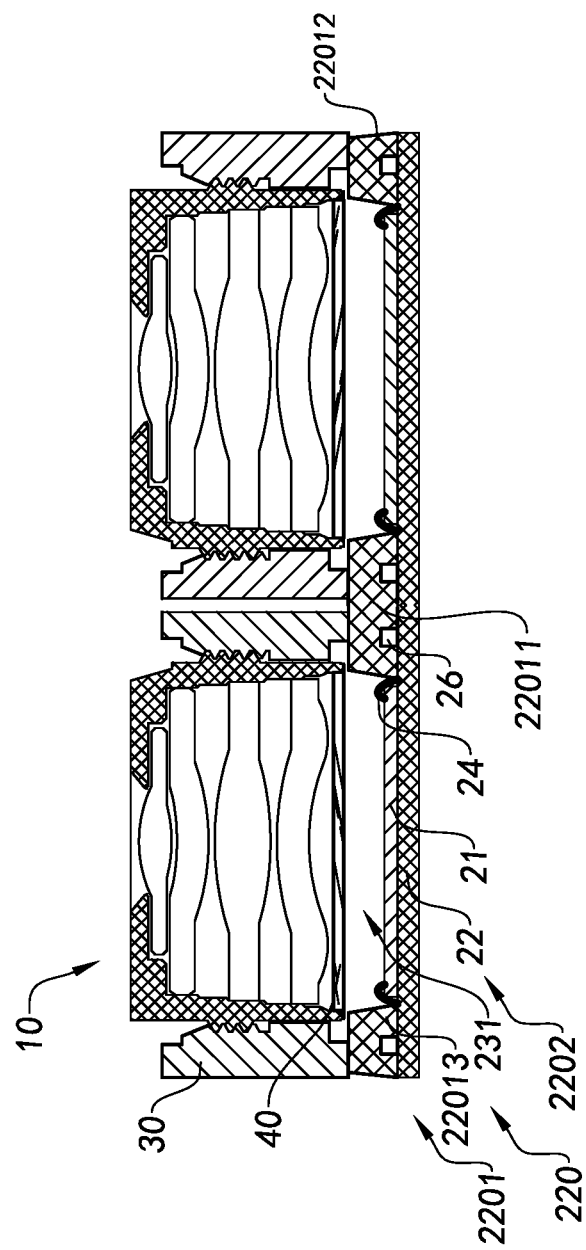
FIG. 13B is a sectional view of an array imaging module and its circuit board assembly according to a ninth preferred embodiment of the present invention.

As shown in FIG. 13B, an array imaging module and its circuit board assembly 220 according to a ninth embodiment of the present invention is illustrated. Unlike the above embodiments, the light filter 40 does not mounted at a molding base 23 but is coupled to the optical lens 10 to ensure the optical lens 10 to be aligned along the optical path of the photosensitive unit 21 and to ensure the light filter 40 to be stably supported between the photosensitive unit 21 and the optical lens 10. In other words, during the manufacturing process of the circuit board assembly 220 for the array imaging module, the light filter 40 is initially coupled to the optical lens 10 and then the optical lens 10 is retained along the optical path of the photosensitive unit 21.

It is worth mentioning that there is one optical lens 10 and one light filter 40 as shown in FIG. 13B. It is appreciated that two or more light filters 40 can be stacked and coupled to the optical lens 10 or two or more optical lenses 10 can be stacked and couple to the light filter 40.

Figure 14:
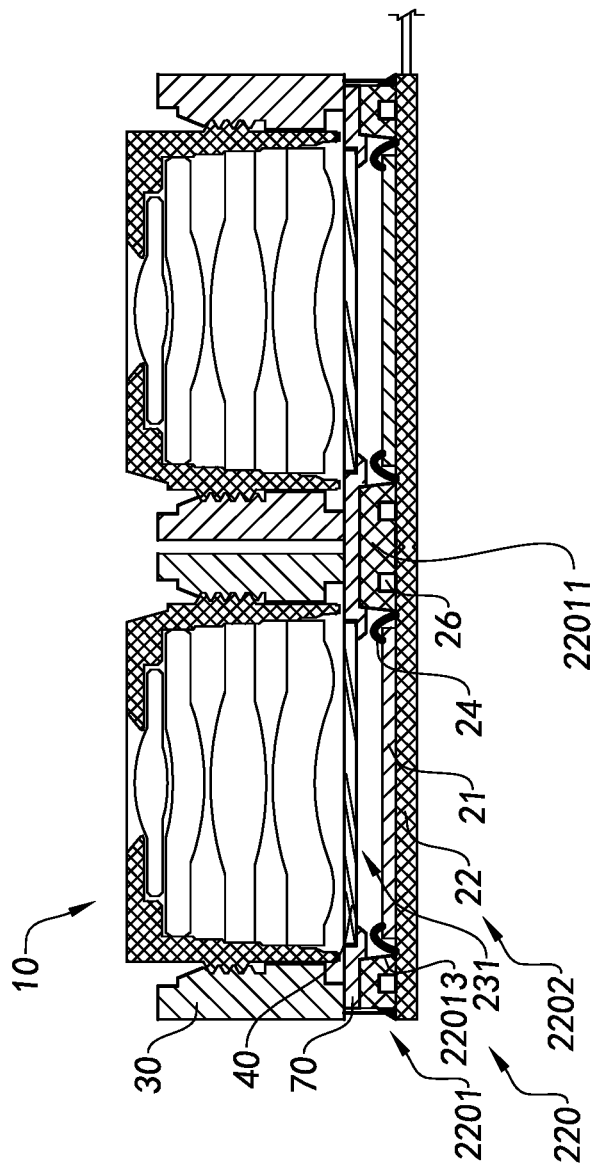
FIG. 14 is a sectional view of an array imaging module and its circuit board assembly according to a tenth preferred embodiment of the present invention.

As shown in FIG. 14, an array imaging module and its circuit board assembly 220 according to a tenth embodiment of the present invention is illustrated. Unlike the above embodiments, the array imaging module further comprises a supporter 70 to support the light filter 40, the optical lens 10, and/or the driver 30. Accordingly, the supporter 70 is coupled at the mold sealer 2201, wherein the light filter 40 is supported by the supporter 70, the optical lens 10 is supported by the supporter 70, and the driver 30 is supported by the supporter 70. The shape of the supporter 70 can be selectively modified. For example, the supporter 70 forms a protruding platform for supporting the light filter 40. The supporter 70 can be a multiple supporter to support two or more light filters 40 at the same time. Likewise, the supporter 70 can be a single supporter to support one single light filter 40. According to the preferred embodiment, the supporter 70 is the multiple supporter. It is appreciated that the shape of the supporter 70 should not be limited in the present invention.

FIGS. 15A to 15H illustrate another alternative mode of the assembling process of the present invention, wherein the array imaging module comprises at least two optical lenses 10' and a molded photosensitive assembly 20'. The molded photosensitive unit 20' comprises at least two photosensitive units 21', a circuit board 22', a molded base 23', and at least two sets of lead wire 24'. It is worth mentioning that the mold sealer 2201 as shown in FIGS. 2A to 14 is embodied as the molded base 23' in this embodiment.

Each of the photosensitive units 21' comprises a chip connector 211', a photosensitive area 212', and a non-photosensitive area 213', wherein the photosensitive area 212' and the non-photosensitive area 213' are integrally defined at the same side of the photosensitive units 21'. In particular, the photosensitive area 212' are defined within or surrounded by the non-photosensitive area 213'. In other words, the photosensitive area 212' is defined at a center of the non-photosensitive area 213', wherein the non-photosensitive area 213' encircles around the photosensitive area 212'. The chip connector 211' is located at the non-photosensitive area 213'.

Correspondingly, the circuit board 22' comprises at least two sets of circuit connectors 221', at least two chip coupling areas 222', and a peripheral area 223', wherein the chip coupling areas 222' and the peripheral area 223' are integrally formed at a position that peripheral area 223' is defined at a periphery of each of the chip coupling areas 222'. The circuit connectors 221' are located at the peripheral area 223'.

Each of the lead wires 24' has a chip connecting terminal 241' and a circuit board connecting terminal 242', wherein the lead wire 24' has a curved configuration between the chip connecting terminal 241' and the circuit board connecting terminal 242'.

The photosensitive units 21' are coupled at the chip coupling areas 222' of the circuit board 22' respectively, wherein the chip connecting terminal 241' of the lead wire 24 is electrically connected to the chip connector 211' of the photosensitive units 21'. The circuit board connecting terminal 242' of the lead wire 24' is electrically connected to the circuit connector 221' of the circuit board 22'. The molded base 23' is integrally coupled at the peripheral area 223' of the circuit board 22' to form the molded photosensitive assembly 20'. The optical lenses 10' are coupled at the molded photosensitive assembly 20' along the optical paths of the photosensitive units 21' respectively. When the light is reflected from the object and passes through the optical lenses 10', the light will enter into the interior of the array imaging module to the photosensitive areas 212' of the photosensitive units 21'. Then, the photosensitive units 21' will convert the light signal into the electric signal for obtaining the image of the object through the photoelectric conversion process.

In one embodiment, each of the chip connector 221' of the photosensitive units 21' and the circuit connector 221' of the circuit board 22' can be a connecting tray. In other words, each of the chip connector 221' of the photosensitive units 21' and the circuit connector 221' of the circuit board 22' has a tray configuration. Therefore, the chip connecting terminal 241' of the lead wire 24 can be easily connected to the chip connector 211' of the photosensitive units 21'. The circuit board connecting terminal 242' of the lead wire 24' can be easily connected to the circuit connector 221' of the circuit board 22'. In another embodiment, each of the chip connector 221' of the photosensitive units 21' and the circuit connector 221' of the circuit board 22' has a spherical shape, such as applying a paste or other welding materials as a connection point at each of the non-photosensitive area 213' of the photosensitive units 21' and the peripheral area 223' of the circuit board 22' in order to form each of the chip connector 221' of the photosensitive units 21' and the circuit connector 221' of the circuit board 22'. It is appreciated that the above examples are illustrative only that each of the chip connector 221' of the photosensitive units 21' and the circuit connector 221' of the circuit board 22' can be formed by different ways.

The non-photosensitive area 213' of the photosensitive units 21' has a chip inner lateral side 2131', a chip connecting portion 2132', and a chip outer lateral side 2133'. The chip connector 211' is located at the chip connecting portion 2132'. The chip inner lateral side 2131' is extended and encircled around the photosensitive area 212'. Two lateral sides of the chip connecting portion 2132' is extended to the chip inner lateral side 2131' and the chip outer lateral side 2133' respectively. In other words, the chip inner lateral side 2131' is defined between the non-photosensitive area 213' where of the chip connector 211' is located and the edge of the photosensitive area 212'. The chip connecting portion 2132' is defined at the non-photosensitive area 213' where of the chip connector 211' is located. The chip outer lateral side 2133' is defined between the non-photosensitive area 213' where of the chip connector 211' is located and an outer edge of the photosensitive units 21'. In other words, at the top view of the photosensitive units 21', the photosensitive area 212', the chip inner lateral side 2131', a chip connecting portion 2132', and a chip outer lateral side 2133' are formed in sequence from an inner side of the photosensitive units 21' to an outer side thereof.

Correspondingly, the peripheral portion 223' of the circuit board 22' has a circuit board inner lateral side 2231', a circuit board connecting portion 2232', and a circuit board outer lateral side 2233'. The circuit connector 221' is coupled at the circuit board connecting portion 2232'.

The circuit board inner lateral side 2231' is extended and encircled around the chip coupling area 222'. Two lateral sides of the circuit board connecting portion 2232' is extended to the circuit board inner lateral side 2231' and the circuit board outer lateral side 2233' respectively. In other words, the circuit board inner lateral side 2231' is defined between the peripheral area 223' where of the circuit connector 221' is located and the edge of the chip coupling area 222'. The circuit board connecting portion 2232' is defined at peripheral area 223' where of the circuit connector 221' is located. The circuit board outer lateral side 2233' is defined between the peripheral area 223' where of the circuit connector 221' is located and an outer edge of the circuit board 22'. It is worth mentioning that the circuit board 22' is a one piece integrated body. Preferably, the chip coupling areas 222' are symmetrically formed at two side ends of the circuit board 22', such that the circuit board 22' has a symmetrical configuration and structure.

In addition, the material of the lead wire 24' should not be limited in the present invention. For example, the lead wire 24' can be a gold wire, such that the photosensitive units 21' can be electrically connected to the circuit board 22' via the gold wire. In addition, the photosensitive area 212' of the photosensitive units 21' is able to convert light signal into electric signal, wherein the electric signal can transmit to the circuit board 22' via the lead wire 24'. Accordingly, the lead wire 24' can be a sliver wire, copper wire, or the like in order to transmit the electric signal from the photosensitive units 21' to the circuit board 22'.

The array imaging module of the present invention can be a fixed-focus camera module, an auto-focus camera module, or zoom camera module. For example, the array camera module can have the autofocus and optical zoom ability under the controlled height restriction, so as to improve the imaging quality of the array imaging module.

In particular, as shown in FIGS. 15A to 15H, the array imaging module further comprises at least two drivers 30', wherein the drivers 30' are operatively coupled to the optical lenses 10' respectively. Each of the drivers 30' is supported and coupled at the molded base 23' at the top side thereof to retain the optical lenses 10' at the photosensitive paths of the photosensitive units 21' of the molded photosensitive assembly 20' respectively. Each of the drivers 30' is electrically coupled to the circuit board 22', wherein after the circuit board 22' transmits the electric signal to each of the drivers 30', each of the drivers 30' will drive the corresponding optical lens 10' to move along the optical path of the corresponding photosensitive unit 21' for adjusting the focal point of the array imaging module. In other words, the optical lenses 10' are driven to move by the drivers 30' respectively.

It is worth mentioning that the driver 30' can be modified or selected in different types without any limitation of the array imaging module of the present invention. For example, the driver 30' can be a voice coil motor for driving the optical lens 10' along the optical path of the photosensitive unit 21', wherein the driver 30' is able to receive the electric signal and control signal for operation.

As shown in FIGS. 15A to 15H, the array imaging module further comprises at least a light filter 40'. In one embodiment, the present invention comprises at least a lighter filter 40', wherein the light filter 40' is coupled at the top side of the molded base 23', such that the light filter 40' can be located at different positions corresponding to the optical path of the photosensitive unit 21'. In another embodiment, the array imaging module further comprises two or more light filters 40', wherein the light filters 40' are coupled at the top side of the molded base 23', such that the light filters 40' can be located corresponding to the optical paths of the photosensitive units 21'. In other words, the photosensitive units 21', the light filters 40', and the optical lenses 10' are coupled respectively.

During the operation of the array imaging module, the light is reflected by the object and is guided to pass through the optical lens 10' into the interior of the array imaging module. Then, the light will pass through the light filter 40' to the photosensitive unit 21', such that the photosensitive unit 21' will receive the reflected light along the optical path for photoelectric conversion. Accordingly, the light filter 40' is arranged for filtering stray light, such as the infrared light portion, in the light from the optical lens 10' for improving the imaging quality of the array imaging module.

In addition, the light filter 40' is directly coupled at the top side of the molded base 23'. Alternatively, the light filter 40' can be coupled at a supporter which is coupled at the top side of the molded base 23', such that the light filter 40' is coupled at the top side of the molded base 23' via the supporter. Therefore, the size of the light filter 40' can be reduced to reduce the manufacturing cost of the array imaging module.

According to the present invention, the light filter 40' can be formed in different types for different implements of the array imaging module. For example, the light filter 40' can be an infrared cut-off filter, a full transmissible spectral filter, other filters, or two or more different light filters 40'. For example, the infrared cut filter and the full transmissible spectral filter can form a combination of light filtering unit, such that the infrared cut filter and the full transmissible spectral filter can be selectively switched to locate along the optical path of the photosensitive unit 21'. For example, the infrared cut filter is selectively switched to locate along the optical path of the photosensitive unit 21' when the array imaging module is operated under the day light environment in which the environmental light is sufficient. Therefore, the infrared light portion of the light will be filtered by the infrared cut filter when entering into the interior of the array imaging module. Likewise, the full transmissible spectral filter is selectively switched to locate along the optical path of the photosensitive unit 21' when the array imaging module is operated under the dark environment in which the environmental light is insufficient. Therefore, the infrared light portion of the light will not be filtered by the infrared cut filter when entering into the interior of the array imaging module.

Figure 15A:
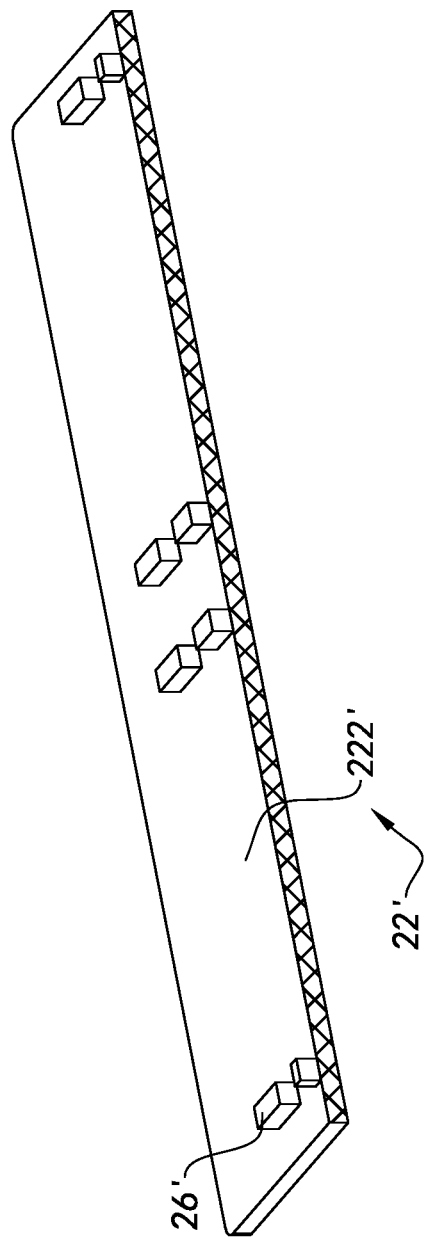
FIG. 15A illustrates a first step of the manufacturing process of the alternative array imaging module according to a preferred embodiment of the present invention.

During the manufacturing process of the array imaging module, as shown in FIG. 15A, at least one set of the electronic elements 26' of the molded photosensitive assembly 20' is treated by Surface Mount Technology (SMT) to electrically couple at the peripheral portion 223' of the circuit board 22'. In particular, each of the electronic elements 26' is electrically coupled at the peripheral portion 223' of the circuit board 22' at the circuit board outer lateral side 2233' thereof. It is worth mentioning that the one or more electronic elements 26' can also be electrically coupled at the center portion of the circuit board 22' according to the need of the electronic elements 26'. In particular, none of the electronic element 26' is electrically coupled at the chip coupling area 222' of the circuit board 22'.

Figure 15B:
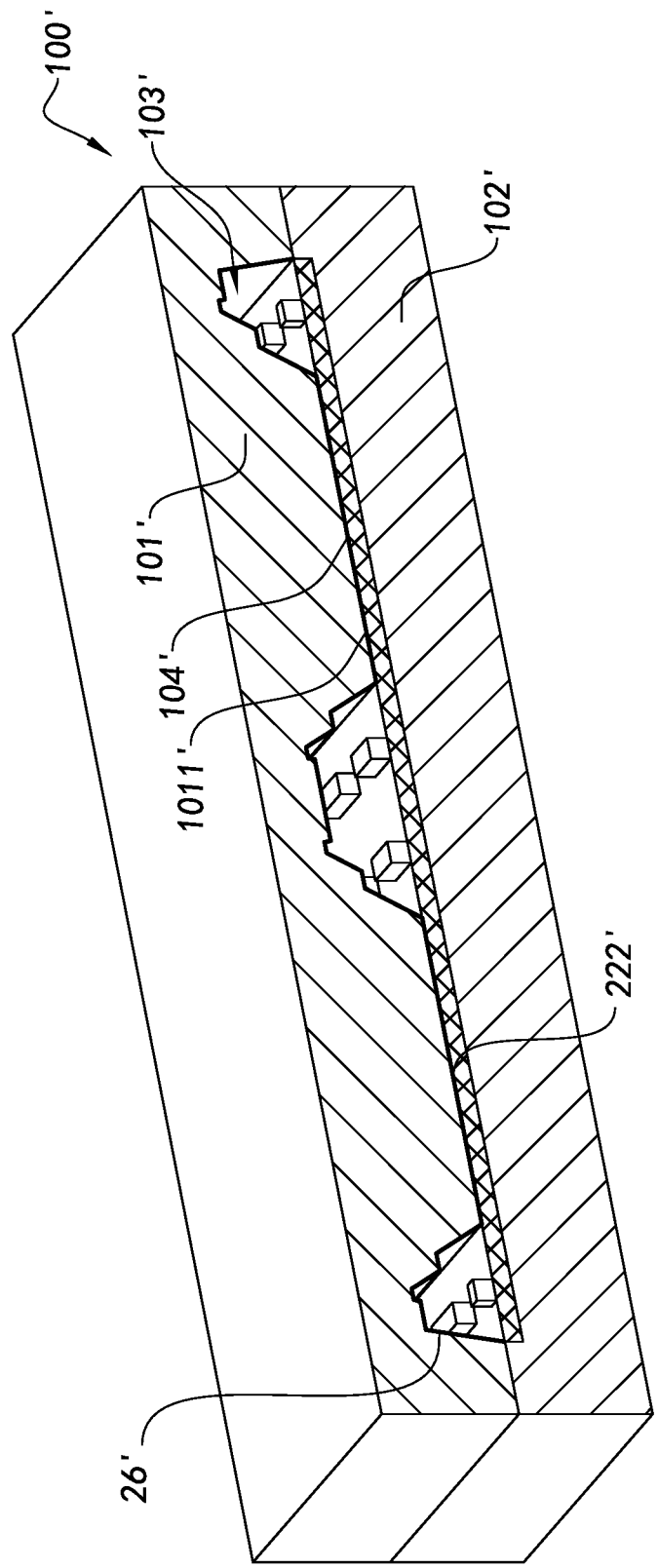
FIG. 15B illustrates a second step of the manufacturing process of the alternative array imaging module according to the above preferred embodiment of the present invention.

As shown in FIG. 15B, the electronic element 226' at the circuit board 22' is disposed in a mold 100', wherein the molded base 23' is formed in the mold 100' by means of the molding technology. In particular, the mold 100' comprises an upper mold body 101' and a lower mold body 102', wherein at least one of the upper mold body 101' and the lower mold body 102' is movable and operable for mold closing and drafting in a controlling manner. When the upper mold body 101' and the lower mold body 102' are coupled with each other to form a close mold, a mold cavity 103' is formed therewithin, wherein the peripheral portion 223' of the circuit board 22' and the center portion of the circuit board 22' are correspondingly disposed in the mold cavity 103'. Preferably, the electronic elements 226' provided on the circuit board 22' are generally disposed in the mold cavity 103'.

Figure 15C:
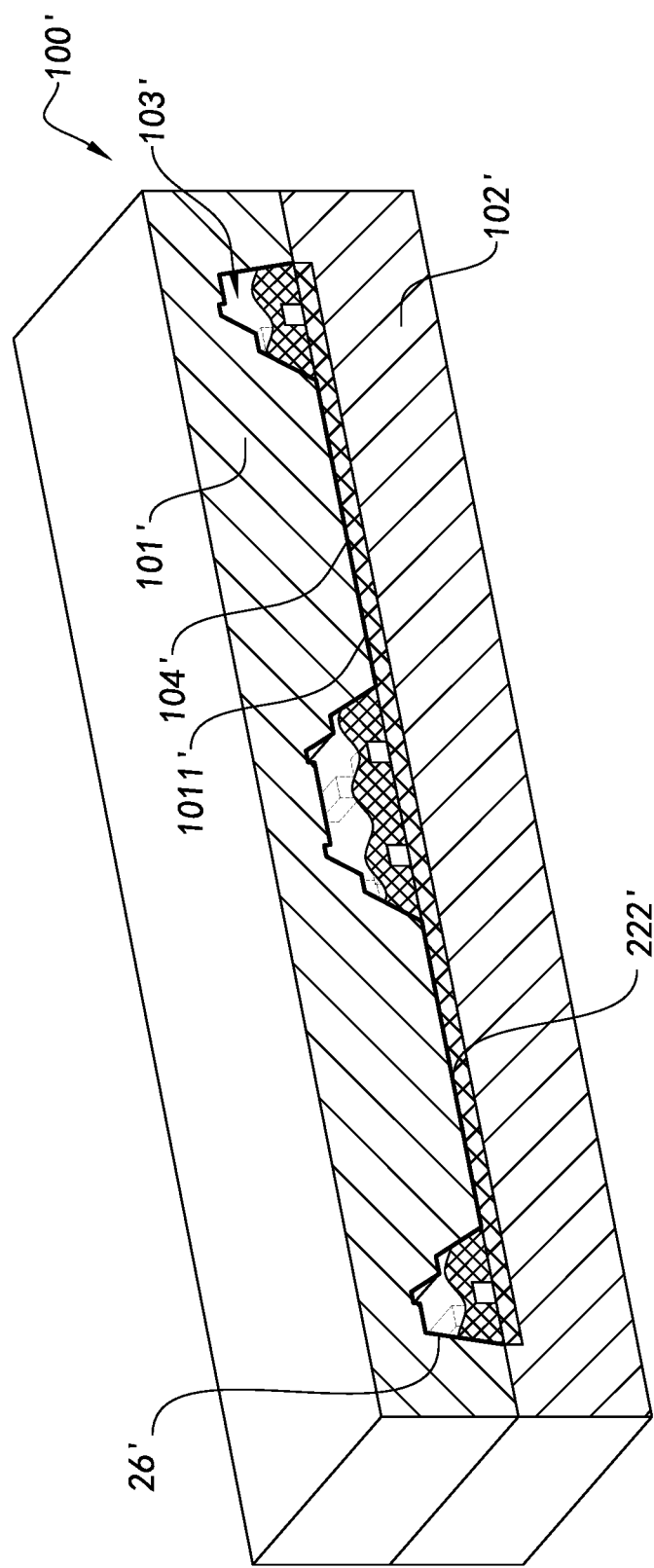
FIG. 15C illustrates a third step of the manufacturing process of the alternative array imaging module according to the above preferred embodiment of the present invention.
Figure 15D:
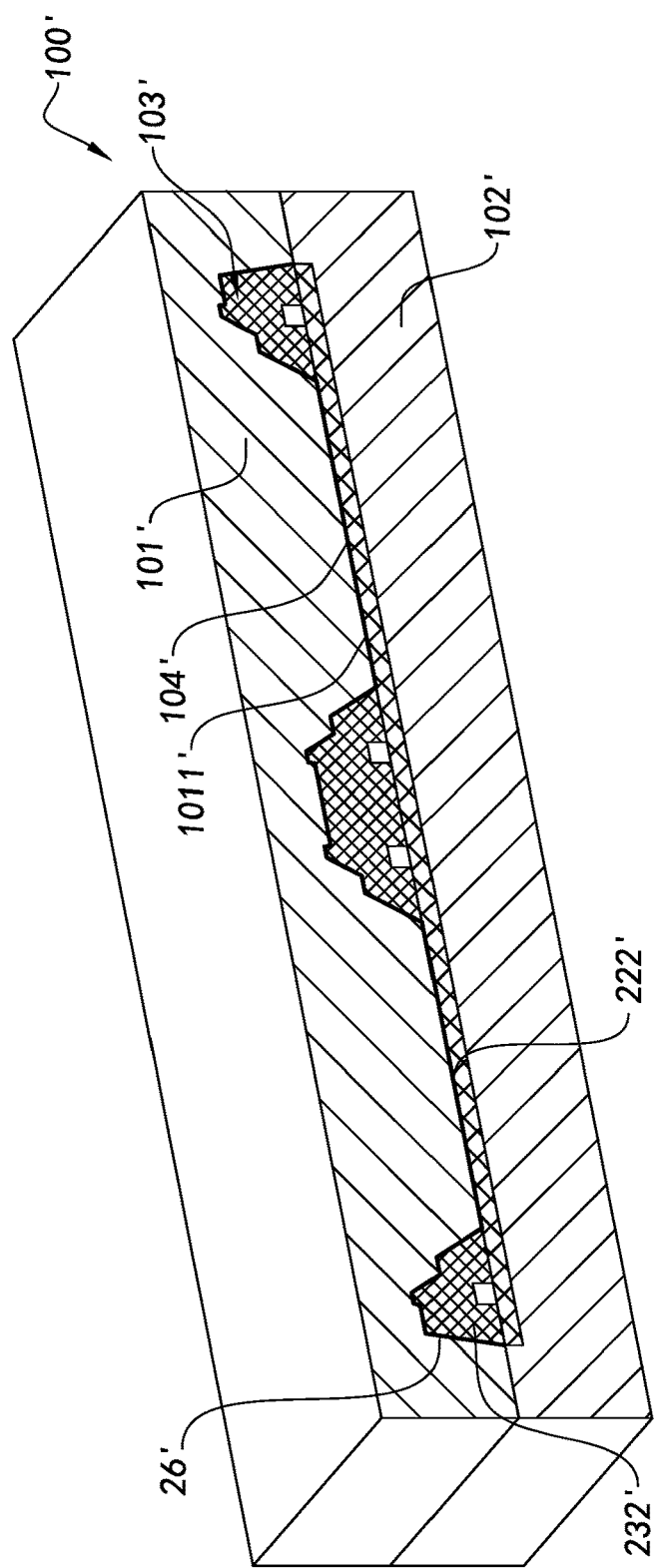
FIG. 15D illustrates a fourth step of the manufacturing process of the alternative array imaging module according to the above preferred embodiment of the present invention.

Referring to FIG. 15C, a mold material is heated to fluid state and introduced or injected in the mold cavity 103' to fill the mold cavity 103' and enclose each of the electronic elements 26', so that when the mold material is solidified in the mold cavity 103', the molded base 23' integrated with the circuit board 22' and the electronic elements 26' is formed. Referring to FIG. 15D, the molded base 23' not only encloses each of the electronic elements 26' to prevent each of the electronic elements 26' from exposing and contacting with air outside, but also isolate the electronic elements 26' with each other to prevent the mutual interference by the adjacent electronic elements 26'. Accordingly, it is appreciated that the distance between every two adjacent electronic elements 26' can be reduced, such that more electronic elements 26' can be electrically coupled at the circuit board 22' with a limited installing area, so as to improve the imaging quality of the array imaging module.

Figure 15E:
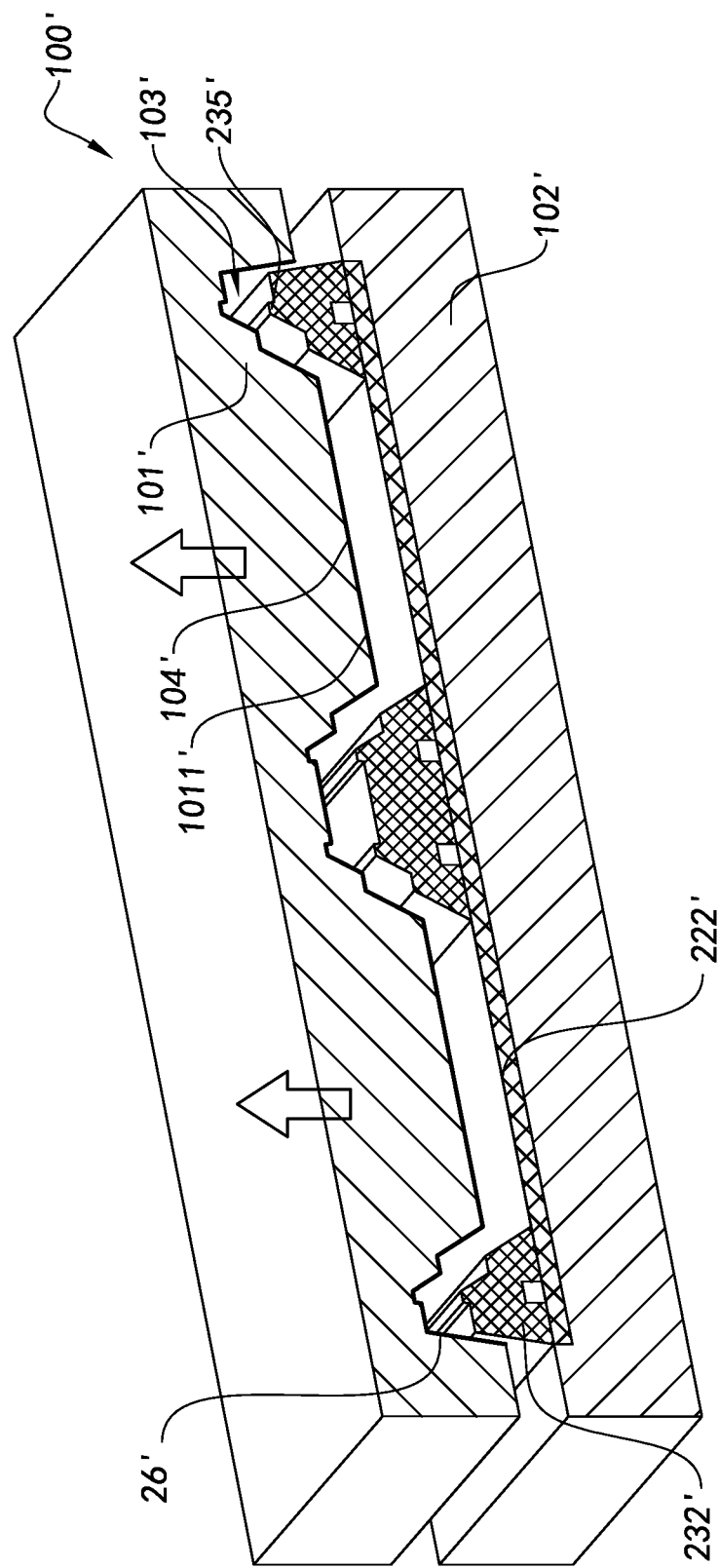
FIG. 15E illustrates a fifth step of the manufacturing process of the alternative array imaging module according to the above preferred embodiment of the present invention.

It is worth mentioning that the mold 100' further comprises an enclosing film 104' provided at a mold engaging surface 1011' of the upper mold body 101', wherein when the upper mold body 101' and the lower mold body 102' are coupled with each other in a mold closing state, the mold engaging surface 1011' of the upper mold body 101' will not directly contact with the circuit board 22'. Therefore, the enclosing film 104' will provide a buffering effect at the mold engaging surface 1011' of the upper mold body 101' to prevent the circuit board 22' from being directly impact when the upper mold body 101' and the lower mold body 102' are closed and coupled with each other, so as to prevent the deformation of the circuit board 22'. In addition, the enclosing film 104' further provides a sealing effect between the mold engaging surface 1011' of the upper mold 101' and the circuit board 22' to ensure a sealing therebetween. In other words, during the molding process, the sealing engagement of the enclosing film 104' will prevent the fluid state mold material flowing to the chip coupling portion 222' of circuit board 22' from the mold cavity 103', so as to ensure the flatness of the chip coupling portion 222' of circuit board 22'. Furthermore, after the mold material is solidified to form the molded base 23', the enclosing film 104' also facilitates the mold drafting process, wherein after the upper mold body 101' is separated from lower mold body 102' and removed from the circuit board 22' via the enclosing film 104', an integral body of the molded base 23', the circuit board 22' and the electronic elements 26' are formed as shown in FIG. 15E. It is worth mentioning that the chip coupling portion 222' of the circuit board 22' is located with respect to the optical window 231' of the molded base 23', such that the optical lens 10' and the photosensitive unit 21' can be coupled at the optical window 231' thereafter to form a light channel.

In addition, the top side of the molded base 23' has an inner lateral top surface 232' and an outer lateral top surface 233', wherein the light filter 40' is coupled at the inner lateral top surface 232' and the driver 30' is coupled at the outer lateral top surface 233'. Preferably, the inner lateral top surface 232' of the molded base 23' is located below the outer lateral top surface 233' thereof, such that due to the height difference, the inner lateral top surface 232' and the outer lateral top surface 233' form a step-ladder configuration. In other words, the molded base 23' further has an indention slot 234', wherein the light filter 40' is coupled at the inner lateral top surface 232' within the indention slot 234', so as to reduce the height of the array imaging module.

Furthermore, the molded base 23' further comprises a blocking protrusion 235' protruded from the top side thereof, wherein the inner lateral top surface 232' and the outer lateral top surface 233' are defined at the blocking protrusion 235' as the partition wall between the inner lateral top surface 232' and the outer lateral top surface 233'. When the driver 30' is assembled, the blocking protrusion 235' will protect the photosensitive path of the photosensitive unit 21' by blocking the light ray and the contaminant entering into the photosensitive path of the photosensitive unit 21'.

Figure 15F:
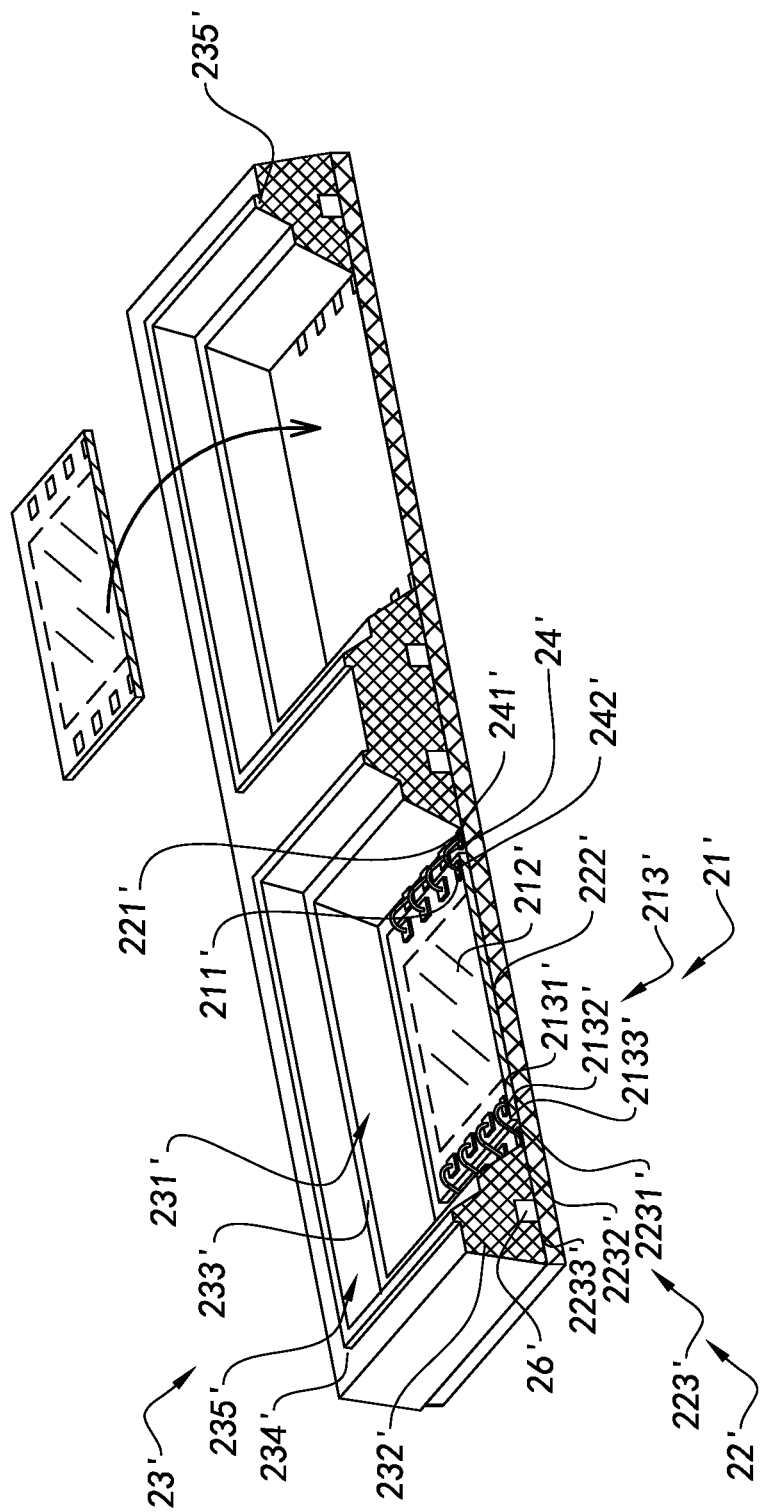
FIG. 15F illustrates a sixth step of the manufacturing process of the alternative array imaging module according to the above preferred embodiment of the present invention.

As shown in FIG. 15F, the photosensitive units 21' are coupled at the chip coupling portions 222' of the circuit board 22' respectively and are electrically coupled to the circuit board 22' via the lead wires 24'. Therefore, the molded photosensitive assembly 20' is formed, wherein the photosensitive units 21' are located at the optical windows 231' respectively.

Figure 15G:
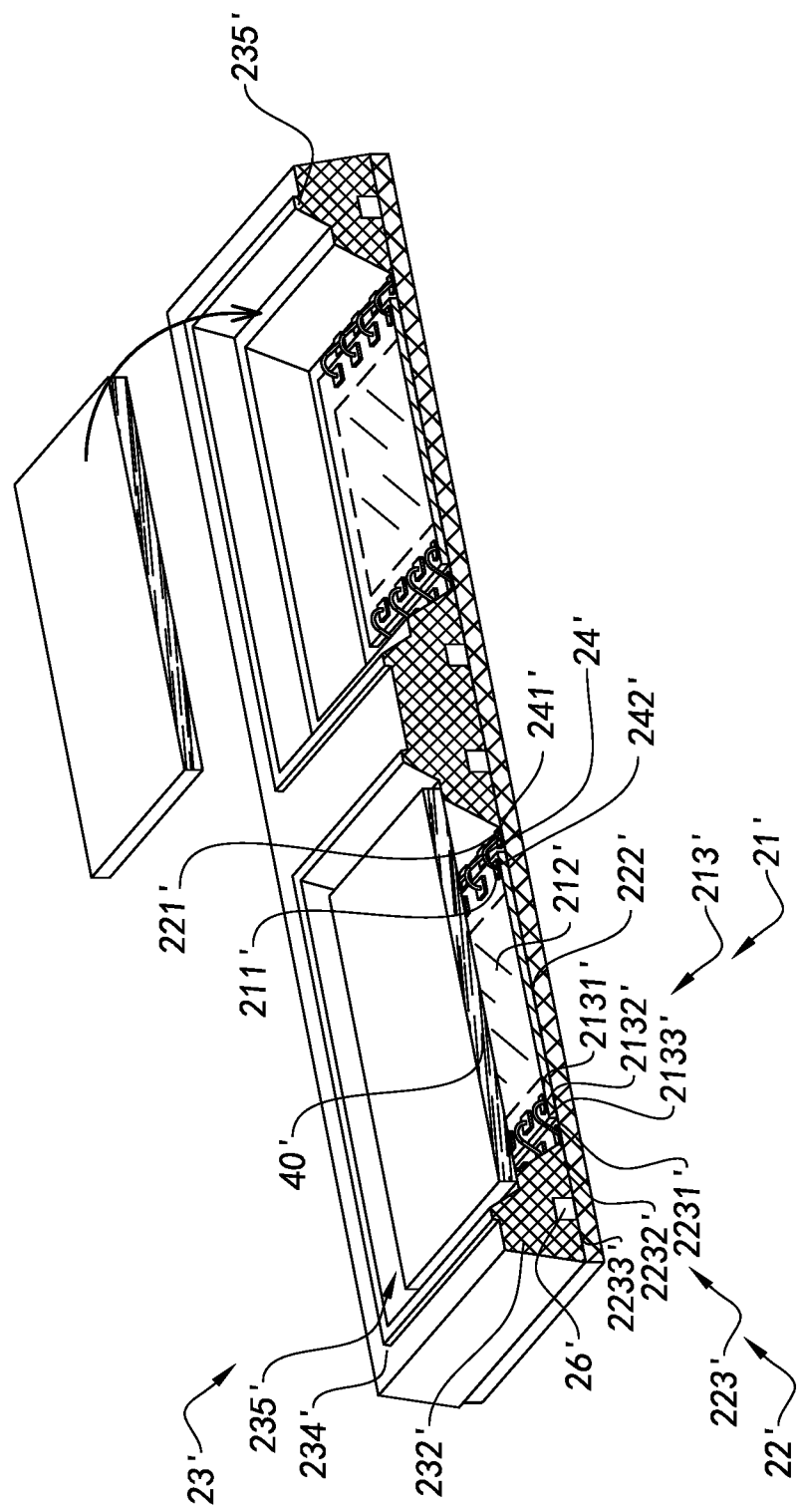
FIG. 15G illustrates a seventh step of the manufacturing process of the alternative array imaging module according to the above preferred embodiment of the present invention.

As shown in FIG. 15G, the light filters 40' are installed at the inner lateral top surface 232' of the molded base 23' in sequence, such that the light filters 40' are retained and located along the photosensitive path of the photosensitive unit 21'. Preferably, after the light filters 40' are installed at the molded base 23', the optical windows 231' of the molded base 23' are sealed by the light filters 40' respectively.

Figure 15H:
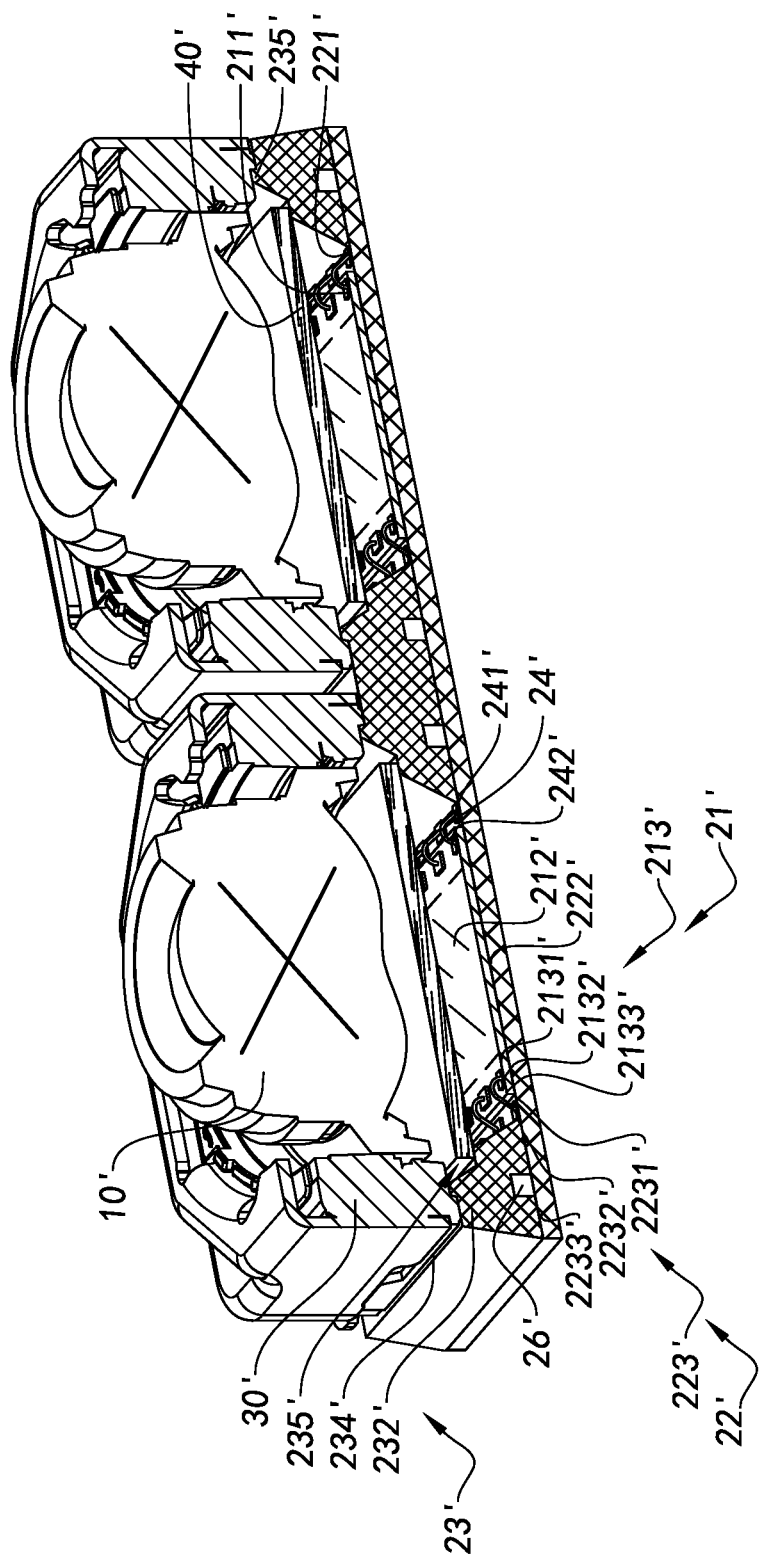
FIG. 15H illustrates an eighth step of the manufacturing process of the alternative array imaging module according to the above preferred embodiment of the present invention.

As shown in FIG. 15H, the optical lenses 10' are coupled to the drivers 30' respectively, wherein the drivers 30' are installed at the outer lateral top surface 234' of the molded base 23' via adhesive or other mounting methods, such that the optical lenses 10' are located along the photosensitive path of the photosensitive units 21' respectively to form the array imaging module.

It is worth mentioning that during the assembling of the driver 30' at the top side of the molded base 23', the blocking protrusion 235' substantially blocks the adhesive applied between the driver 30' and the outer lateral top surface 234' of the molded base 23' from entering into the optical window 231', for preventing any adhesive contaminating the photosensitive path of the photosensitive units 21' so as to enhance the imaging quality of the array imaging module.

Figure 16:
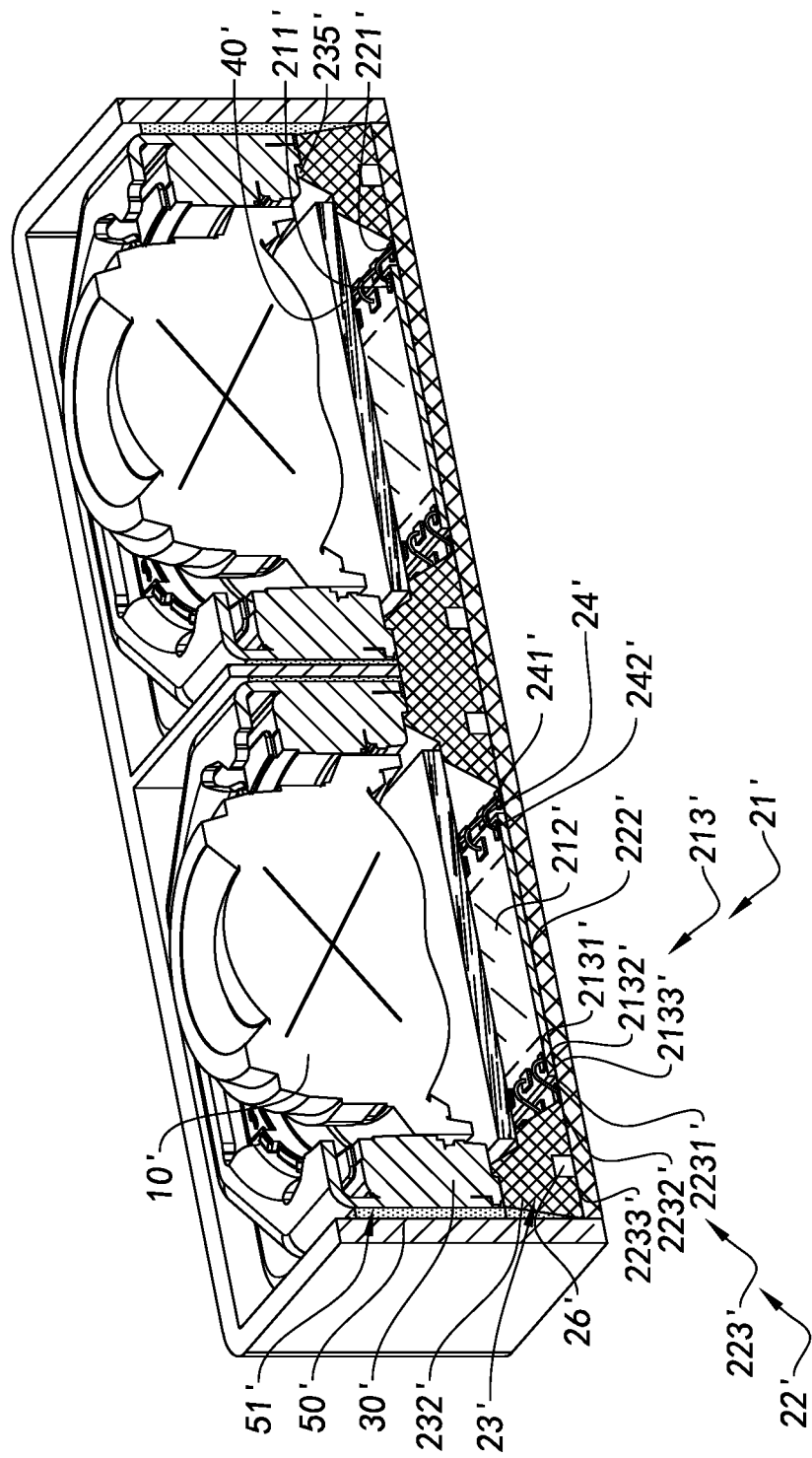
FIG. 16 is a sectional perspective view of the array imaging module according to an alternative mode of the preferred embodiment of the present invention.
Figure 17:
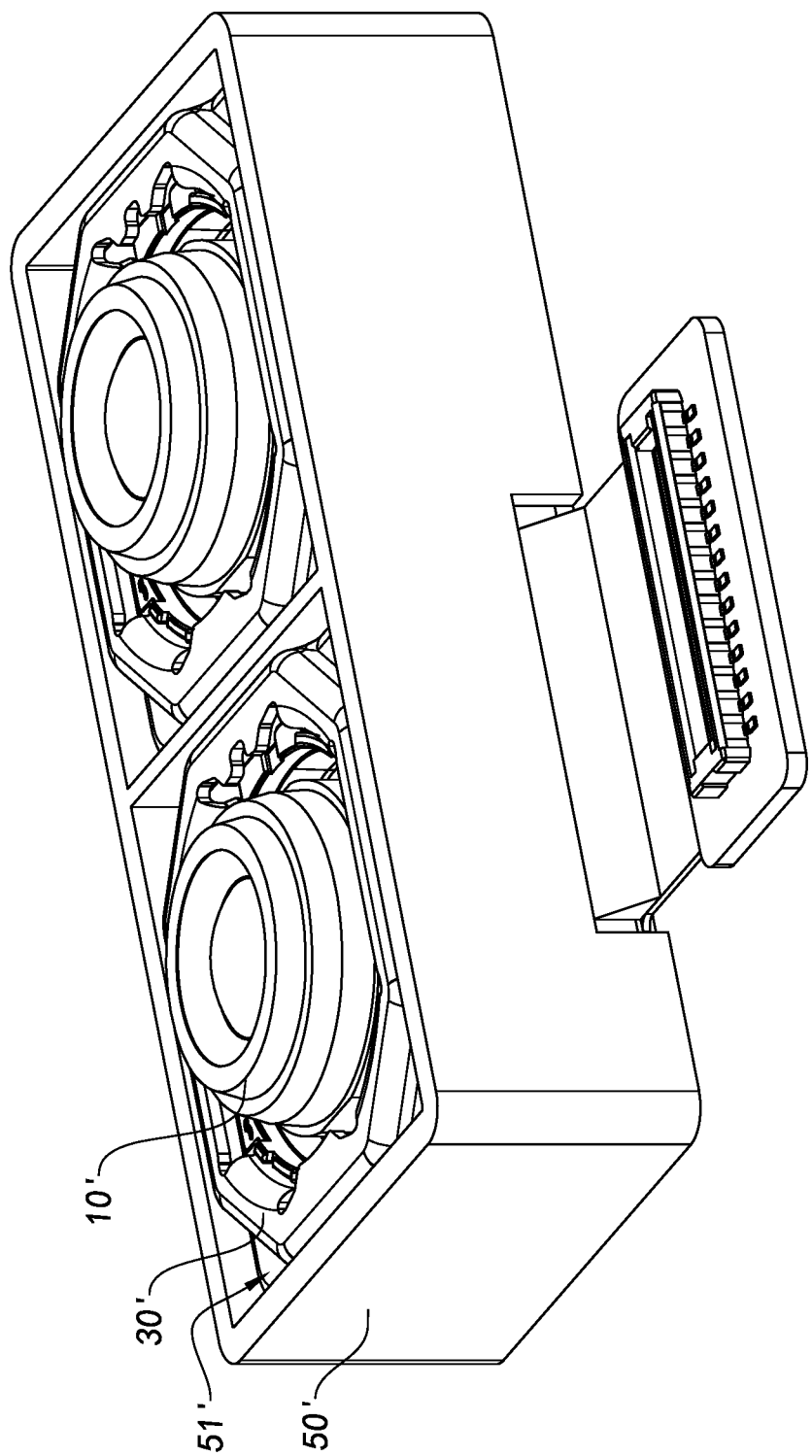
FIG. 17 is a perspective view of the array imaging module according to the above alternative mode of the preferred embodiment of the present invention.

FIGS. 16 and 17 illustrate an alternative mode of the array imaging module, wherein the array imaging module further comprises a supporter 50' which has at least two supporting cavities 51'. The two supporting cavities 51' are located at two lateral sides of the supporter 50', such that each of the supporting cavities 51' forms a channel. The drivers 30' are coupled at the supporting cavities 51' of the supporter 50' respectively, such that each of the drivers 30' is stably retained in position for ensuring the optical lens 10' to be coaxially aligned with the driver 30 and for increasing the strength of the array imaging module, so as to enhance the imaging quality of the array imaging module.

Preferably, after the drivers 30' are coupled at the supporting cavities 51' of the supporter 50' respectively, a filler is filled between an outer casing of the driver 30' and an inner wall of the supporter 50' to ensure the drivers 30' to be stably coupled at the supporter 50' so as to prevent any unwanted wobbling movement of the driver 30. Preferably, the filler can be adhesive filled between the an outer casing of each of the drivers 30' and an inner wall of the supporter 50'.

Figure 18:
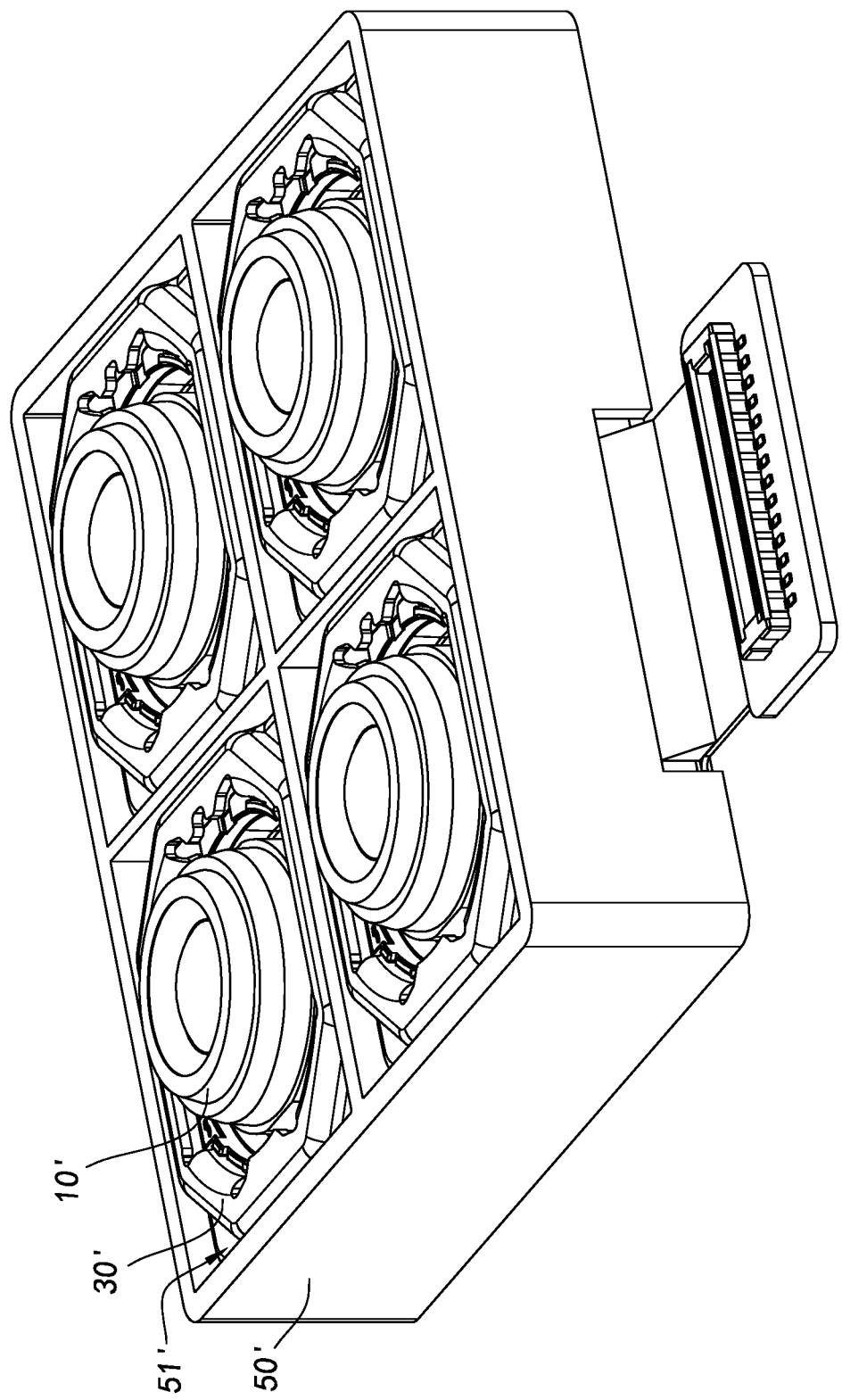
FIG. 18 illustrates a first alternative mode of the array imaging module according to a first alternative mode of the above preferred embodiments of the present invention.

FIGS. 15A to 17 illustrates the array imaging module as a dual lens camera module. As shown in FIG. 18, the array imaging module can be formed as a multiple lens camera module having multiple optical lenses 10'.

Figure 19:
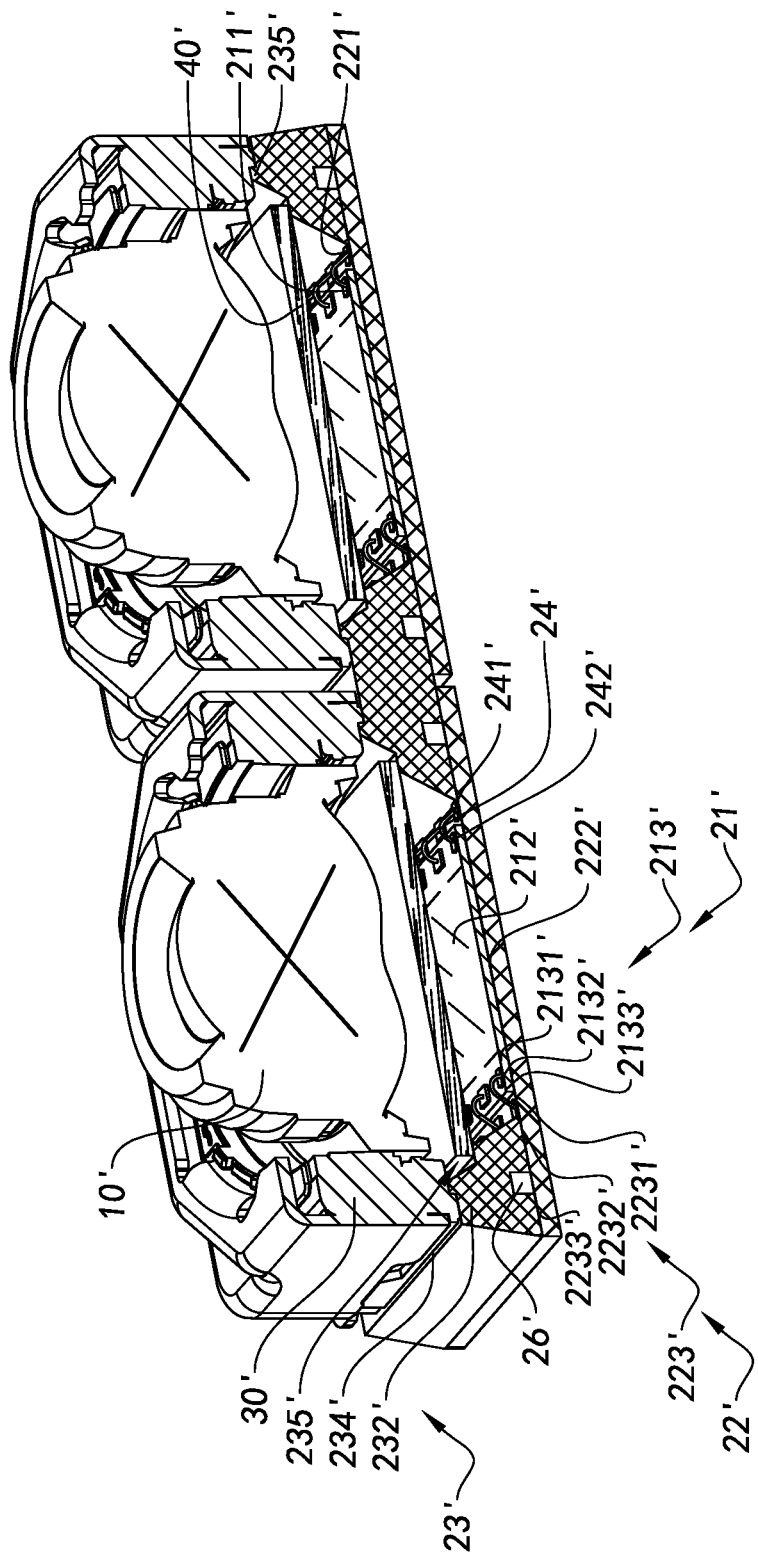
FIG. 19 illustrates a second alternative mode of the array imaging module according to a second alternative mode of the above preferred embodiments of the present invention.

FIG. 19 illustrates another alternative mode of the array imaging module, wherein the array imaging module comprises two circuit boards 22', wherein each of the circuit boards 22' has a chip coupling portion 222' and a peripheral portion 223'. The photosensitive units 21' are electrically coupled at the chip coupling portions 222' of the circuit boards 22' respectively. During the mold process to form the molded base 23', the molded base 23' comprises a main mold body 232' coupled at the peripheral portion 223' of each of the circuit boards 22'. In other words, the circuit boards 22' can be a split type circuit board.

Figure 20:
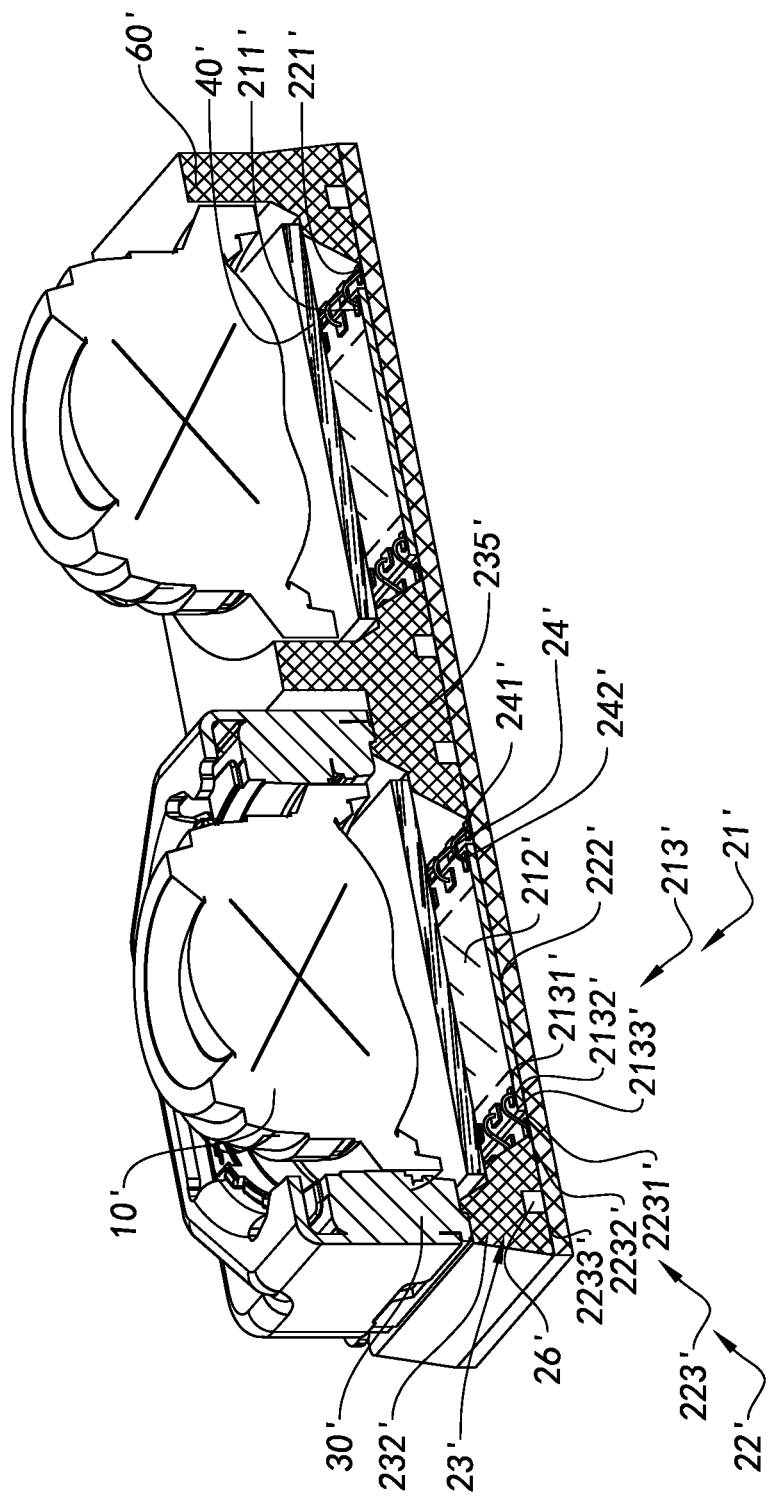
FIG. 20 illustrates a third alternative mode of the array imaging module according to a third alternative mode of the above preferred embodiments of the present invention.

FIG. 20 illustrates another alternative mode of the array imaging module, wherein the array imaging module comprises a lens barrel 60' and at least a driver 30'. The lens barrel 60' is integrally extended from the top side of the molded base 23', wherein the driver 30 is coupled at the top side of the molded base 23', such that the lens barrel 60' and the molded base 23' are respectively assembled with the optical lens 10'. Preferably, the lens barrel 60' and the molded base 23' are formed integrally during the mold process. For example, the array imaging module is a dual lens camera module which incorporates with one driver 30' and one lens barrel 60'.

Figure 21:
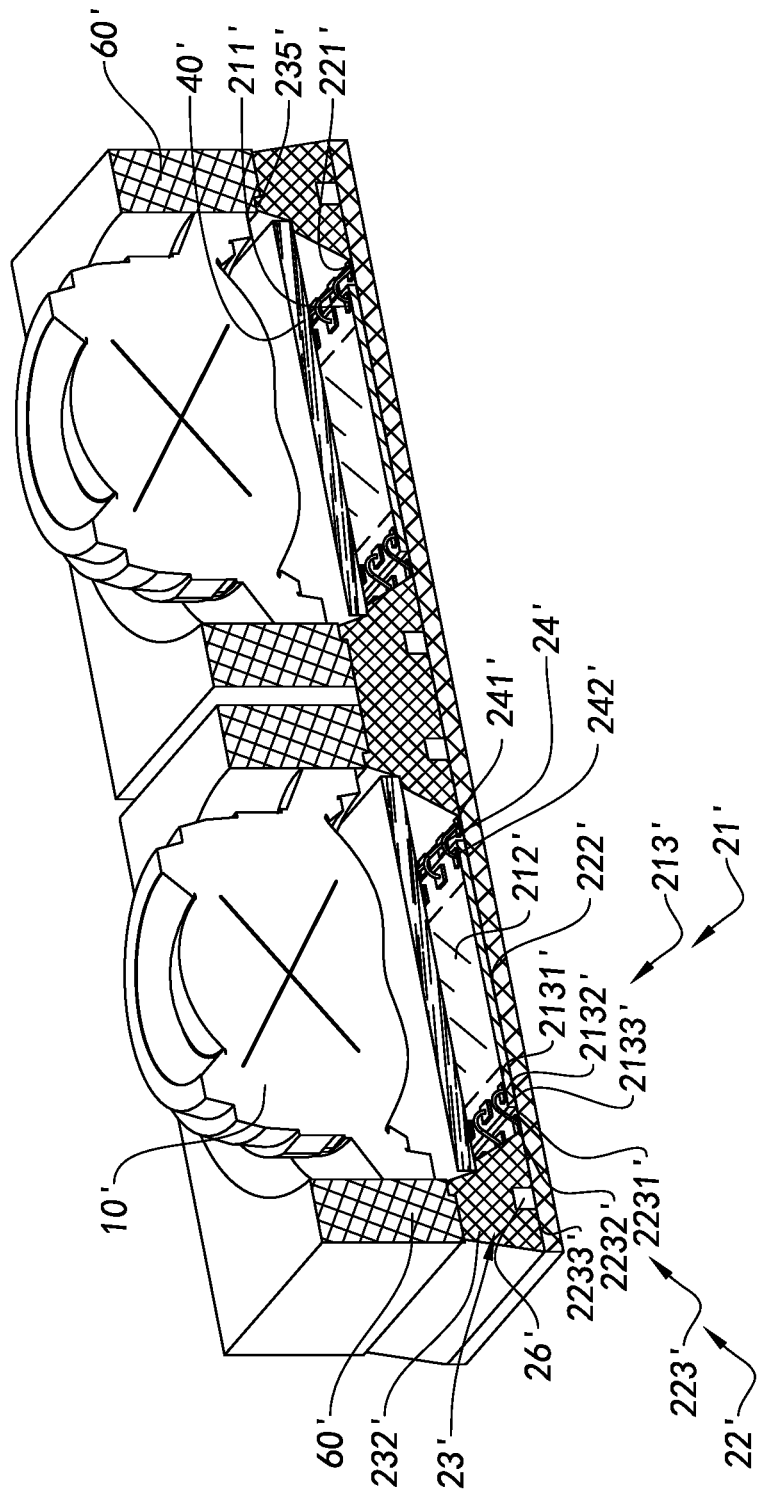
FIG. 21 illustrates a fourth alternative mode of the array imaging module according to a fourth alternative mode of the above preferred embodiments of the present invention.

FIG. 21 illustrates another alternative mode of the array imaging module, wherein the array imaging module comprises a lens barrel 60' and at least a driver 30'. The lens barrel 60' and the driver 30' are coupled at the top side of the molded base 23', wherein the optical lenses 10' are coupled at the lens barrel 60' and the driver 30' respectively to ensure the optical lenses 10' to be aligned with the photosensitive path of the photosensitive unit 21'. It is worth mentioning that the lens barrel 60' has a thread-less structure as shown in FIG. 21. It is appreciated that the lens barrel 60' can have a threaded structure, such that the lens barrel 60' and the optical lens 10' can be coupled with each other via the threaded structure so as to securely couple the optical lens 10' at the lens barrel 60'.

Figure 22:
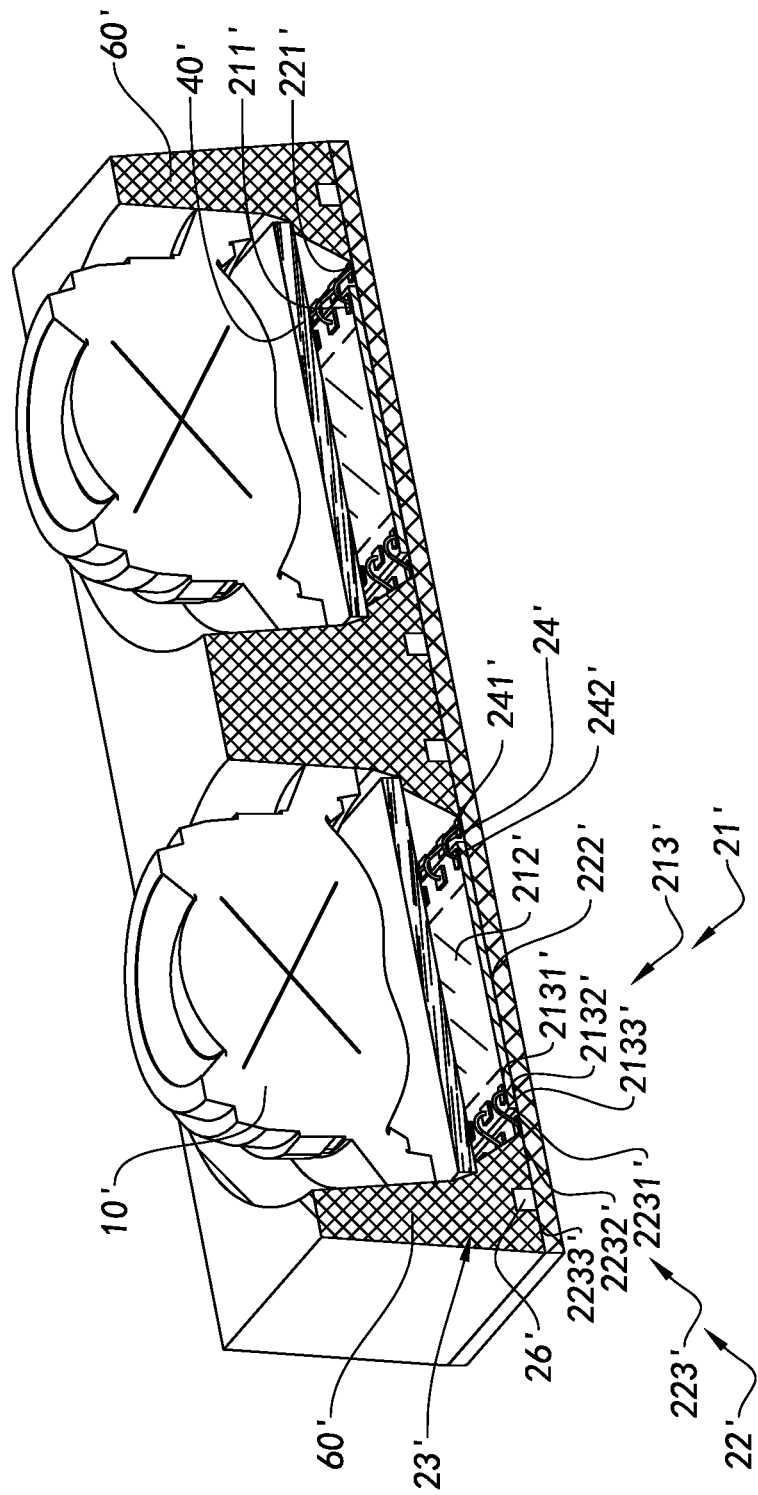
FIG. 22 illustrates a fifth alternative mode of the array imaging module according to the above preferred embodiments of the present invention.

FIG. 22 illustrates a fifth alternative mode of the array imaging module, wherein the array imaging module comprises two lens barrels 60' mounted to the top side of the molded base 23'. The optical lenses 10' are coupled at the lens barrels 60' respectively. Preferably, the lens barrels 60' are respectively coupled to the molded base 23' in an integrated manner during the mold process.

Figure 23:
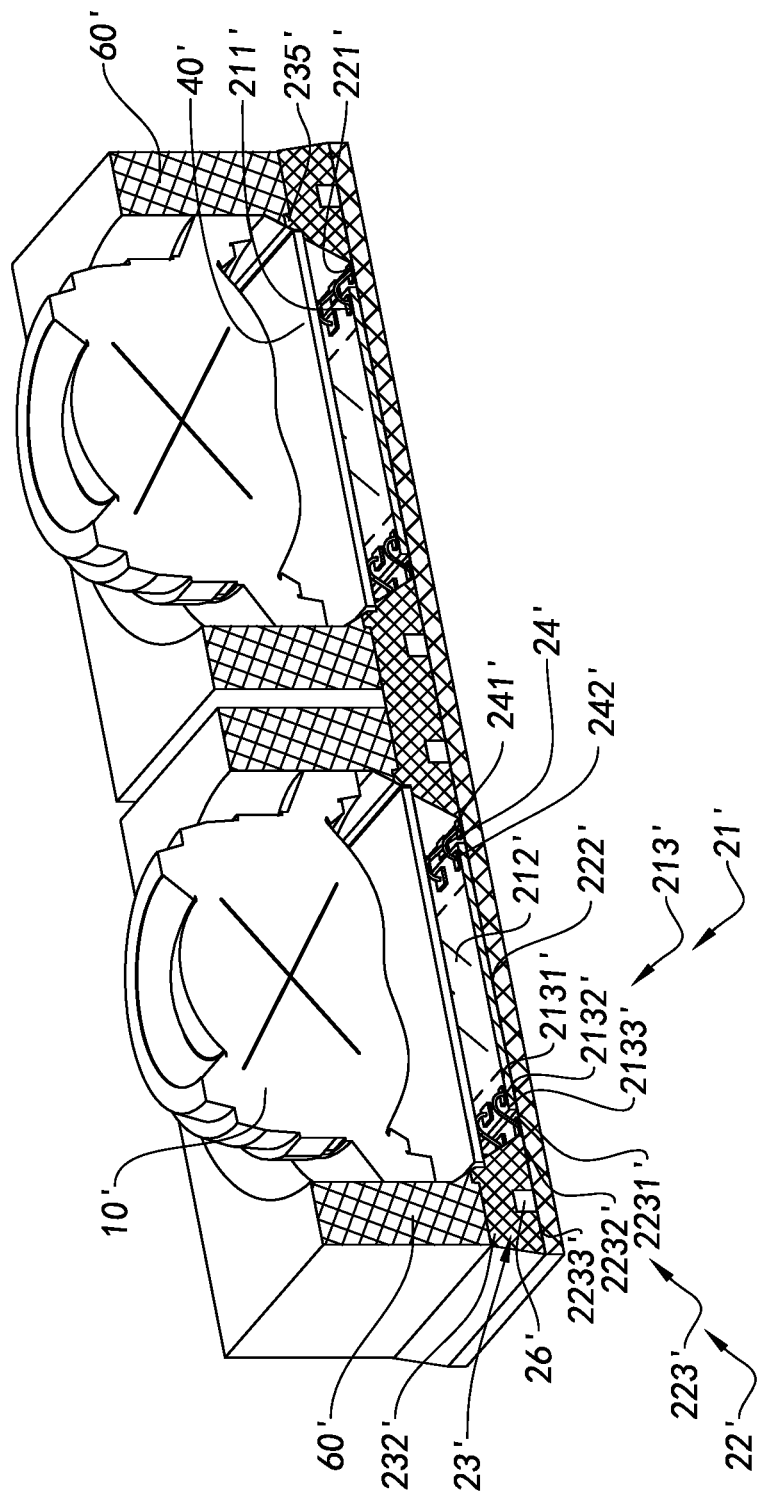
FIG. 23 illustrates a sixth alternative mode of the array imaging module according to the above preferred embodiments of the present invention.

FIG. 23 illustrates a sixth alternative mode of the array imaging module, wherein the array imaging module comprises two lens barrels 60'. After the molded photosensitive assembly 20' is formed, the lens barrels 60' are coupled at the top side of the molded base 23' at different positions. In other words, the optical lenses 10' are coupled at the lens barrels 60' respectively, such that the optical lenses 10' are located along the optical paths of the photosensitive units 21' respectively. It is worth mentioning that the lens barrel 60' can have the threaded structure or the thread-less structure, wherein the mounting structure of the lens barrel 60' should not be restricted.

Figure 24:
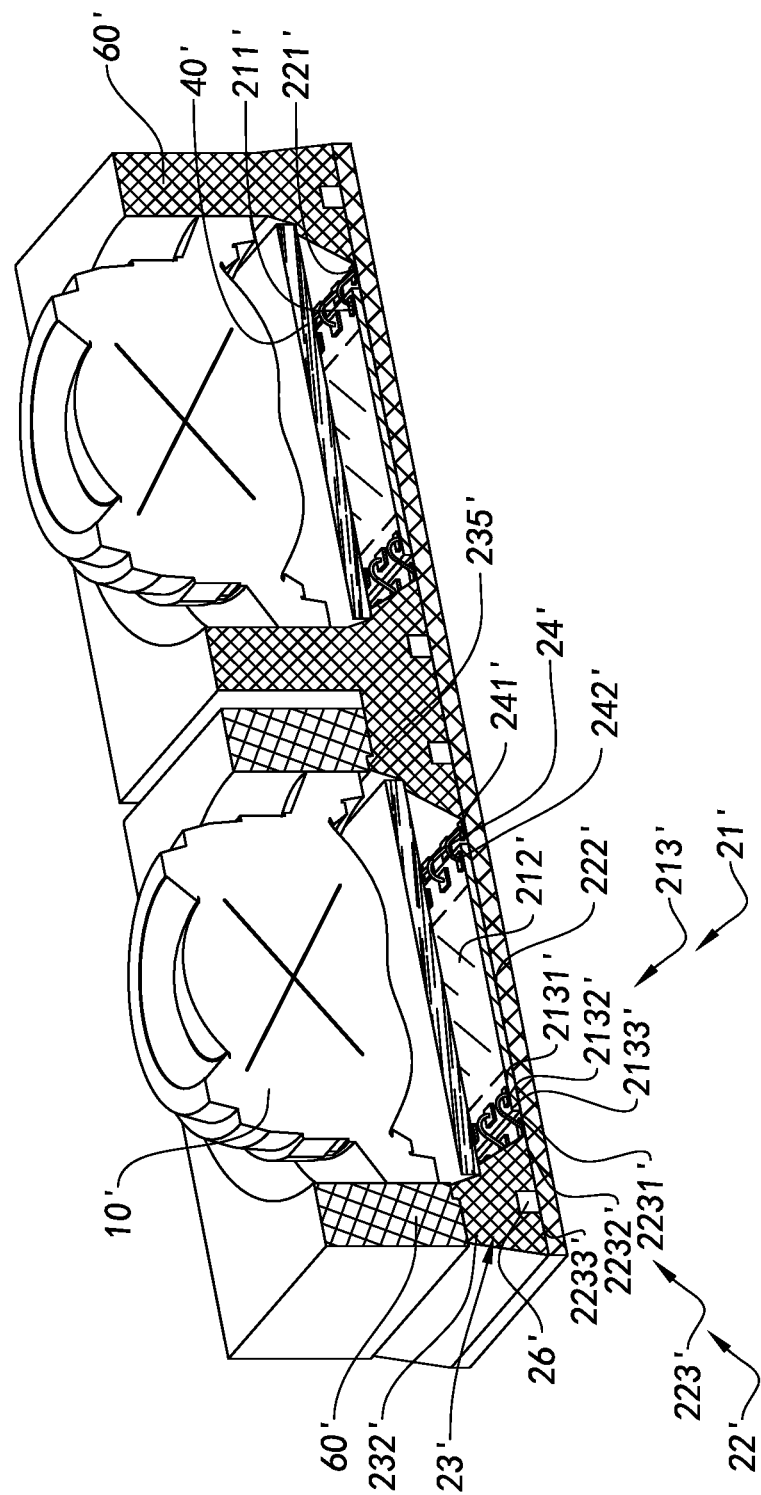
FIG. 24 illustrates a seventh alternative mode of the array imaging module according to the above preferred embodiments of the present invention.
Figure 25:
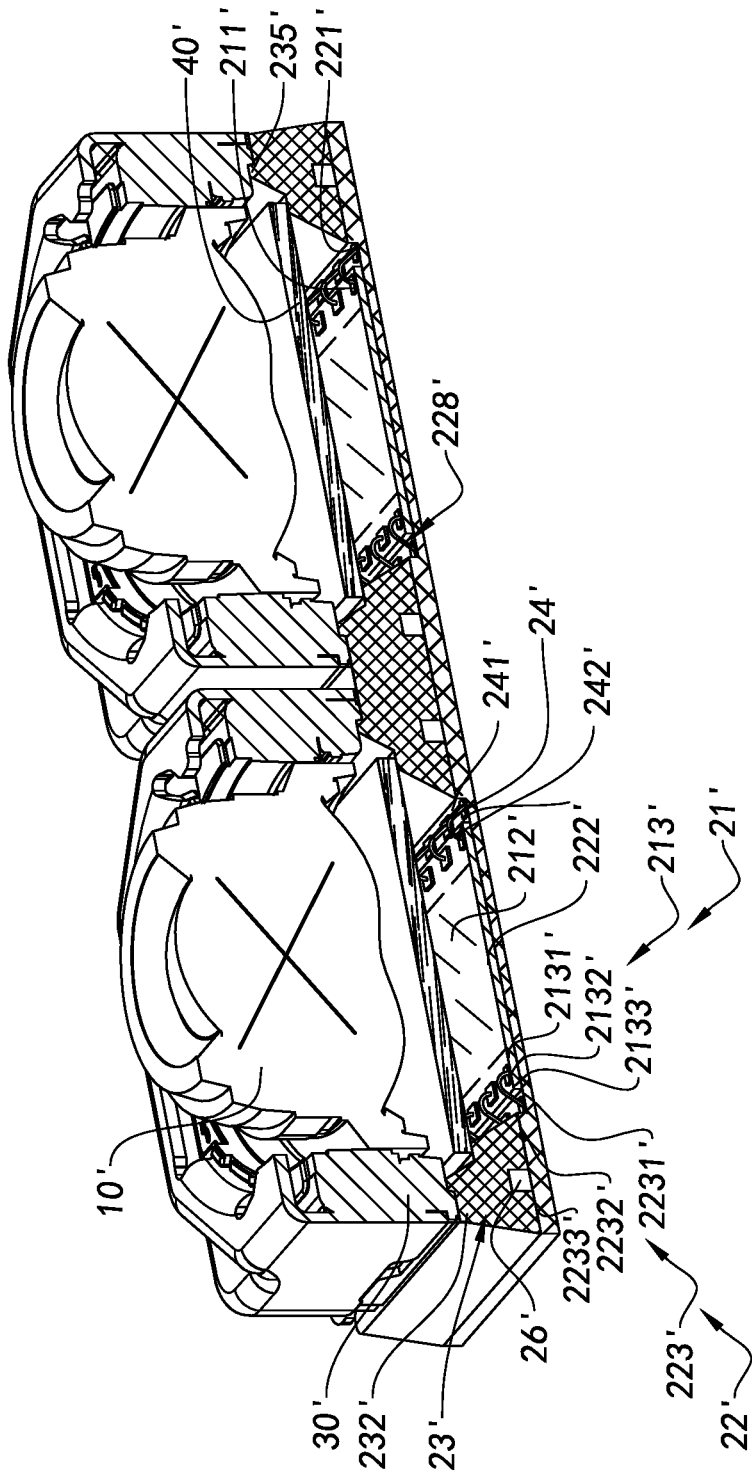
FIG. 25 illustrates an eighth alternative mode of the array imaging module according to the above preferred embodiments of the present invention.

FIGS. 22 and 23 illustrate two different alternative modes of the array imaging module. FIG. 24 illustrates a seventh alternative mode of the array imaging module, wherein the array imaging module comprises at least a lens barrel 60' integrally extended from the top side of the molded base 23' during the mold process. Another lens barrel 60' is coupled at the top side of the molded base 23'. For example, when the array imaging module is embodied as the dual lens camera module, one of the lens barrel 60' is integrally extended from the top side of the molded base 23' during the mold process and another lens barrel 60' is coupled at the top side of the molded base 23' for auto-focusing.

Figure 26:
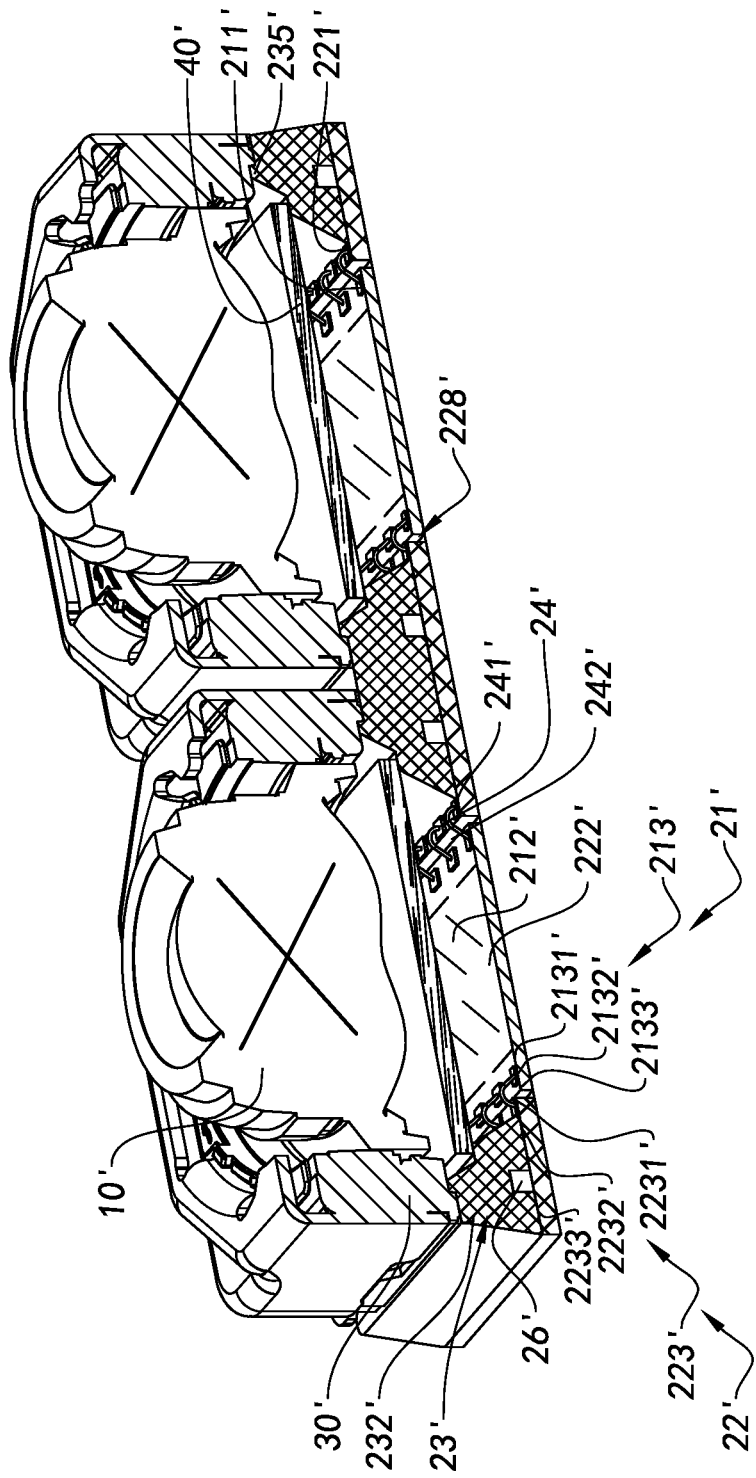
FIG. 26 illustrates a ninth alternative mode of the array imaging module according to the above preferred embodiments of the present invention.

FIG. 24 illustrates an eighth alternative mode of the array imaging module, wherein the array imaging module comprises a circuit board 22' having at least a receiving chamber 228', wherein the photosensitive unit 21' is received in the receiving chamber 228' of the circuit board 22' to minimize the height difference between the top side of the photosensitive unit 21' and the top side of the circuit board 22'. Preferably, the top side of the photosensitive unit 21' and the top side of the circuit board 22' are aligned with the same planar direction. Therefore, the height of the array imaging module can be further reduced. The array imaging module can be incorporated with the thinness of the electronic device. It is worth mentioning that the receiving chamber 228' can be a receiving slot. FIG. 26 illustrates a ninth alternative mode of the array imaging module, wherein the receiving chamber 228' can be a receiving through hole for reducing the height of the array imaging module.

Figure 27:
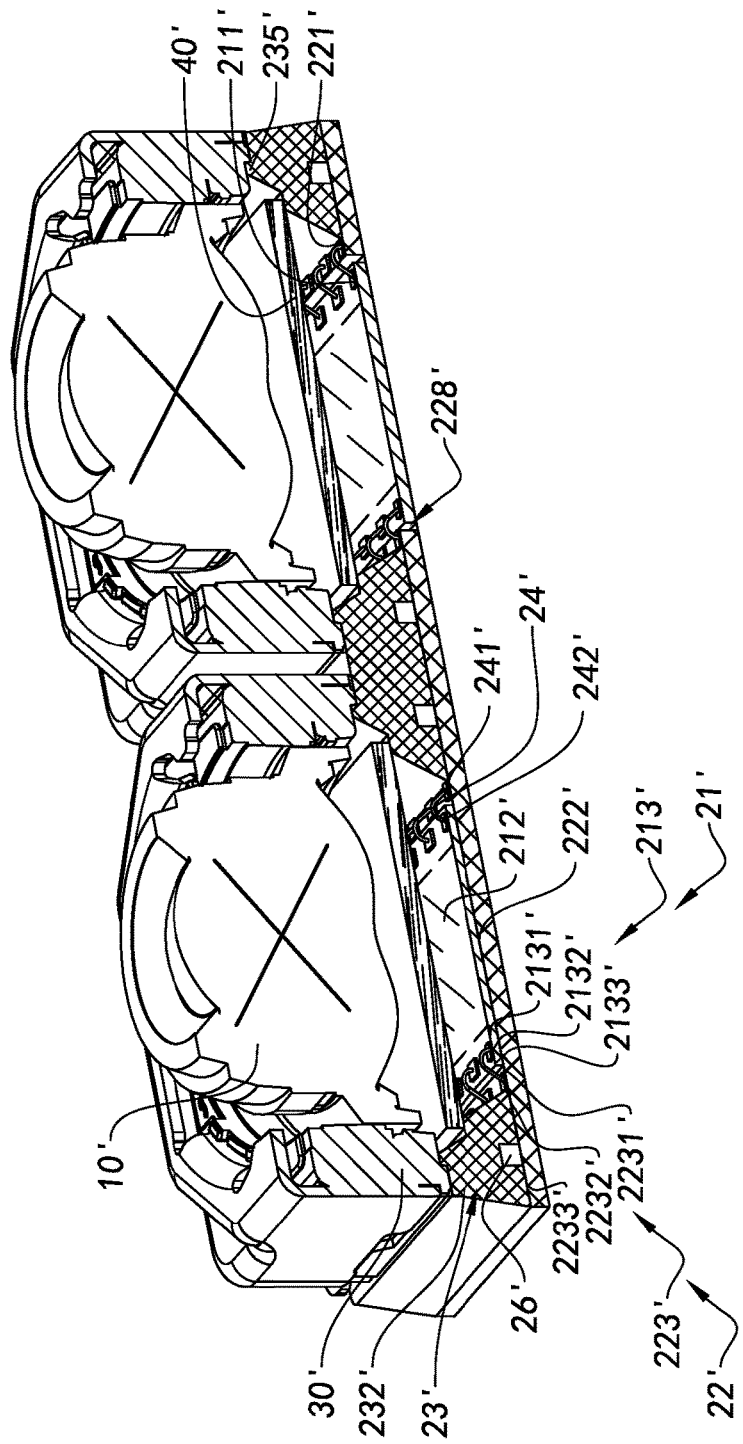
FIG. 27 illustrates a tenth alternative mode of the array imaging module according to the above preferred embodiments of the present invention.

FIG. 27 illustrates a tenth alternative mode of the array imaging module, wherein the array imaging module comprises a circuit board 22' having at least a receiving chamber 228', wherein the number of receiving chamber 228' is lesser than the number of photosensitive unit 21'. For example, the circuit board 22' has one receiving chamber 228', wherein one of the photosensitive units 21' is coupled on the top side of the circuit board 22' and another photosensitive unit 21' is disposed in the receiving chamber 228', such that the two photosensitive units 21' are retained at the same planar level, so as to enable the different focus ranges of two images from the array imaging module.

It is worth mentioning that the receiving chamber 228' can be a through hole as shown in FIG. 27. It is appreciated that the receiving chamber 228' can be an indented slot.

Figure 28:
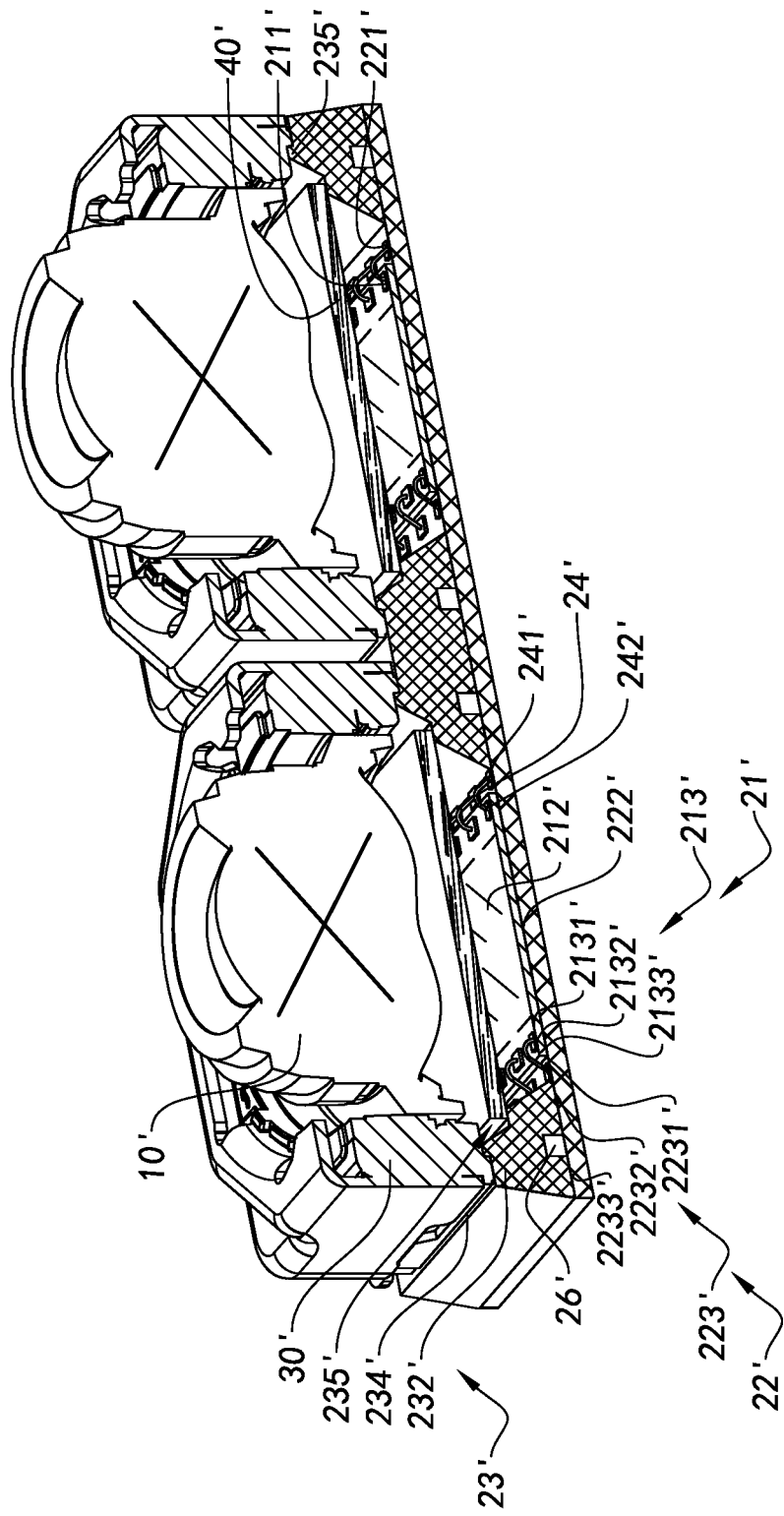
FIG. 28 illustrates an eleventh alternative mode of the array imaging module according to the above preferred embodiments of the present invention.

FIG. 28 illustrates an eleventh alternative mode of the array imaging module. The size of each of the photosensitive unit 21' and the size of each of the optical lens 10' are different. For example, one of the photosensitive units 21' is larger than another photosensitive unit 21'. The larger photosensitive unit 21' is incorporated with one of the optical lenses 10' which is a wide-angle optical lens. The smaller photosensitive unit 21' is incorporated with the optical lens 10' which is a long-range focus optical lens. Therefore, the array imaging module will have an enhanced imaging quality.

Figure 29:
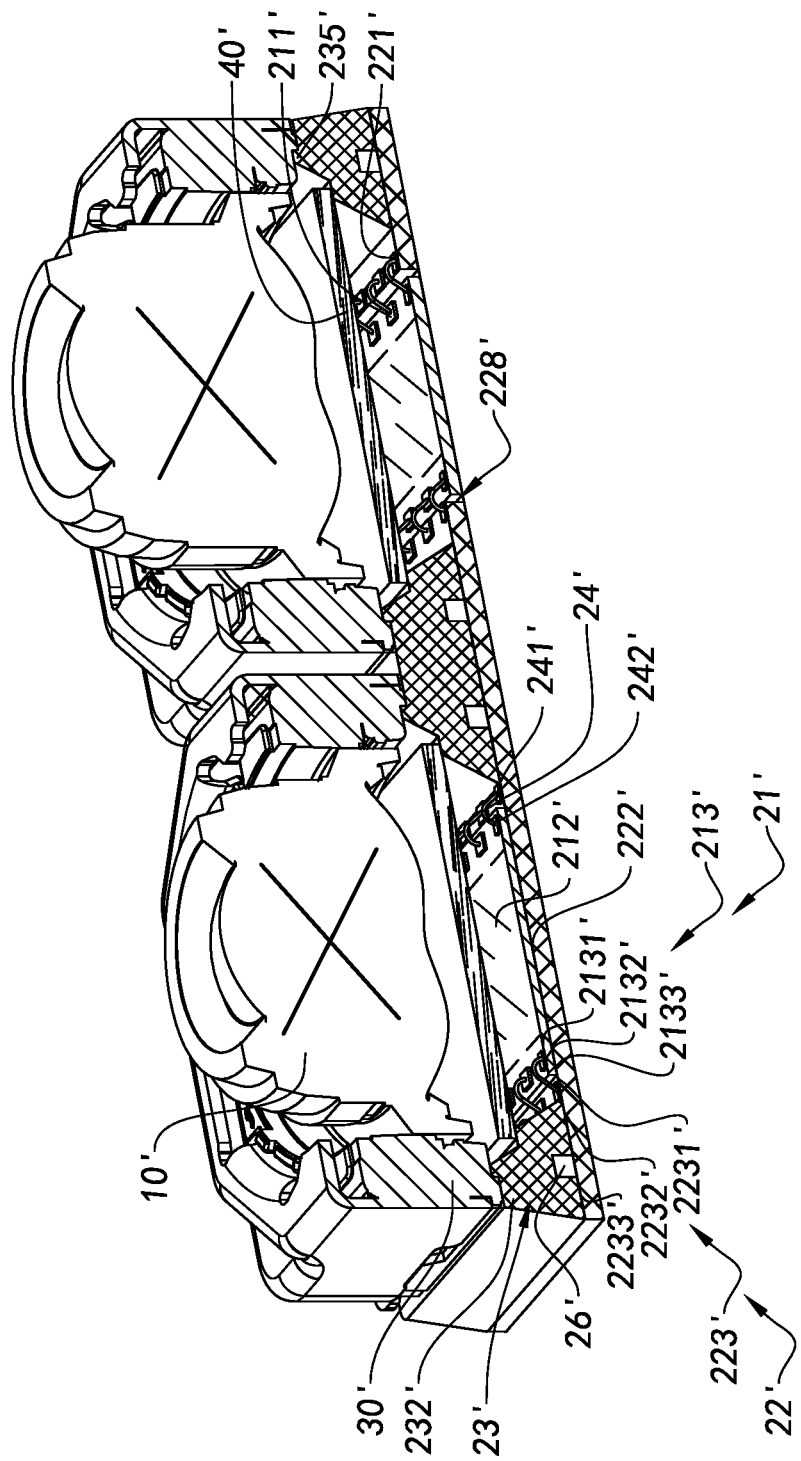
FIG. 29 illustrates a twelfth alternative mode of the array imaging module according to the above preferred embodiments of the present invention.

FIG. 29 illustrates a twelve alternative mode of the array imaging module. The larger photosensitive unit 21' is coupled at the outer side of the circuit board 22' and the smaller photosensitive unit 21' is disposed in the receiving chamber 228' of the circuit board 22', such that the photosensitive units 21' can be incorporated with the optical lens with extra long range focus optical lens so as to enhance the focusing power of the array imaging module.

Figure 30:
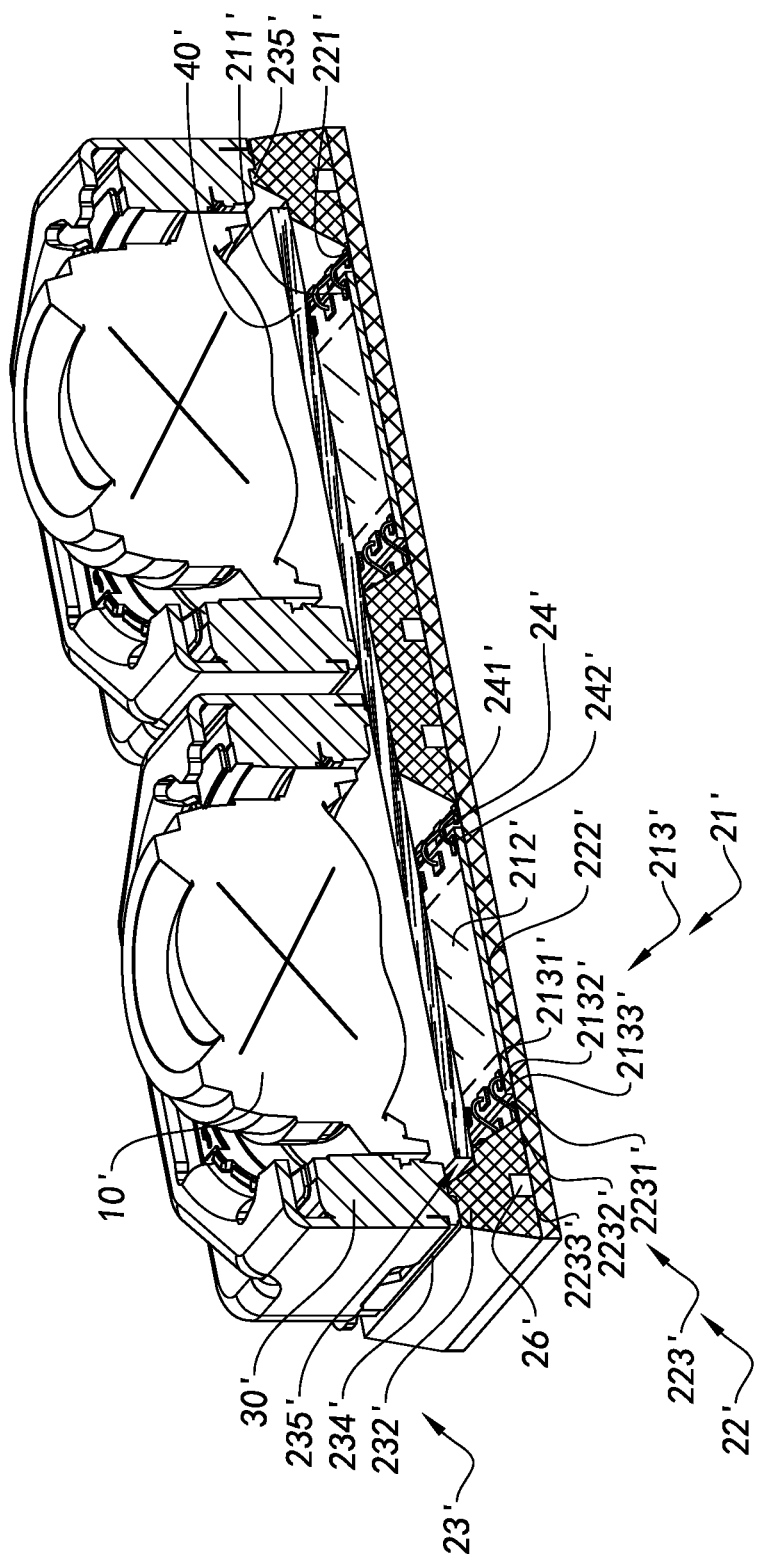
FIG. 30 illustrates a thirteenth alternative mode of the array imaging module according to the above preferred embodiments of the present invention.

FIG. 30 illustrates a thirteenth alternative mode of the array imaging module, which comprises a light filter 40' coupled at the molded base 23' After the optical lenses 10' are retained along the optical paths of the photosensitive units 21' respectively, the light filters 40' are coupled to the optical lenses 10' at different positions respectively. Therefore, the light can be filtered by the light filters 40 and can pass through the optical lenses 10' respectively, such that the photosensitive units 21' will receives two lights from the optical lenses 10 for photoelectric conversion.

Figure 31:
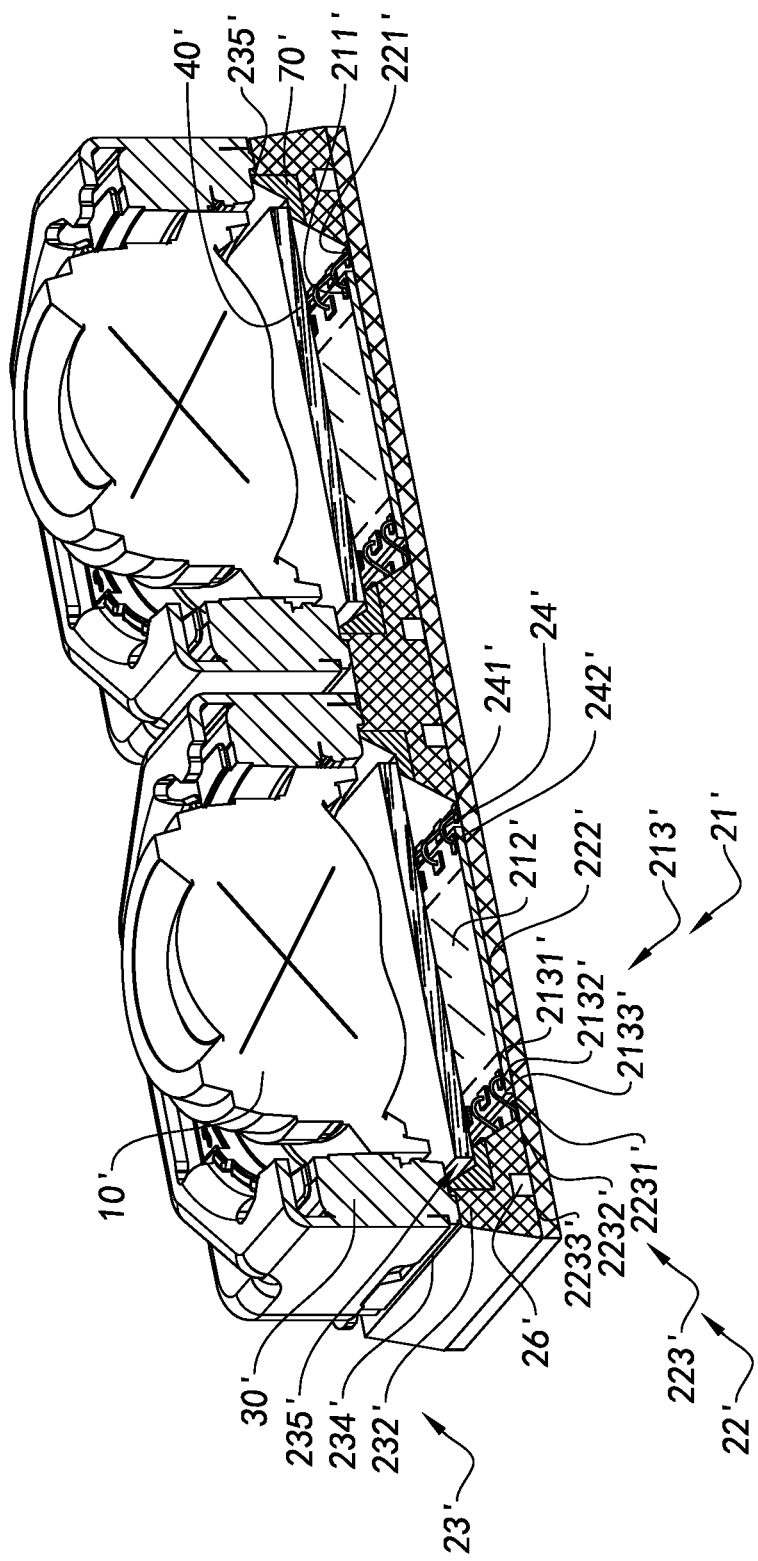
FIG. 31 illustrates a fourteenth alternative mode of the array imaging module according to the above preferred embodiments of the present invention.

FIG. 31 illustrates a fourteenth alternative mode of the array imaging module, which comprises at least a supporter 70'. Accordingly, the number of supporter 70' matches with the numbers of light filter 40' and optical lens 10'. The light filters 40' are installed at the supporters 70' respectively, and the supporters 70' are installed at the molded base 23'. The light filters 40' are located along the photosensitive paths of the photosensitive units 21'. Therefore, the size of the light filter 40' can be reduced so as to minimize the manufacturing cost of the array imaging module.

Figure 32:
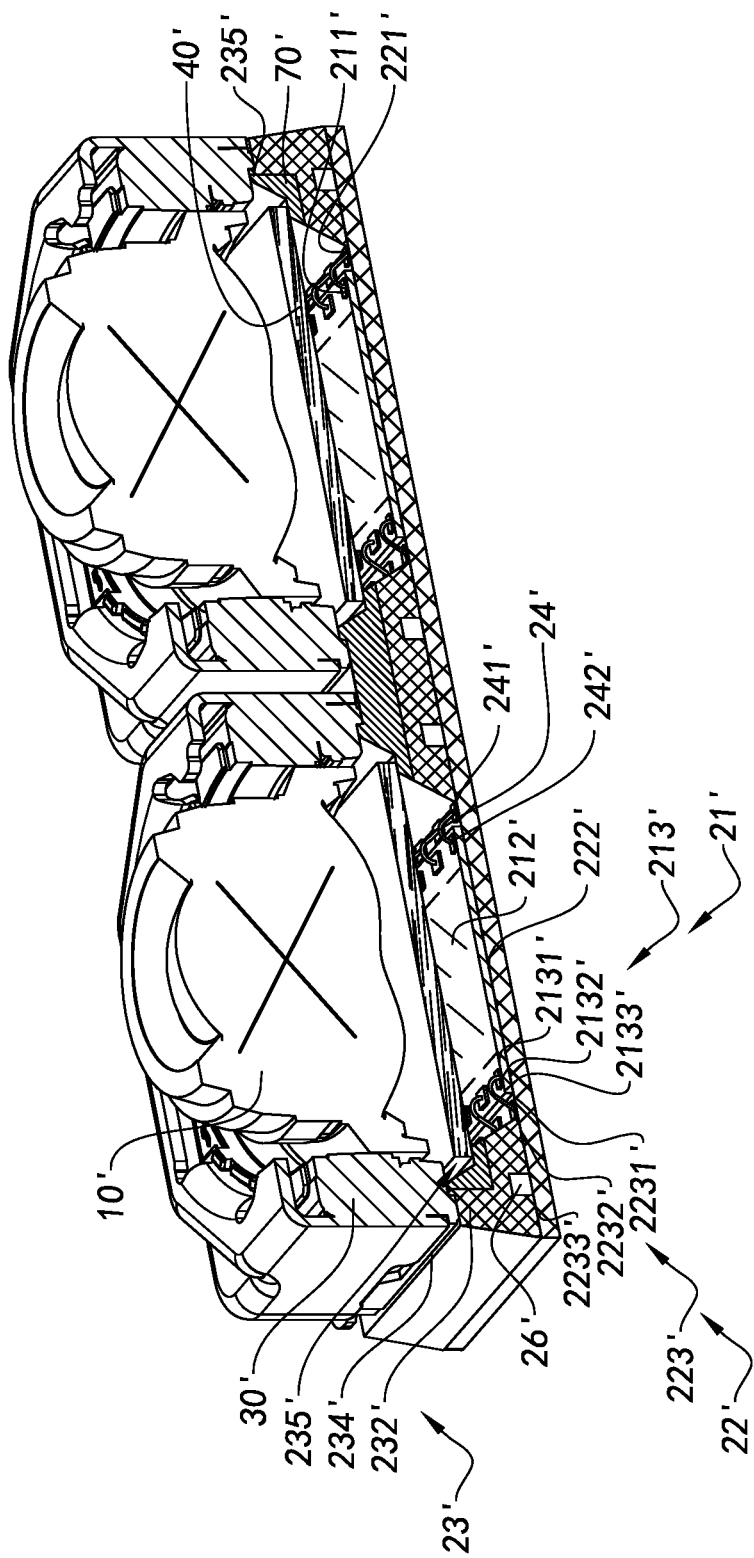
FIG. 32 illustrates a fifteenth alternative mode of the array imaging module according to the above preferred embodiments of the present invention.
Figure 33:
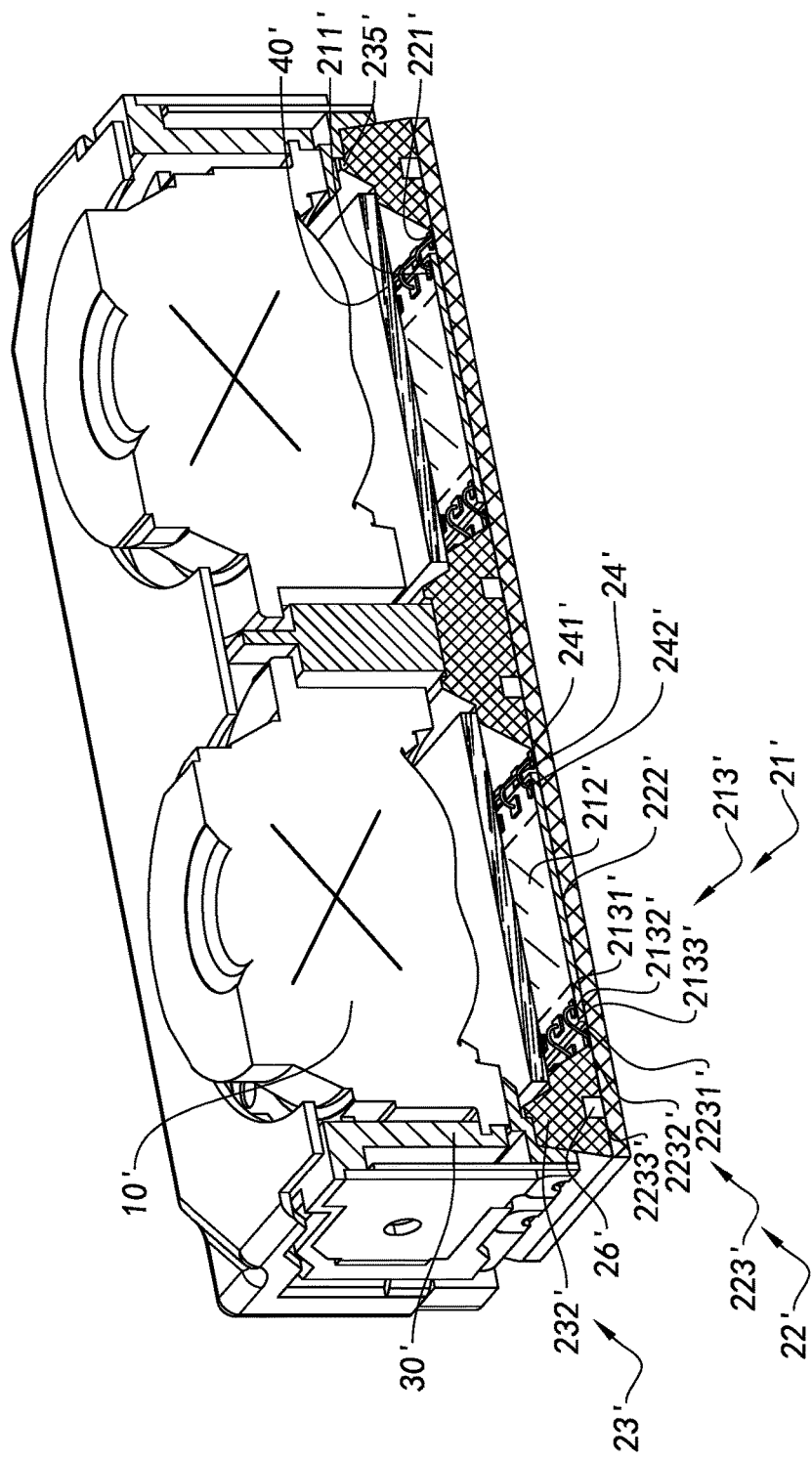
FIG. 33 illustrates a sixteenth alternative mode of the array imaging module according to the above preferred embodiments of the present invention.

FIG. 32 illustrates a fifteenth alternative mode of the array imaging module, which comprises at least a supporter 70', wherein the light filter 40' is installed at the supporter 70'. The supporter 70' is installed at the molded base 23', wherein the optical lenses 10' are located along the photosensitive paths of the photosensitive units 21'. Therefore, the optical lenses 10 can be correspondingly retained at different locations of the light filters 40'.

FIG. 32 illustrates a sixteenth alternative mode of the array imaging module, wherein the driver 30' is an integrated driver. In other words, the optical lenses 10' are coupled at one single driver 30', wherein after the driver 30' is installed at molded base 23', the optical lenses 10' are located along the photosensitive paths of the photosensitive units 21'. Through the integrated driver of the present invention, the efficiency of the assembling process of the array imaging module can be increased, the size of the array imaging module can be further reduced, and structure of the array imaging module can be more compact. As a result, the array imaging module of the present invention is suitable for the thinness and lightness of the electronic device.

It is worth mentioning that after the molded base 23' and the circuit board 22' are integrally formed together, the molded base 23' will reinforce the strength of the circuit board 22'. In other words, the molded base 23' forms a reinforcing portion 28' of the circuit board 22', wherein the electronic elements 26' are enclosed within the reinforcing portion 28'. Therefore, the reinforcing portion 28' not only encloses all the electronic elements 26' to prevent the electronic elements 26' from exposing and contacting with air outside, but also isolate the electronic elements 26' with each other to prevent the mutual interference by the adjacent electronic elements 26'. On the other hand, the electronic elements 26' will ensure the engagement between the reinforcing portion 28' and the circuit board 22' so as to prevent the circuit board 22' being detached from the reinforcing portion 28'. As a result, the assembly of the array imaging module will ensure the reliability and stability of the array imaging module during the operation thereof.

Figure 34:
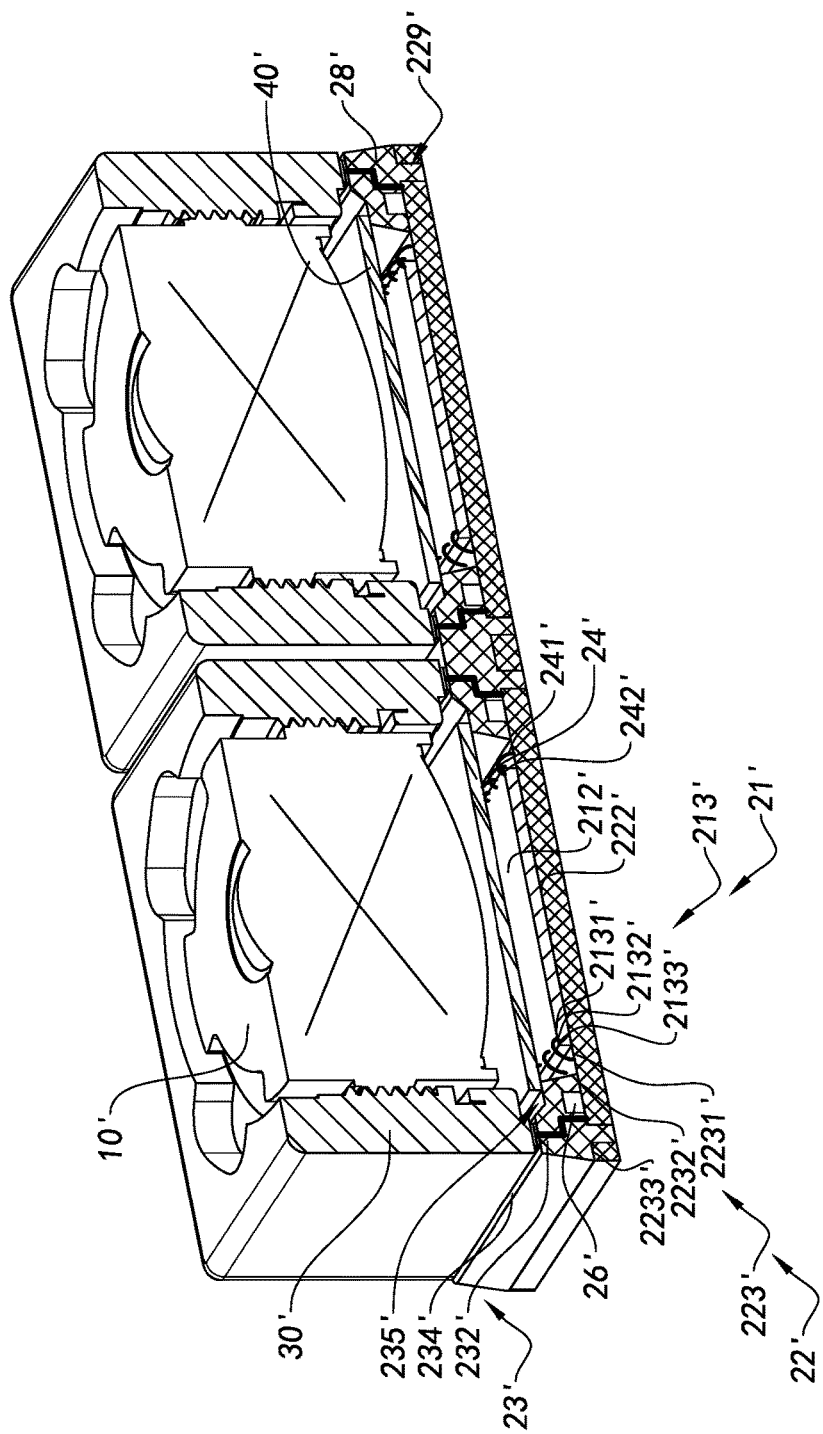
FIG. 34 illustrates a seventeenth alternative mode of the array imaging module according to the above preferred embodiments of the present invention.

FIG. 34 illustrates a seventeenth alternative mode of the array imaging module, wherein the circuit board 22' has at least a reinforcing cavity 229', wherein once the reinforcing portion 28' is formed, at least a portion of the reinforcing portion 28' is extended into the reinforcing cavity 229', such that the reinforcing portion 28' can be securely coupled to the circuit board 22'. It is worth mentioning that the reinforcing cavity 229' can be a through slot or a non-through slot. FIG. 34 shows the reinforcing cavity 229' is a, but not limit to, through slot. It is appreciated that the reinforcing cavity 229' can be a non-through slot.

Figure 35:
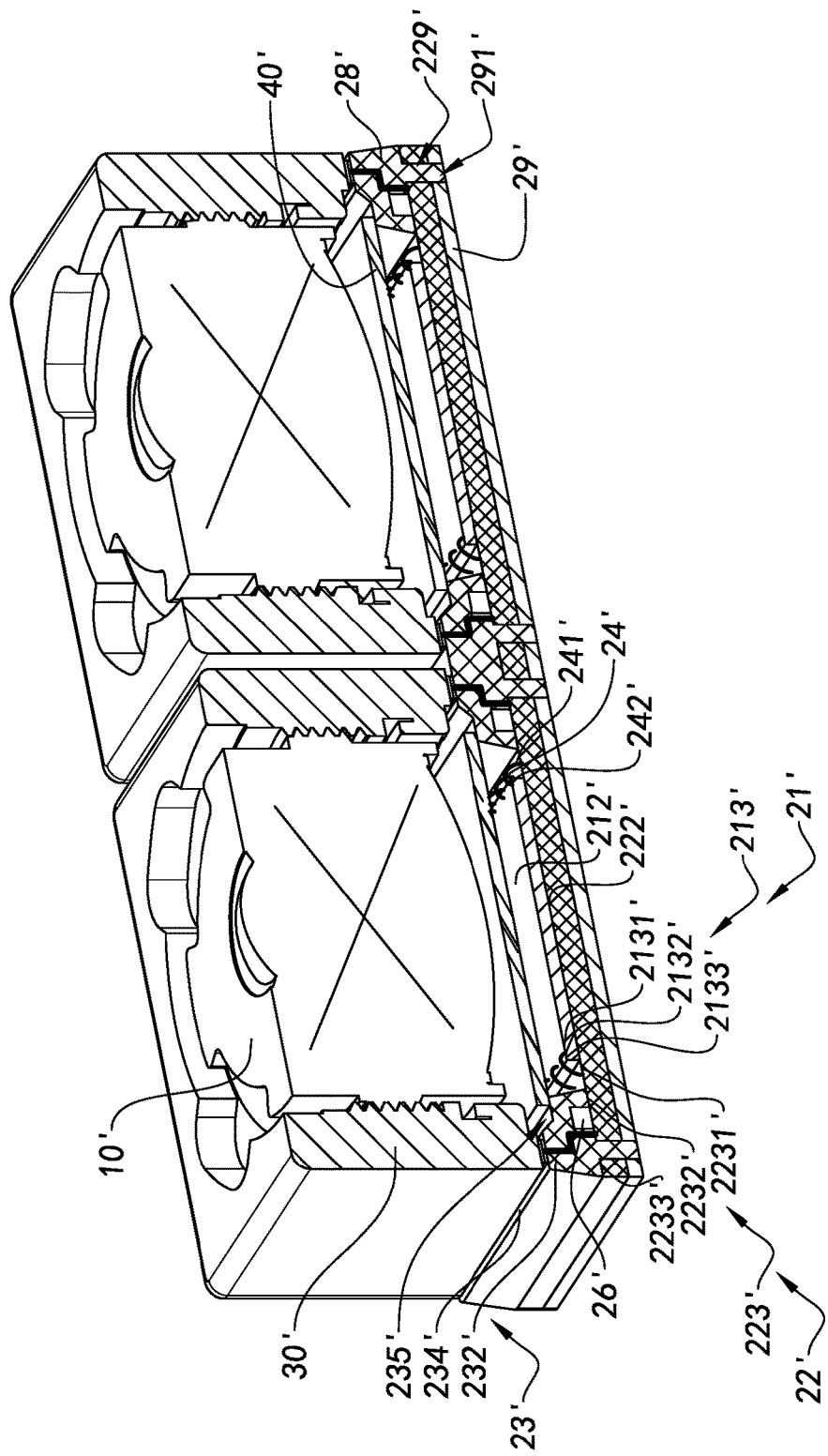
FIG. 35 illustrates an eighteenth alternative mode of the array imaging module according to the above preferred embodiments of the present invention.

FIG. 35 illustrates an eighteenth alternative mode of the array imaging module, wherein the molded photosensitive assembly 20' further comprises a base frame 29', such as a base panel, overlapped with and coupled at the circuit board 22', such that the base frame 29' will reinforce the strength of the circuit board 22' so as to retain the flatness of the circuit board 22'. It is appreciated that the thickness of the circuit board 22' can be reduced via the base frame 29' to reduce the thickness of the array imaging module, so as to further reduce the thinness and lightness of the electronic device.

Preferably, the base frame 29' can be made of metal or other alloys. For example, the base frame 29' can be made of aluminum, such that the base frame 29' not only ensures the flatness of the circuit board 22' but also enhance the heat dissipation of the circuit board 22'. Therefore, the base frame 29' can prevent the overheat of the array imaging module so as to enhance the reliability of the array imaging module during the operation thereof.

Furthermore, the base frame 29' has at least a second reinforcing cavity 291', wherein after the base frame 29' is overlapped with and coupled to the circuit board 22', the first reinforcing cavity 229' of the circuit board 22' and the second reinforcing cavity 291' of the base frame 29' are correspondingly aligned with each other. Therefore, the mold material can pass through the first reinforcing cavity 229' and the second reinforcing cavity 291'. Once the mold material is solidified, the circuit board 22', the base frame 29' and the reinforcing portion 28' are integrally combined with each other. It is appreciated that the second reinforcing cavity 291' can be a through hole or a non-through hole.

Figure 36:
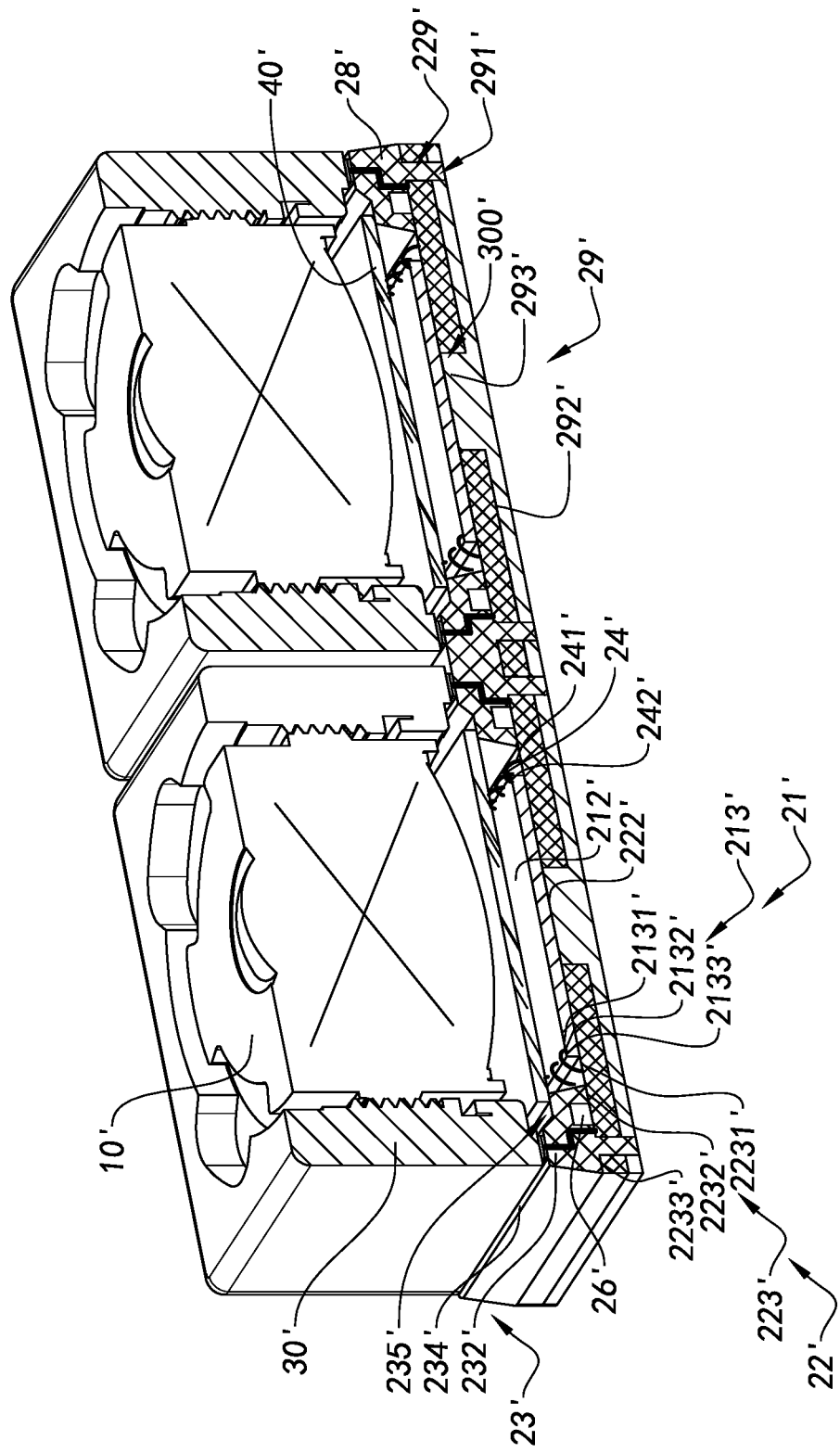
FIG. 36 illustrates a nineteenth alternative mode of the array imaging module according to the above preferred embodiments of the present invention.

FIG. 36 illustrates a nineteenth alternative mode of the array imaging module, wherein the base frame 29' further comprises a main base body 292' and at least two conductive bodies 293'. The two conductive bodies 293' are spacedly and integrally extended from the main base body 292'. The circuit board 22' further has at least two channels 300', wherein when the photosensitive units 21' are coupled at the circuit board 22', the channels 300' are correspondingly aligned with the photosensitive units 21' respectively. The circuit board 22' is overlappedly coupled at the main base body 292', wherein the two conductive bodies 293' are engaged with the channels 300' respectively, such that the photosensitive units 21' are electrically contacted with the conductive bodies 293' respectively. As a result, the conductive bodies 293' and the main base body 292' will effectively dissipate the heat generated by the photosensitive units 21' so as to enhance the heat dissipating power of the array imaging module.

Figure 37:
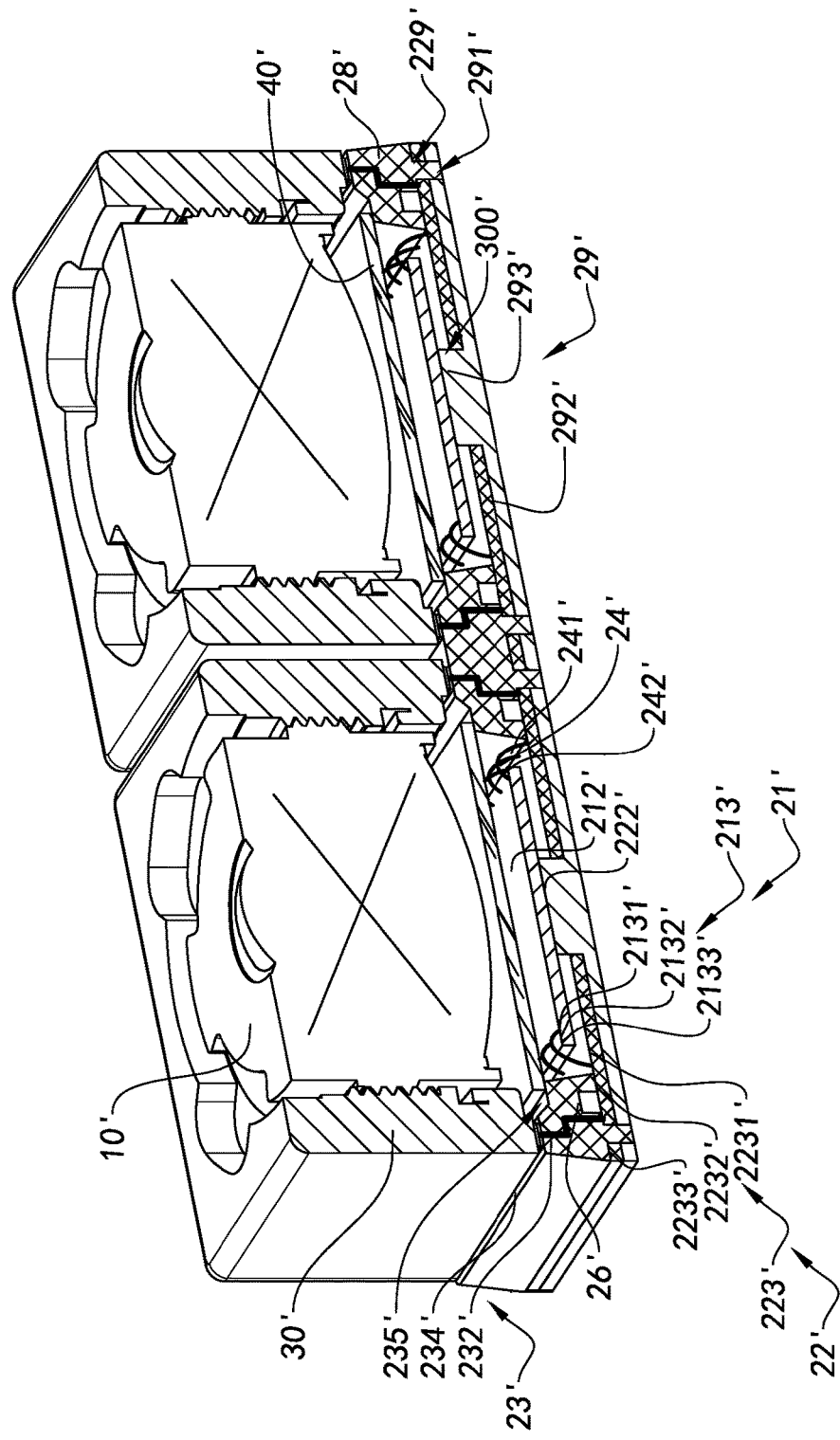
FIG. 37 illustrates a twentieth alternative mode of the array imaging module according to the above preferred embodiments of the present invention.

FIG. 37 illustrates a twentieth alternative mode of the array imaging module, wherein the photosensitive unit 21' is not coupled at the circuit board 22' but is coupled at the channel 300' of the conductive body 293' formed at the circuit board 22'. In other words, the photosensitive unit 21' is coupled at the conductive body 293' and is electrically linked to the circuit board 22'. In this configuration, the flatness of the photosensitive unit 21' does not have to be retained by the circuit board 22', such that the rigidity of the circuit board 22' can be reduced to minimize the thickness of the array imaging module. Therefore, the circuit board 22' can be a flexible circuit board to minimize the overall height of the array imaging module.

Figure 38:
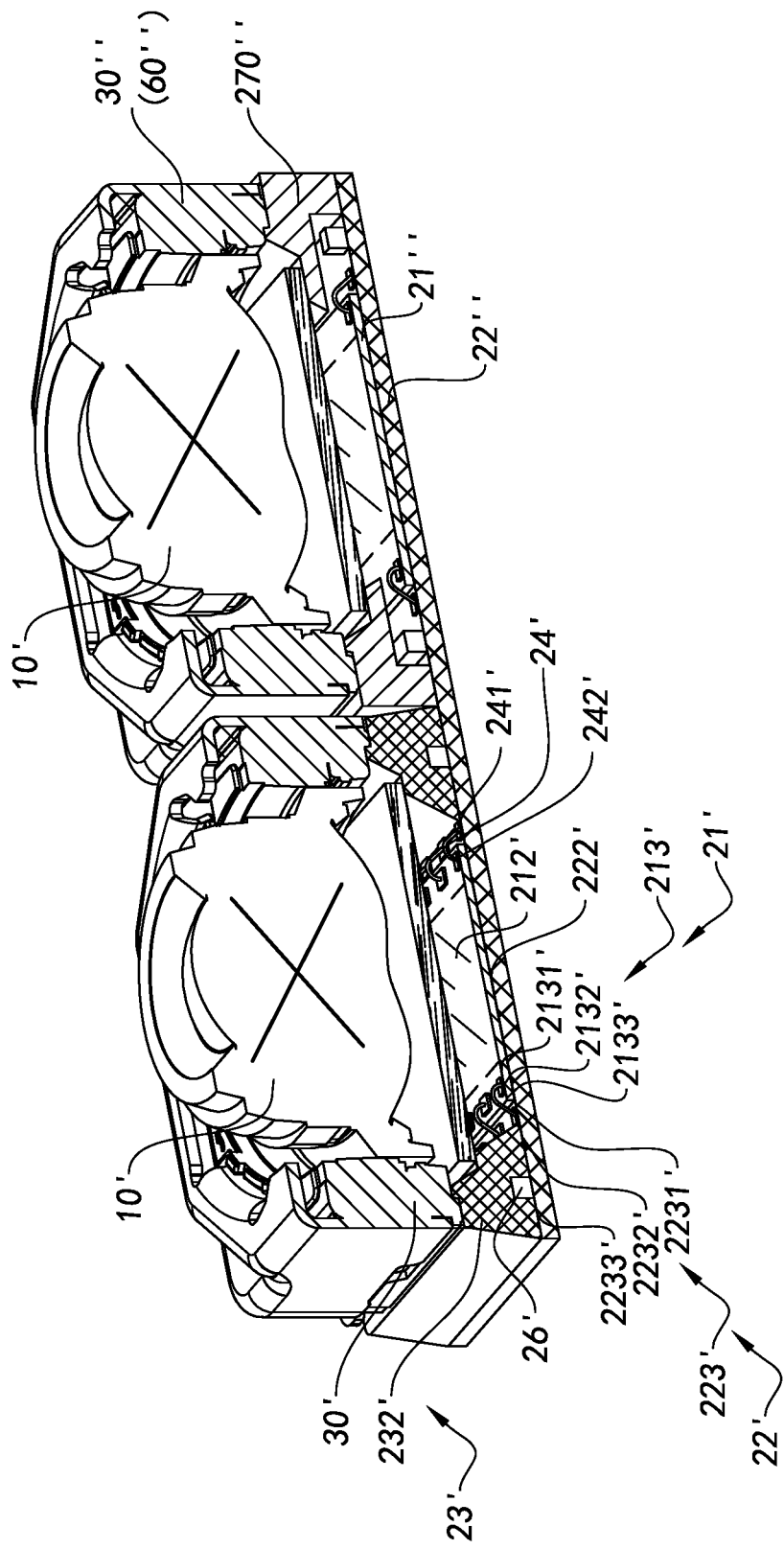
FIG. 38 illustrates a twentieth-first alternative mode of the array imaging module according to the above preferred embodiments of the present invention.

FIG. 38 illustrates a twentieth-first alternative mode of the array imaging module, which comprises at least two optical lenses 10', a molded photosensitive assembly 20', and at least an additional photosensitive unit 21". Each of the additional photosensitive units 21" is operatively coupled at the circuit board 22' of the molded photosensitive assembly 20', wherein the optical lenses 10' are located along the optical paths of the photosensitive unit 21' of molded photosensitive assembly 20' and the additional photosensitive unit 21" respectively, so as to form the array imaging module. In addition, the array imaging module further comprises at least an additional supporter 270", at least an additional driver 30", and/or at least an additional lens barrel 60". The additional supporters 270" are electrically coupled at the circuit board 22' of the molded photosensitive assembly 20'. The additional drivers 30" and/or the lens barrels 60" are installed at the circuit board 22'. The optical lenses 10' are operatively installed at one of the drivers 30', the lens barrels 60", the additional drivers 30", and the additional lens barrels 60". Then, the optical lenses 10' are located along the photosensitive paths of the photosensitive unit 21' of molded photosensitive assembly 20' and the additional photosensitive unit 21" respectively. In addition, the additional photosensitive unit 21" is not coupled at the circuit board 22' of the molded photosensitive assembly 20' but is installed at an additional circuit board 22" of the array imaging module.

Figure 39:
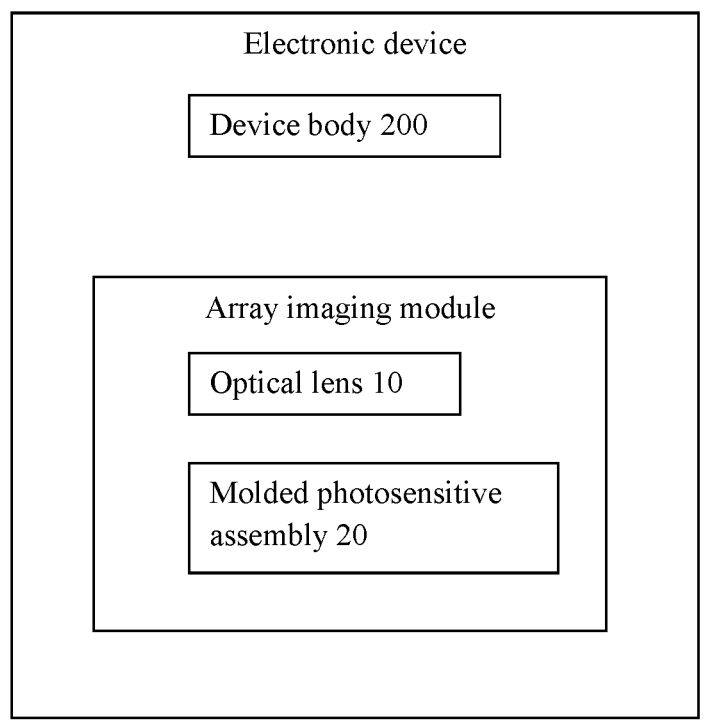
FIG. 39 is a block diagram of the electronic components of the array imaging module according to the above preferred embodiments of the present invention.
Figure 40A:
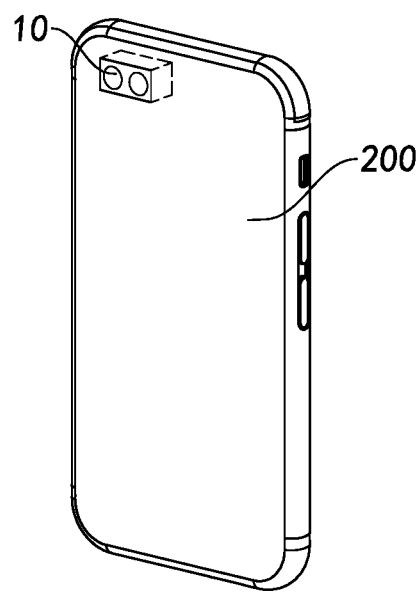
FIGS. 40A to 40C illustrate different modes of the array imaging module incorporating with the electronic device according to the above preferred embodiments of the present invention.
Figure 40B:
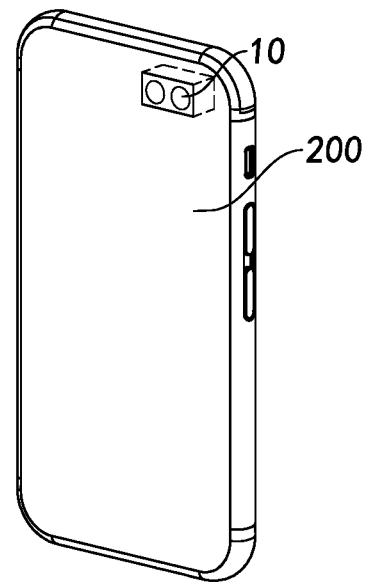
Figure 40C:
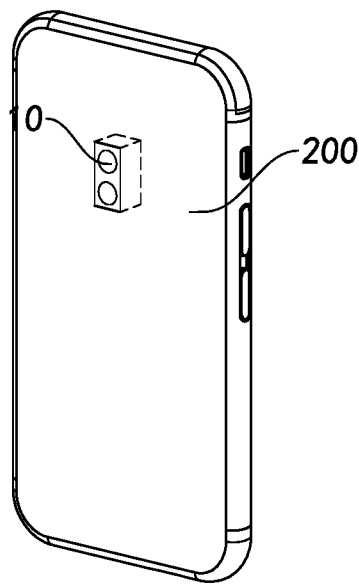

FIG. 39 is a block diagram of the electronic components of the array imaging module according to the preferred embodiment of the present invention. The present invention provides an electronic device built-in with the array imaging module. The electronic device comprises a device body 200 with a device processor therein, wherein the array imaging module is mounted at the device body 200 to operatively link to the device processor therein for capturing image. It is worth mentioning that the location of the array imaging module with respect to the device body 200 should not limited. As shown in FIGS. 40A and 40B, the array imaging module can be located at one of the upper corners of the device body 200 along the transverse direction thereof. As shown in FIG. 40C, the array imaging module can be located at the mid-portion of the device body 200 along the longitudinal direction thereof.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A circuit board assembly of an array imaging module, comprising:
   a circuit member which comprises a circuit board for electrically connecting with at least two photosensitive units of the array imaging module, at least one electronic element electrically coupled at and protruded from said circuit board, and a reinforcing layer overlapped and connected to the circuit board to reinforce the strength of the circuit board; and
   a mold sealer which is sealed and coupled at said circuit board of said circuit member, wherein said at least one electronic element is enclosed within said mold sealer for preventing an exposure of said electronic element.

2. The circuit board assembly, as recited in claim 1, wherein said reinforcing layer is a metal panel to enhance the heat dissipation of the circuit board.

3. A circuit board assembly of an array imaging module, comprising:
   a circuit member which comprises a circuit board for electrically connecting with at least two photosensitive units of the array imaging module and at least one electronic element electrically coupled at and protruded from said circuit board;
   a mold sealer which is sealed and coupled at said circuit board of said circuit member, wherein said at least one electronic element is enclosed within said mold sealer for preventing an exposure of said electronic element; and
   a shielding layer that encloses said circuit board and said mold sealer to enhance a strength of said circuit board and to reduce electromagnetic interference of said circuit board assembly.

4. A circuit board assembly of an array imaging module, comprising:
   a circuit member which comprises a circuit board for electrically connecting with at least two photosensitive units of the array imaging module and at least one electronic element electrically coupled at and protruded from said circuit board; and
   a mold sealer which is sealed and coupled at said circuit board of said circuit member, wherein said at least one electronic element is enclosed within said mold sealer for preventing an exposure of said electronic element;
   wherein said circuit board assembly has a least one reinforcing slot which is an indention cavity, wherein said mold sealer is extended into said at least one reinforcing slot to enhance a strength of said circuit board.

5. A circuit board assembly of an array imaging module, comprising:
   a circuit member which comprises a circuit board for electrically connecting with at least two photosensitive units of the array imaging module and at least one electronic element electrically coupled at and protruded from said circuit board; and
   a mold sealer which is sealed and coupled at said circuit board of said circuit member, wherein said at least one electronic element is enclosed within said mold sealer for preventing an exposure of said electronic element;
   wherein said circuit board assembly has a least one reinforcing slot and said mold sealer is extended into said at least one reinforcing slot to enhance a strength of said circuit board, wherein said reinforcing slot is a through slot, such that said mold sealer is extended through said circuit board to integrally form with said circuit board so as to combine said mold sealer with said circuit board, wherein said at least one reinforcing slot as said through slot is able to be easily formed in said circuit board.

6. A manufacturing method of a circuit board assembly of an array imaging module, which comprises the steps of:
   (i) integrally molding a mold sealer on a circuit member to form said circuit board assembly of said array imaging module; and
   (ii) forming at least an optical window at said mold sealer;
   wherein the step (i) further comprises a step of forming a threaded structure at an inner wall of said optical window for coupling with an optical lens with a corresponding threaded configuration.

7. A manufacturing method of a circuit board assembly of an array imaging module, which comprises the steps of:
   (i) integrally molding a mold sealer on a circuit member to form said circuit board assembly of said array imaging module; and
   (ii) forming at least an optical window at said mold sealer;
   wherein the step (i) further comprises a step of forming at least a reinforcing slot, which is an indention cavity, at said circuit member, wherein said mold sealer is extended into said reinforcing slot to enhance a strength of said circuit member.

8. A manufacturing method of a circuit board assembly of an array imaging module, which comprises the steps of:
   (i) integrally molding a mold sealer on a circuit member to form said circuit board assembly of said array imaging module; and
   (ii) forming at least an optical window at said mold sealer;
   wherein the step (i) further comprises a step of forming at least a reinforcing slot, which is a through slot, at said circuit member, wherein said mold sealer is extended into said reinforcing slot to enhance a strength of said circuit member.

9. A manufacturing method of a circuit board assembly of an array imaging module, which comprises the steps of:
 (i) integrally molding a mold sealer on a circuit member to form said circuit board assembly of said array imaging module; and
 (ii) forming at least an optical window at said mold sealer;
 wherein the step (i) further comprises a step of forming at least a reinforcing layer overlapped and connected to said circuit member to reinforce a strength of said circuit member.

10. A manufacturing method of a circuit board assembly of an array imaging module, which comprises the steps of:
 (i) integrally molding a mold sealer on a circuit member to form said circuit board assembly of said array imaging module; and
 (ii) forming at least an optical window at said mold sealer;
 wherein the step (i) further comprises a step of forming a shielding layer that encloses said circuit member and said mold sealer to enhance a strength of said circuit member and to reduce electromagnetic interference of said circuit board assembly.

11. A manufacturing method of a circuit board assembly of an array imaging module, which comprises the steps of:
 (i) integrally molding a mold sealer on a circuit member to form said circuit board assembly of said array imaging module; and
 (ii) forming at least an optical window at said mold sealer;
 wherein the step (i) further comprises a step of pre-setting a plurality of connecting wires in said mold sealer and electrically connected to said circuit member for electrically connecting with a driver.

12. The method, as recited in claim 11, wherein the step (i) further comprises a step of pre-setting a plurality of terminal slots at a top side of said mold sealer for electrically connecting with motor terminals of said driver.

13. A manufacturing method of a circuit board assembly of an array imaging module, which comprises the steps of:
 (i) integrally molding a mold sealer on a circuit member to form said circuit board assembly of said array imaging module; and
 (ii) forming at least an optical window at said mold sealer;
 wherein the step (i) further comprises the steps of pre-setting a plurality of circuit terminals at said circuit member, providing a plurality of terminal slots in said mold sealer, and extending said circuit terminals corresponding to said terminal slots for connecting with a motor terminal of a driver.

14. A manufacturing method of a circuit board assembly of an array imaging module, which comprises the steps of:
 (i) integrally molding a mold sealer on a circuit member to form said circuit board assembly of said array imaging module; and
 (ii) forming at least an optical window at said mold sealer;
 wherein the step (i) further comprises a step of pre-setting a plurality of engraving circuits electrically connected to said circuit member, wherein said engraving circuits are embedded in said mold sealer for connecting with a motor terminal of a driver.

* * * * *